(12) United States Patent
Gomikawa et al.

(10) Patent No.: US 8,072,021 B2
(45) Date of Patent: Dec. 6, 2011

(54) NONVOLATILE SEMICONDUCTOR MEMORY DEVICE

(75) Inventors: Kenji Gomikawa, Yokohama (JP);
Tadashi Iguchi, Yokohama (JP);
Mitsuhiro Noguchi, Yokohama (JP);
Shoichi Watanabe, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 12/188,617

(22) Filed: Aug. 8, 2008

(65) Prior Publication Data

US 2009/0057749 A1    Mar. 5, 2009

(30) Foreign Application Priority Data

Aug. 29, 2007  (JP) ................. 2007-222601

(51) Int. Cl.
*H01L 29/788* (2006.01)
(52) U.S. Cl. ................ 257/316; 257/E29.001
(58) Field of Classification Search .......... 257/316, 257/E29.001, 314, 315, 402, E21.69
See application file for complete search history.

(56) References Cited

U.S. PATENT DOCUMENTS

| | | | |
|---|---|---|---|
| 6,835,978 B2 | 12/2004 | Matsui et al. | |
| 6,894,932 B1 * | 5/2005 | Melik-Martirosian et al. | 365/185.28 |
| 6,927,449 B2 * | 8/2005 | Matsui et al. | 257/316 |
| 7,049,653 B2 | 5/2006 | Matsui et al. | |
| 7,180,121 B2 | 2/2007 | Hieda | |
| 7,348,627 B2 | 3/2008 | Matsui et al. | |
| 7,352,027 B2 | 4/2008 | Matsui et al. | |
| 2004/0051134 A1 * | 3/2004 | Jang et al. | 257/316 |
| 2006/0094188 A1 | 5/2006 | Kim et al. | |
| 2006/0140028 A1 | 6/2006 | Mizushima et al. | |
| 2007/0057310 A1 | 3/2007 | Matsui et al. | |
| 2007/0057315 A1 | 3/2007 | Matsui et al. | |
| 2007/0093023 A1 * | 4/2007 | Wu | 438/257 |
| 2007/0152261 A1 | 7/2007 | Matsui et al. | |

FOREIGN PATENT DOCUMENTS

| | | |
|---|---|---|
| JP | 2005-277171 | 10/2005 |
| JP | 2006-186073 | 7/2006 |
| JP | 9-129757 | 5/2010 |
| KR | 2005-10260 | 1/2005 |
| KR | 10-0540481 | 1/2006 |

OTHER PUBLICATIONS

U.S. Appl. No. 12/234,150, filed Sep. 19, 2008, Tanaka, et al.
Office Action issued Aug. 31, 2010, in korea Patent Application No. 10-2008-84586 (with English Translation).

* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A memory cell includes a floating gate electrode, a first inter-electrode insulating film and a control gate electrode. A peripheral transistor includes a lower electrode, a second inter-electrode insulating film and an upper electrode. The lower electrode and the upper electrode are electrically connected via an opening provided on the second inter-electrode insulating film. The first and second inter-electrode insulating films include a high-permittivity material, the first inter-electrode insulating film has a first structure, and the second inter-electrode insulating film has a second structure different from the first structure.

19 Claims, 60 Drawing Sheets

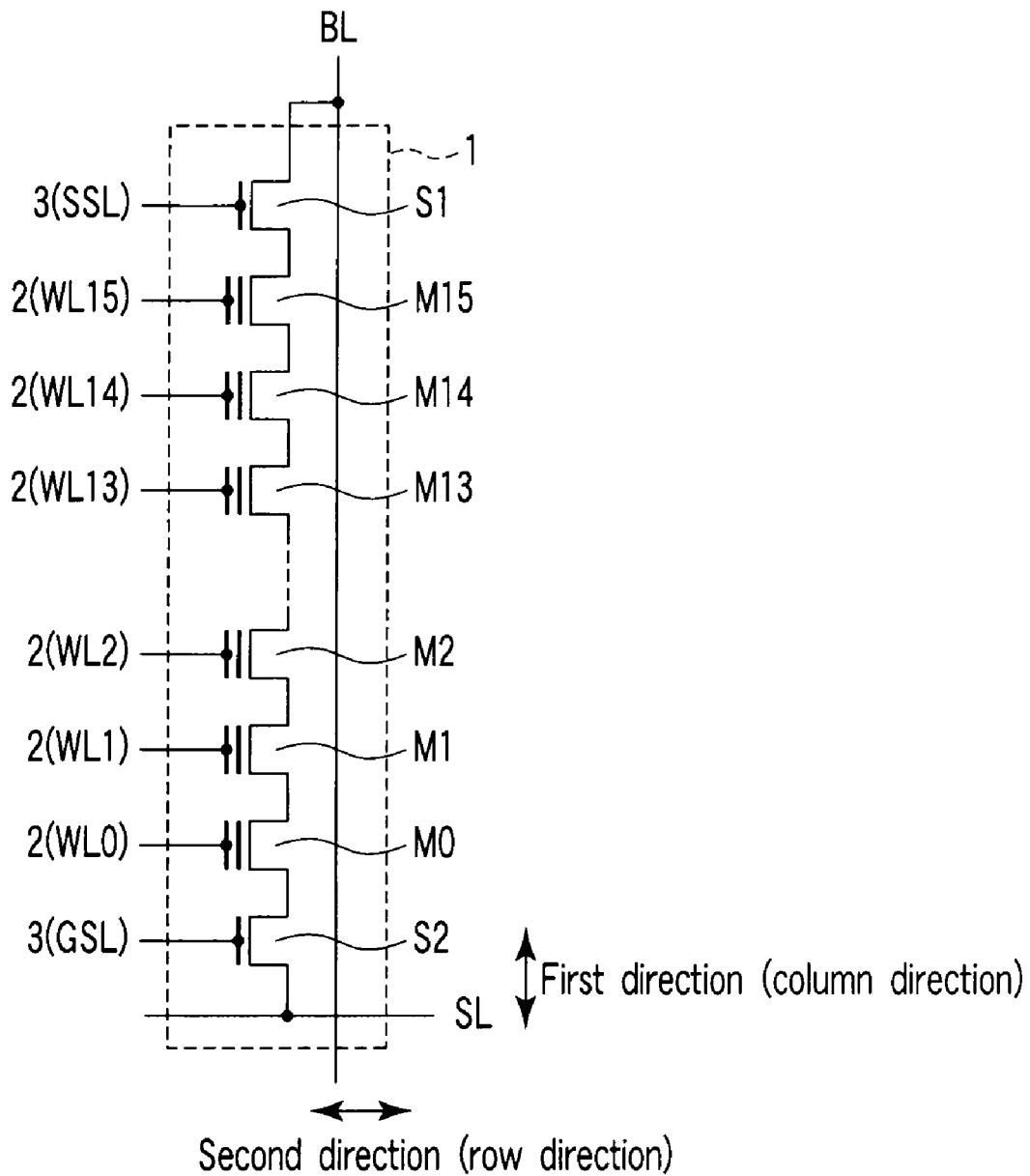
F I G. 1

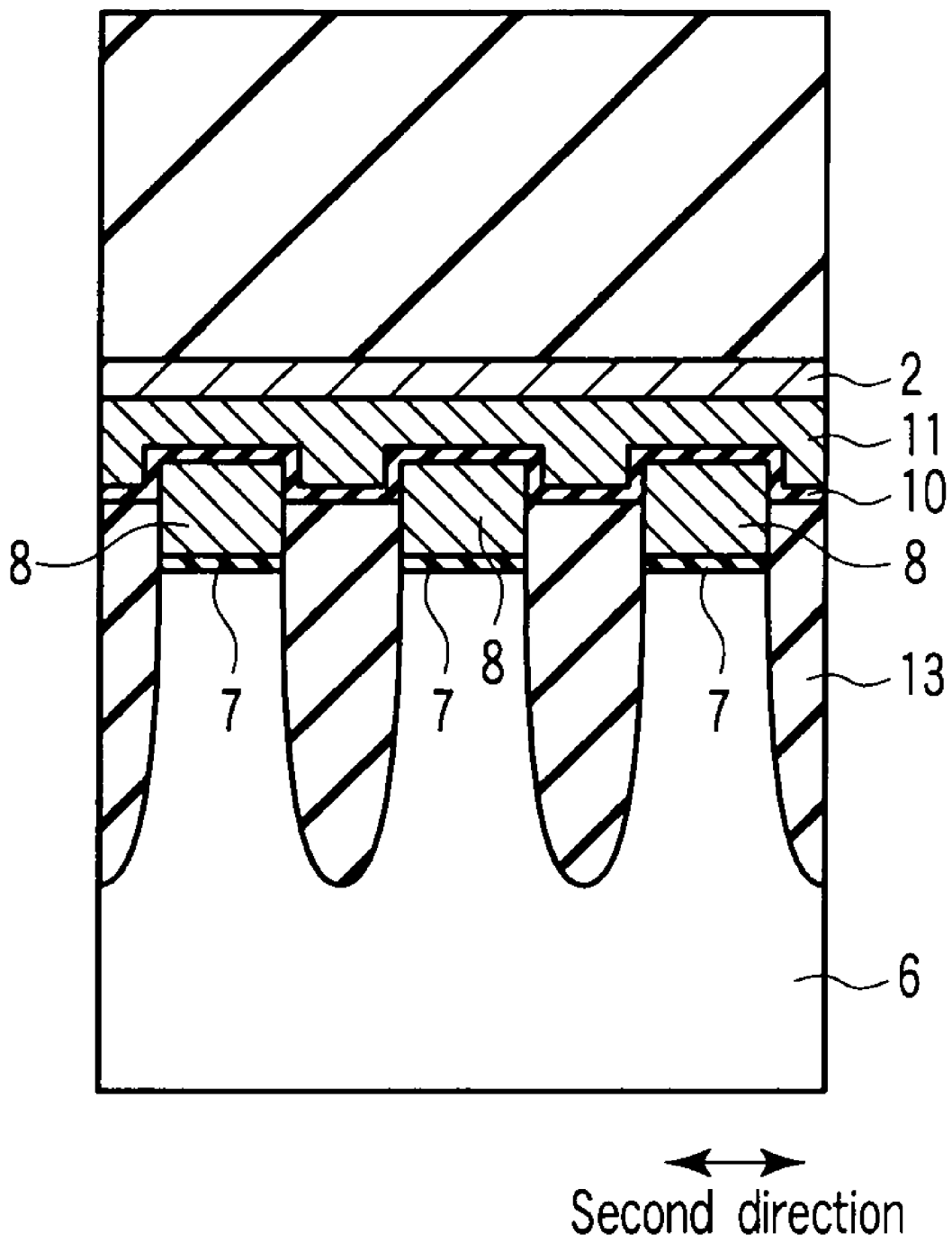
F I G. 4

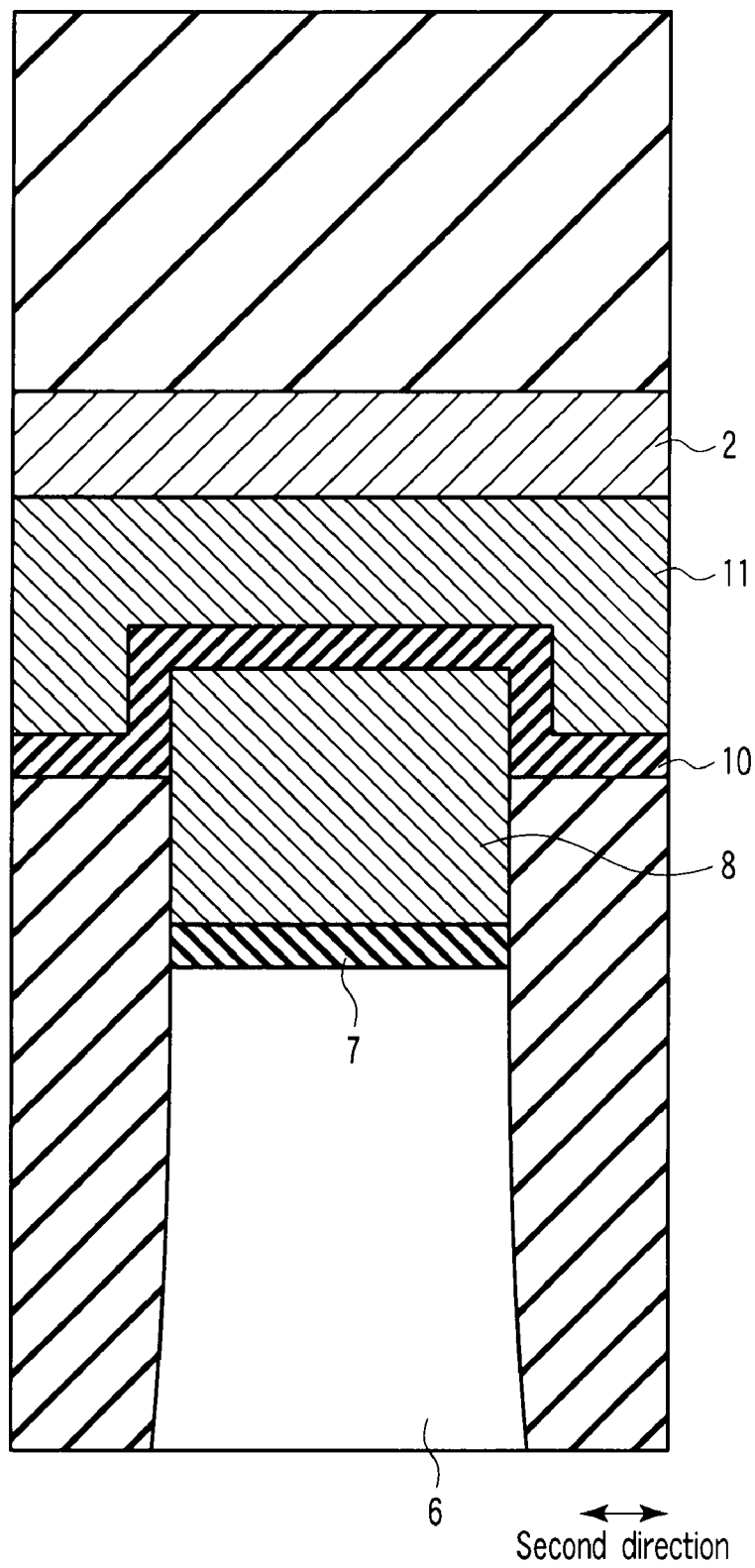
F I G. 5

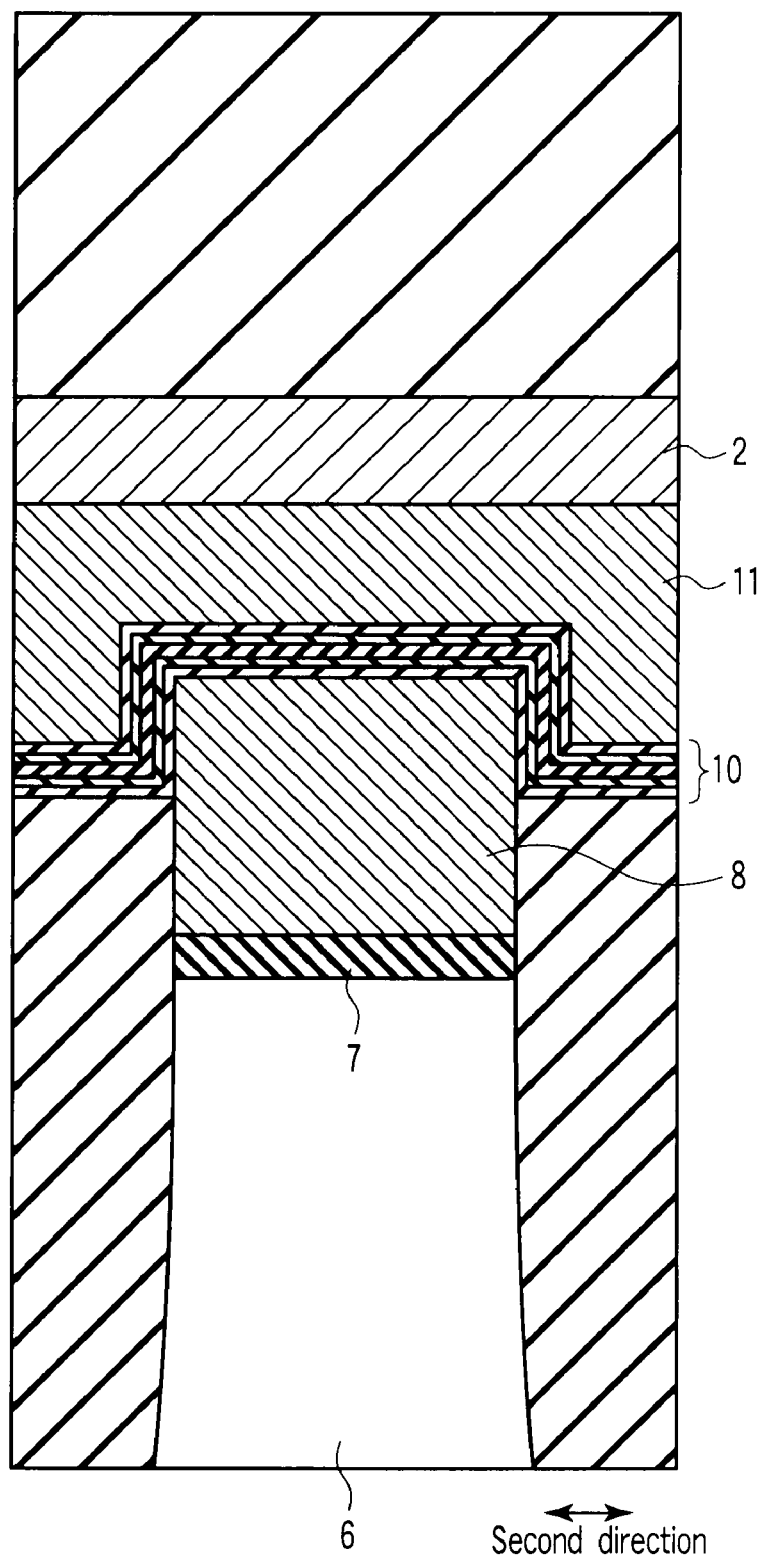
F I G. 7

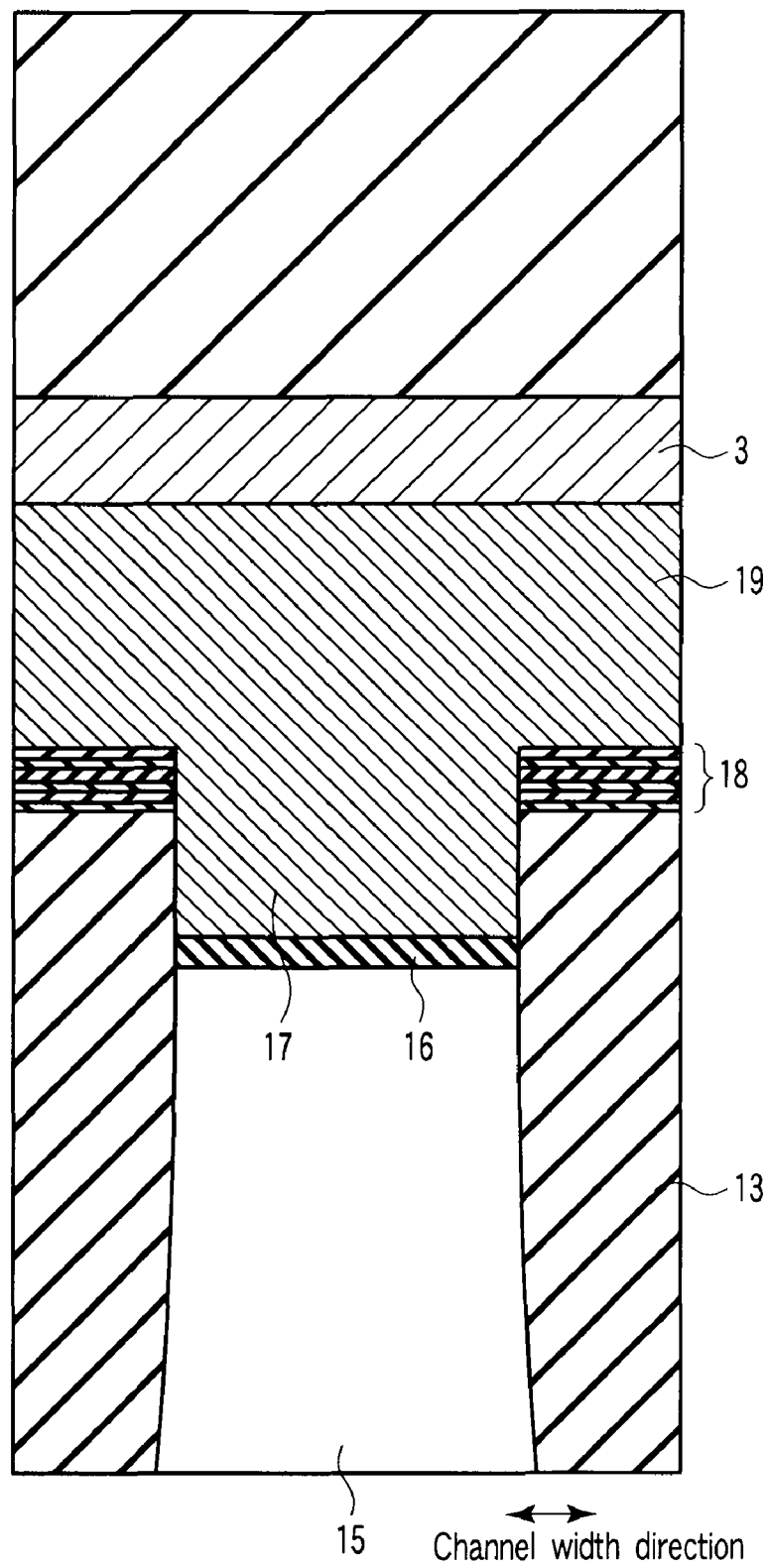
F I G. 12

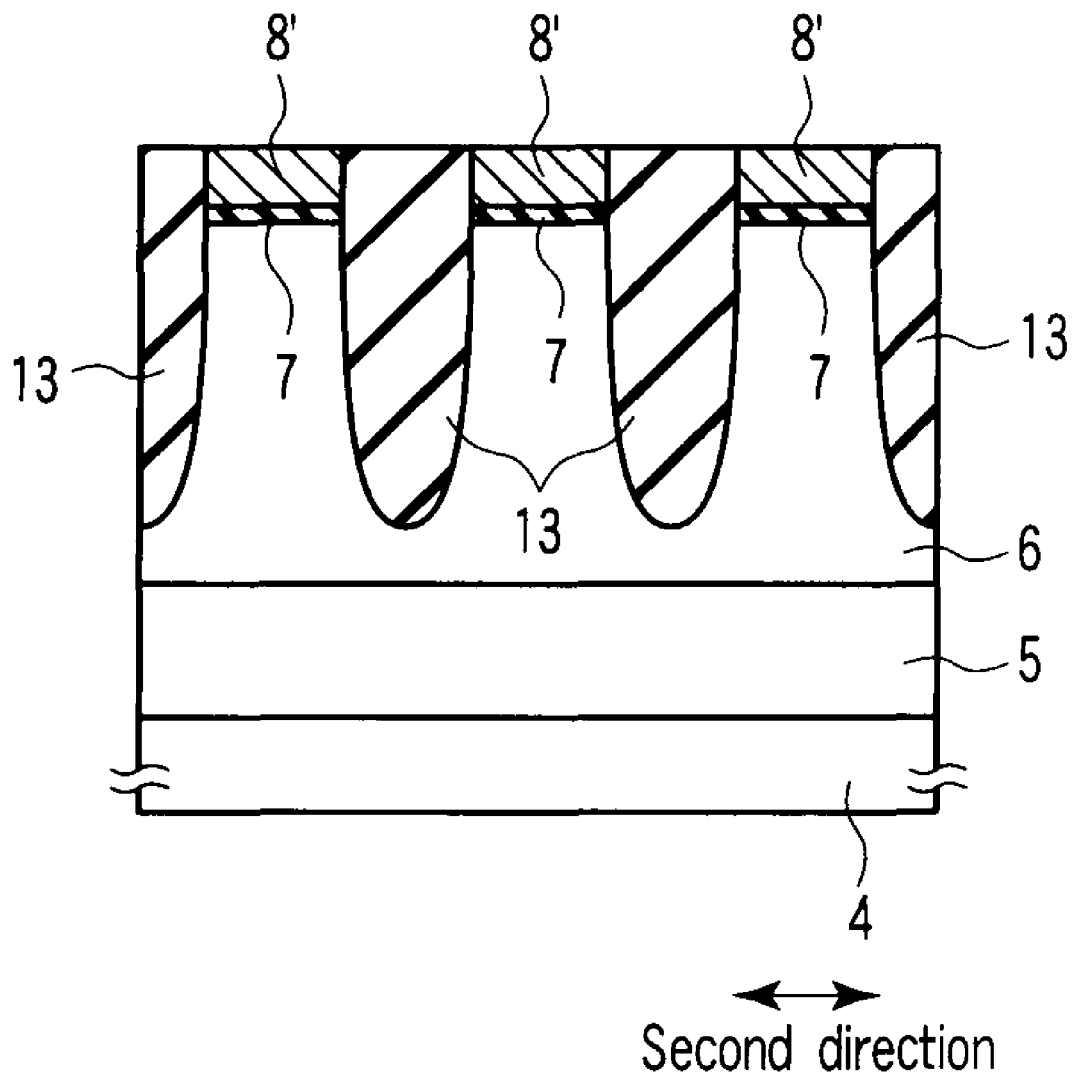
F I G. 14

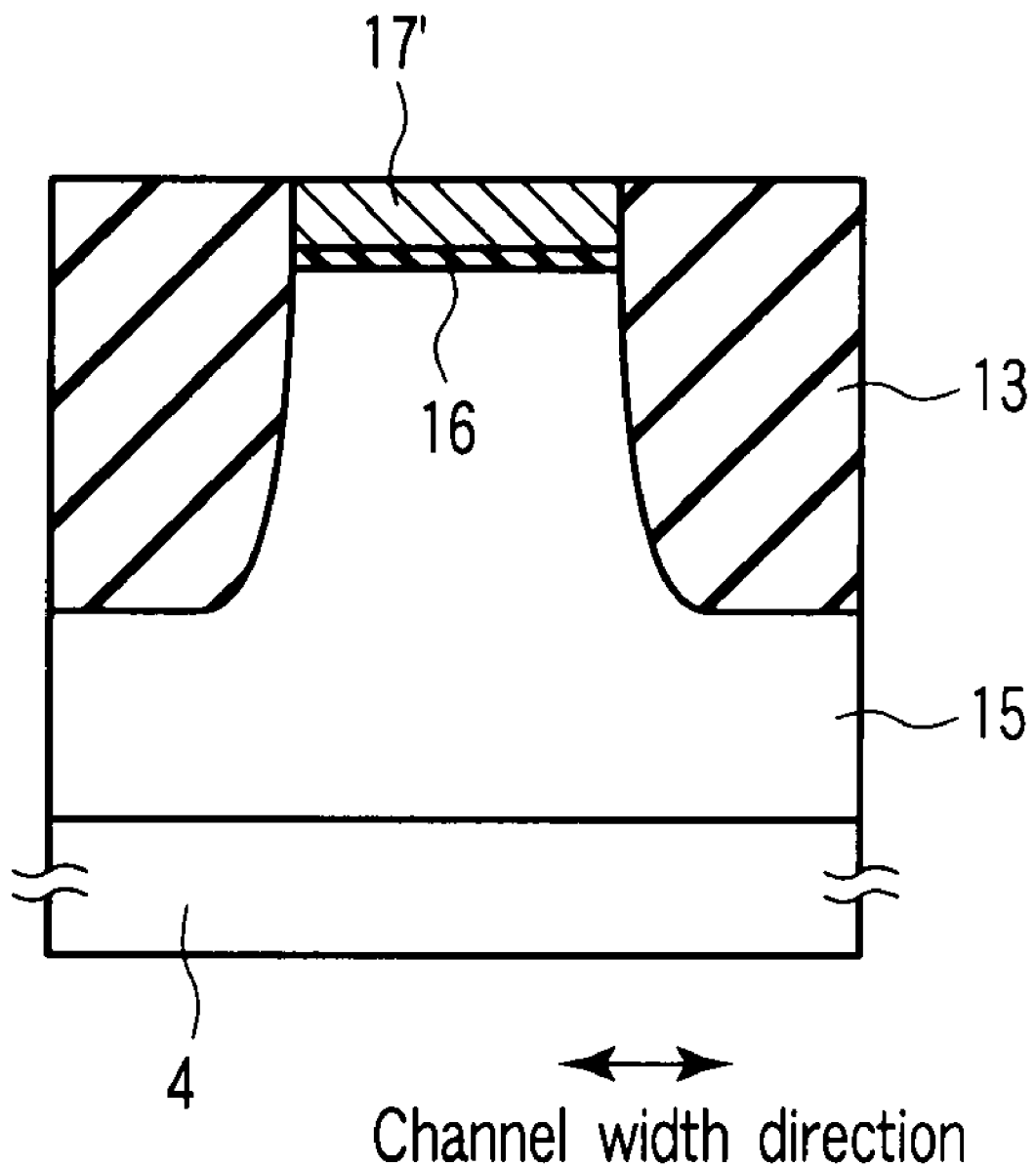
F I G. 16

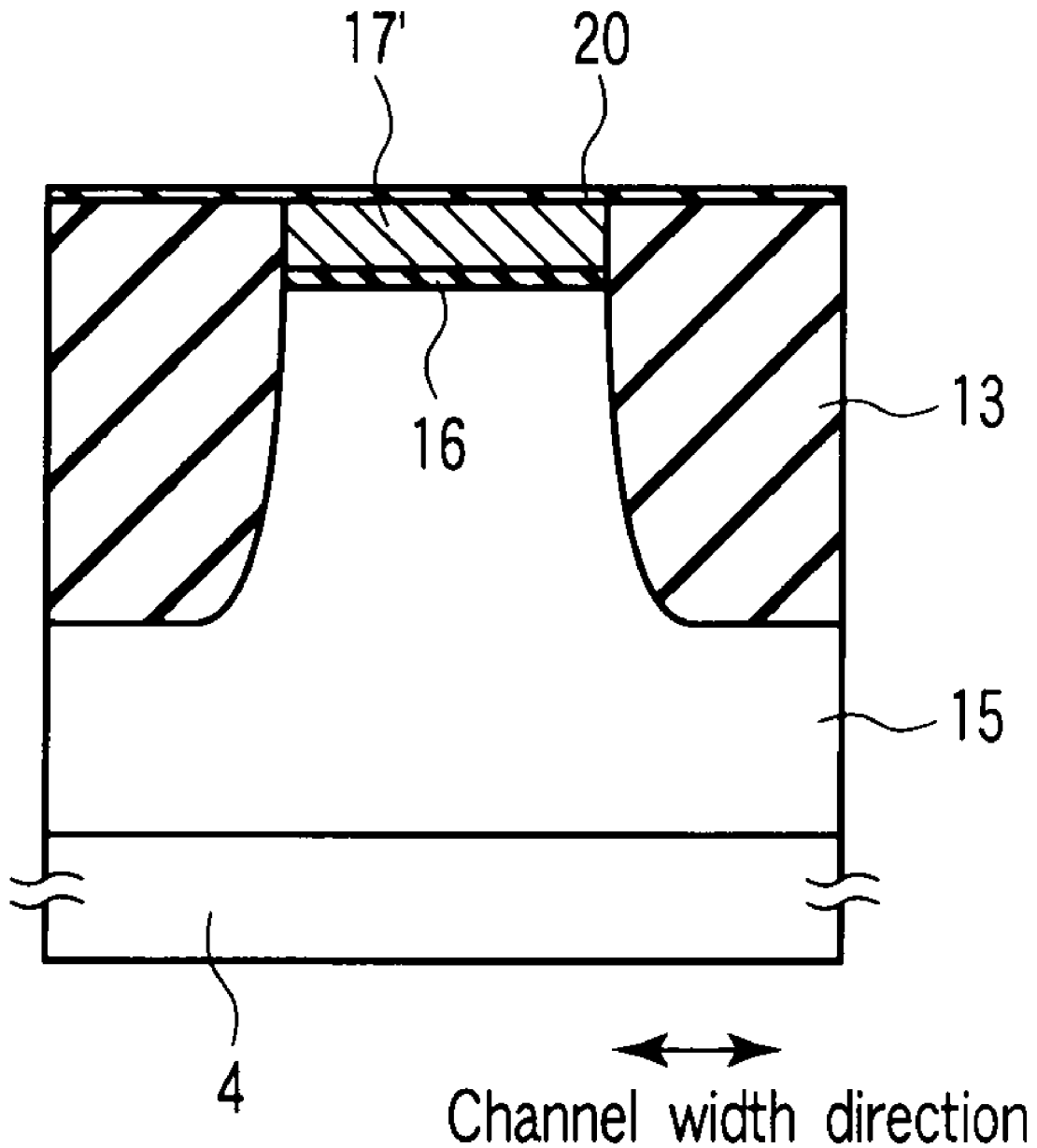
F I G. 20

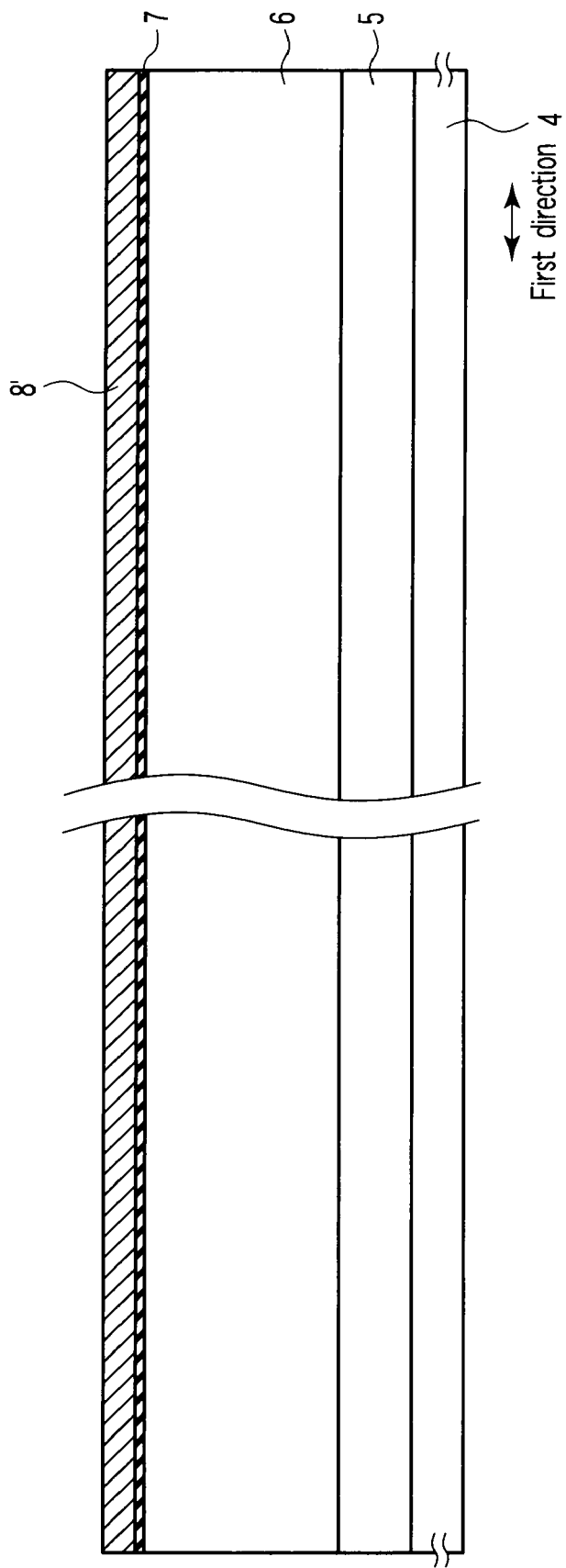
F I G. 25

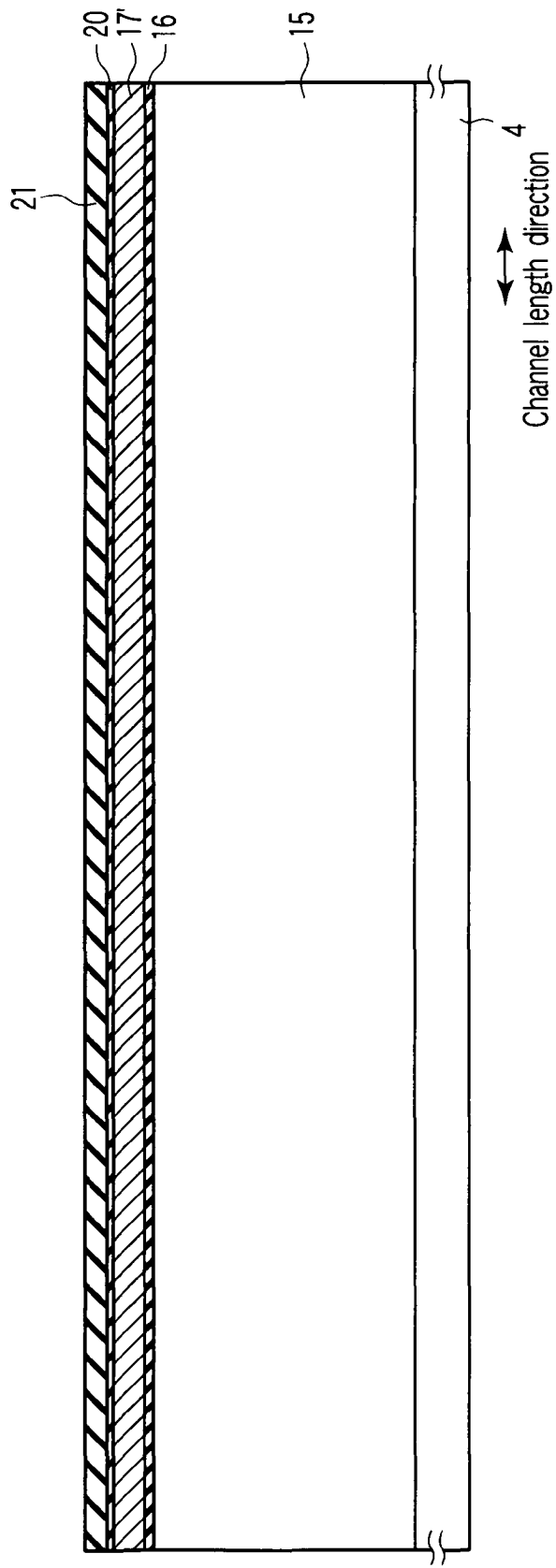
F I G. 27

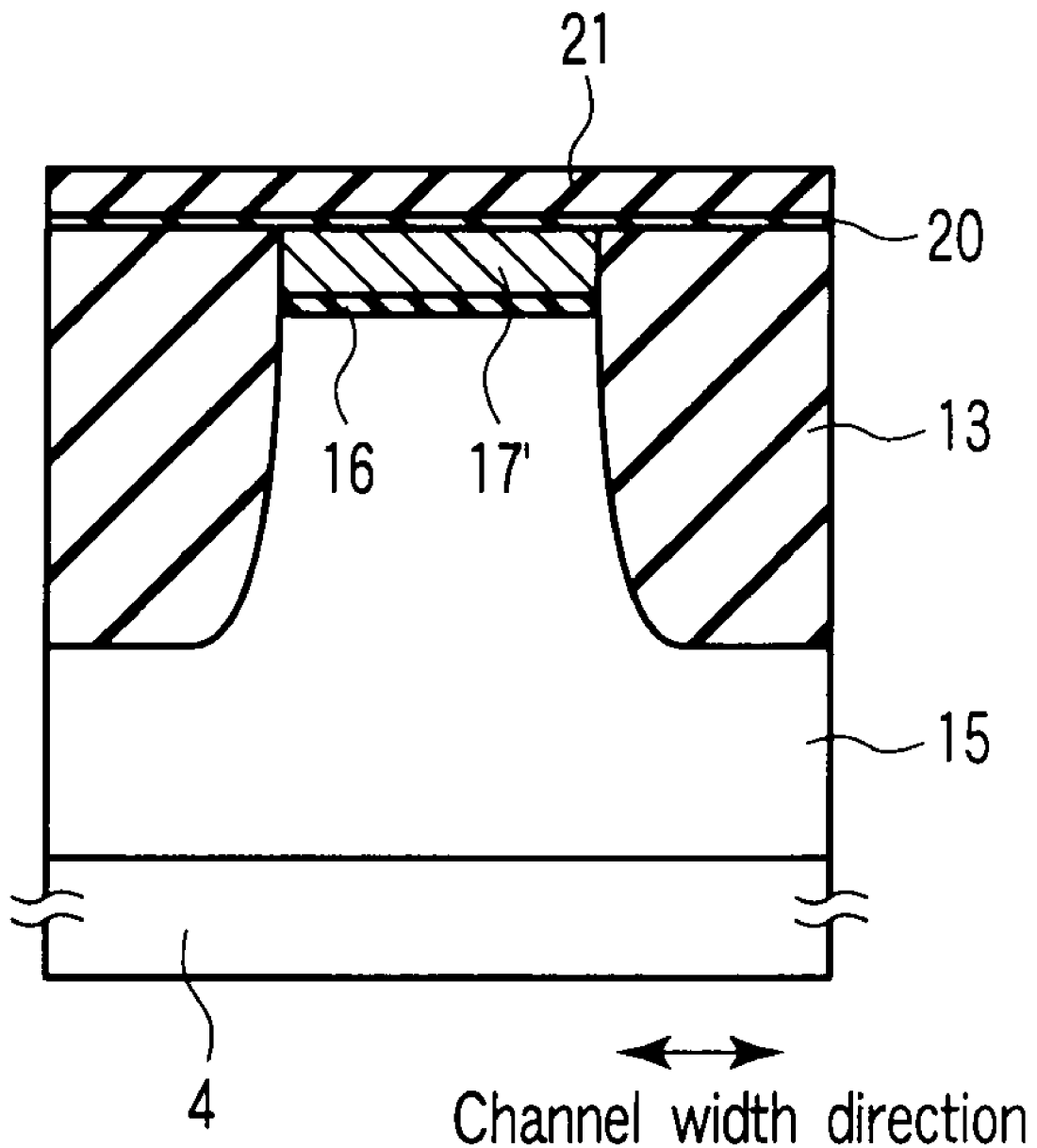
F I G. 28

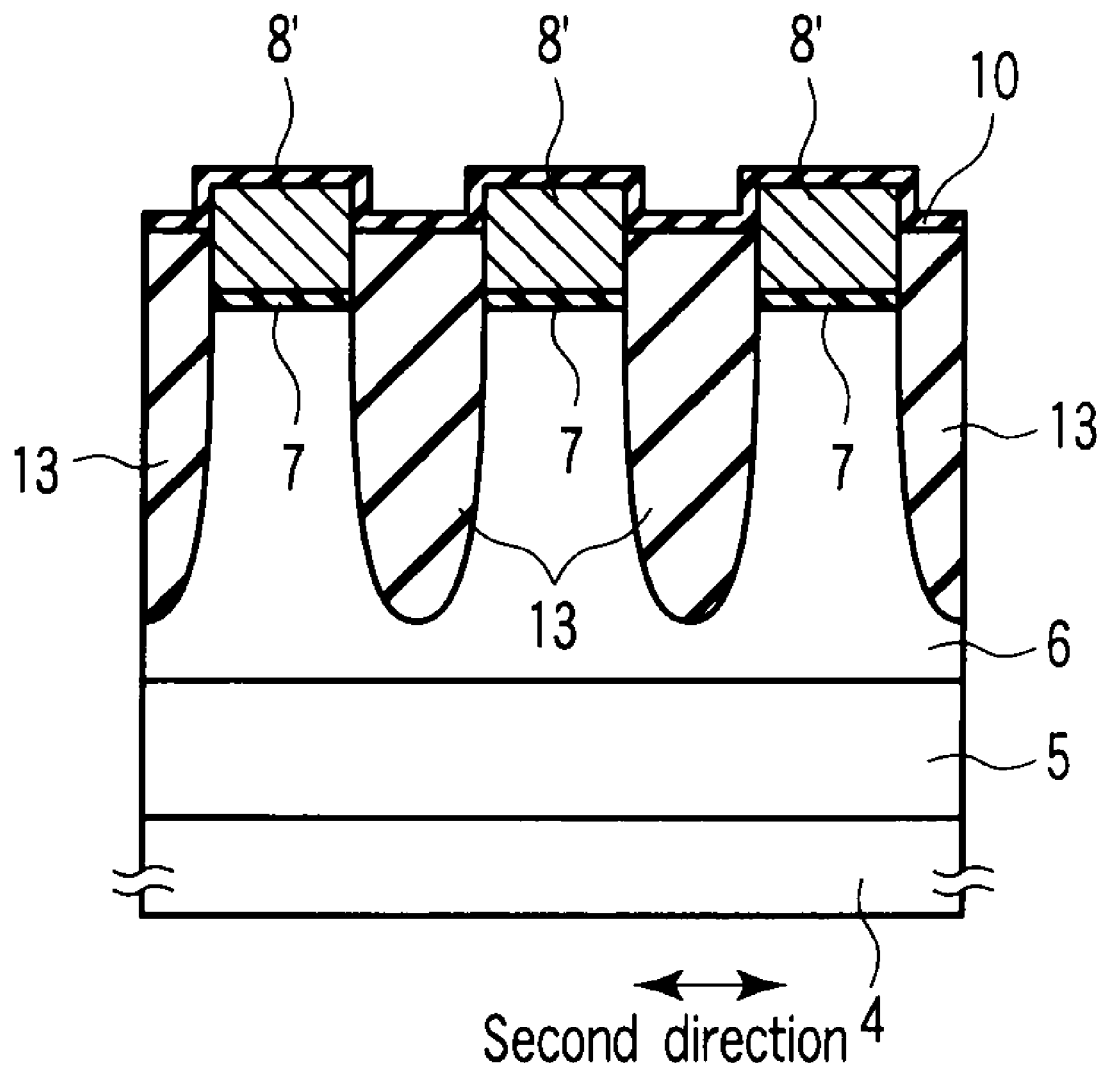
F I G. 30

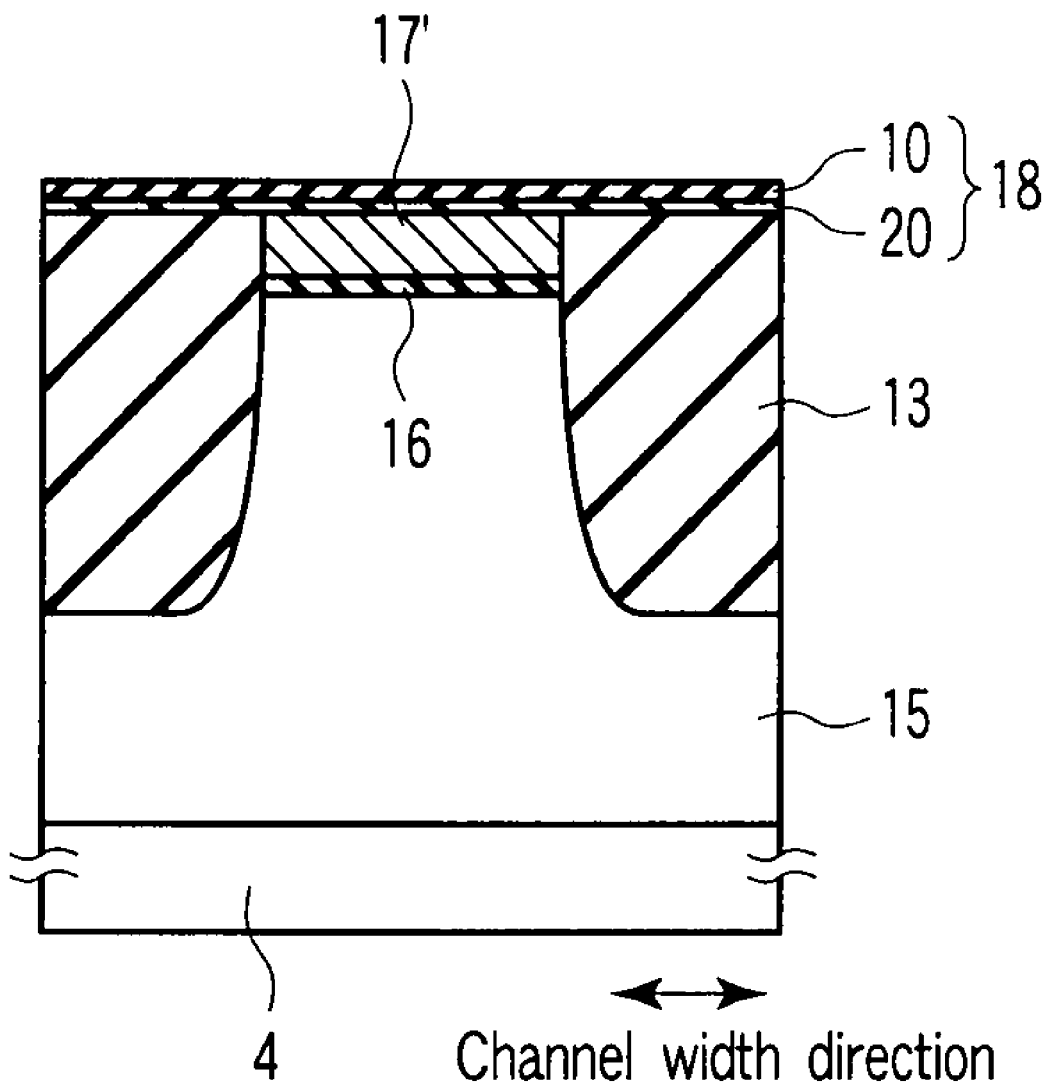
F I G. 32

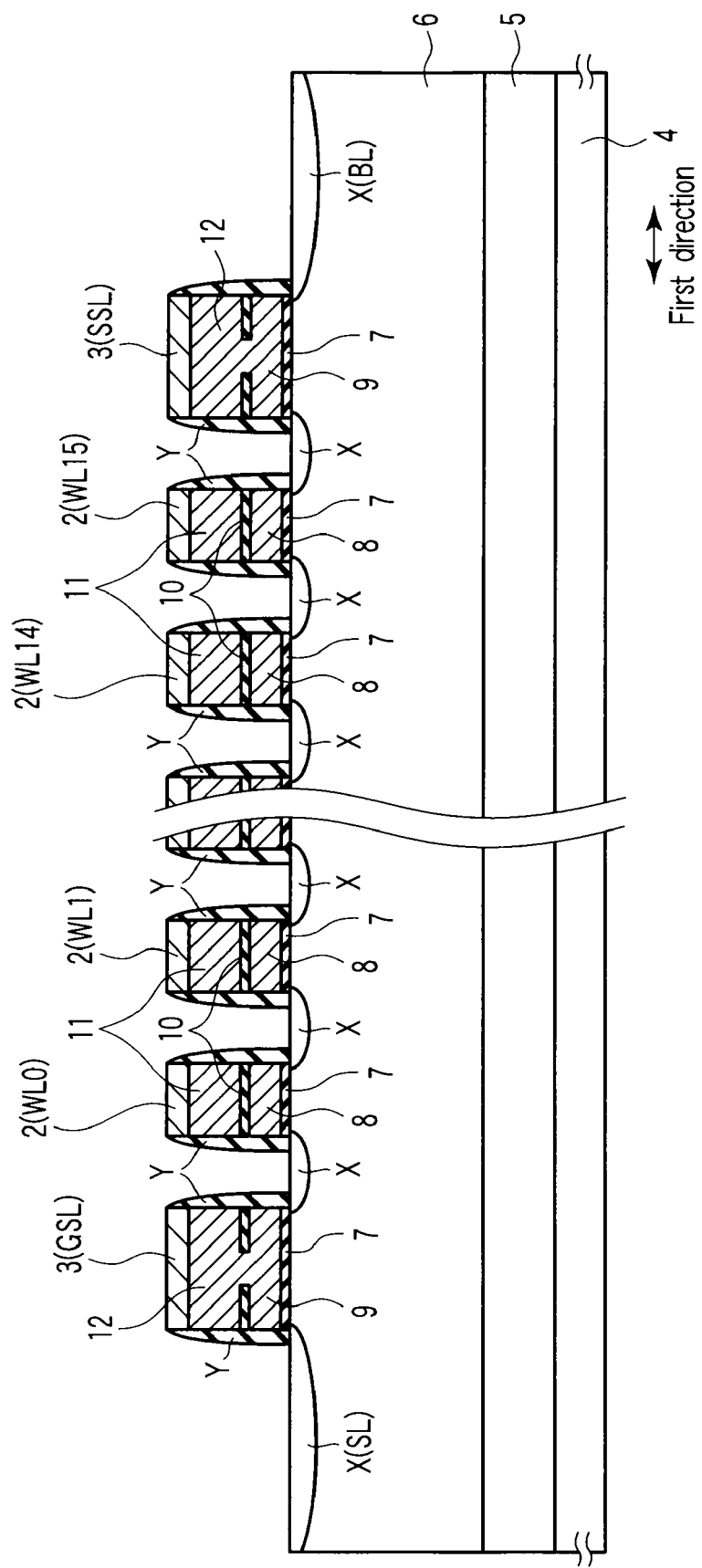
F I G. 33

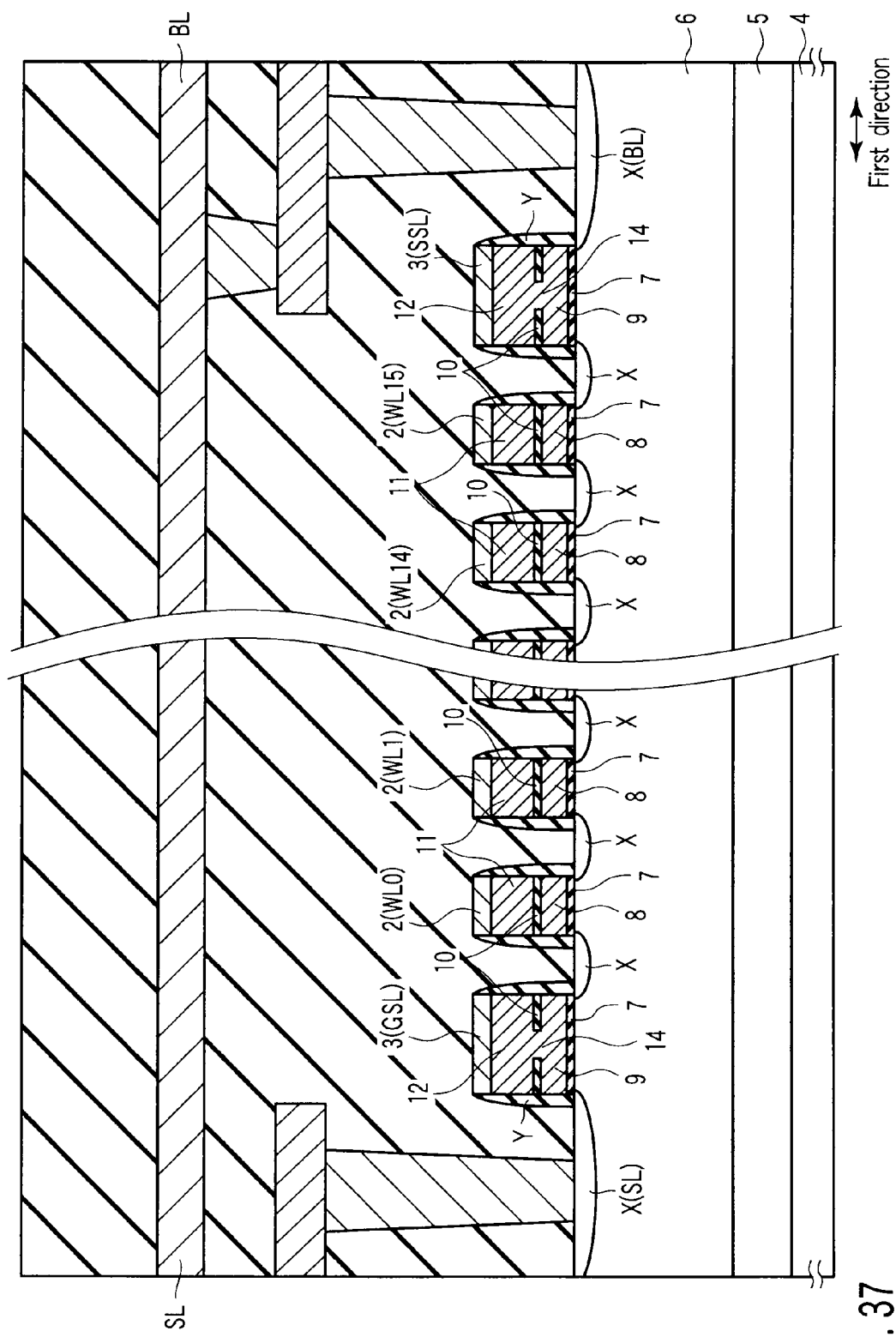
F I G. 37

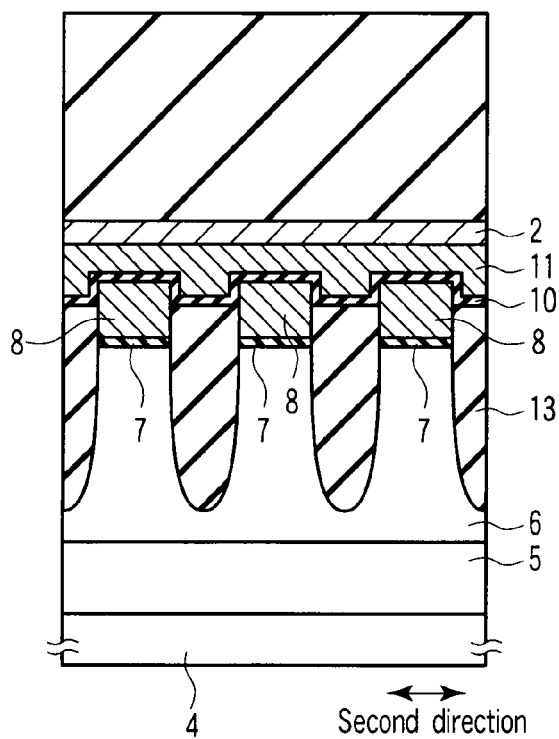
F I G. 38
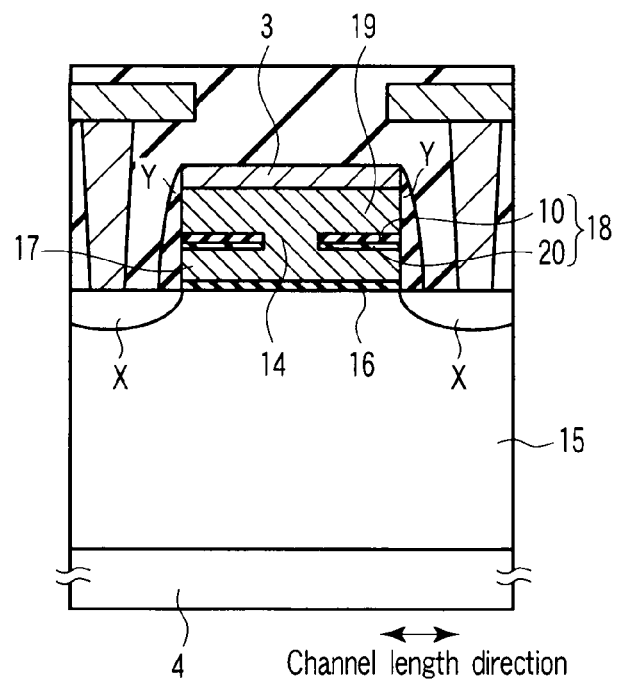
F I G. 39

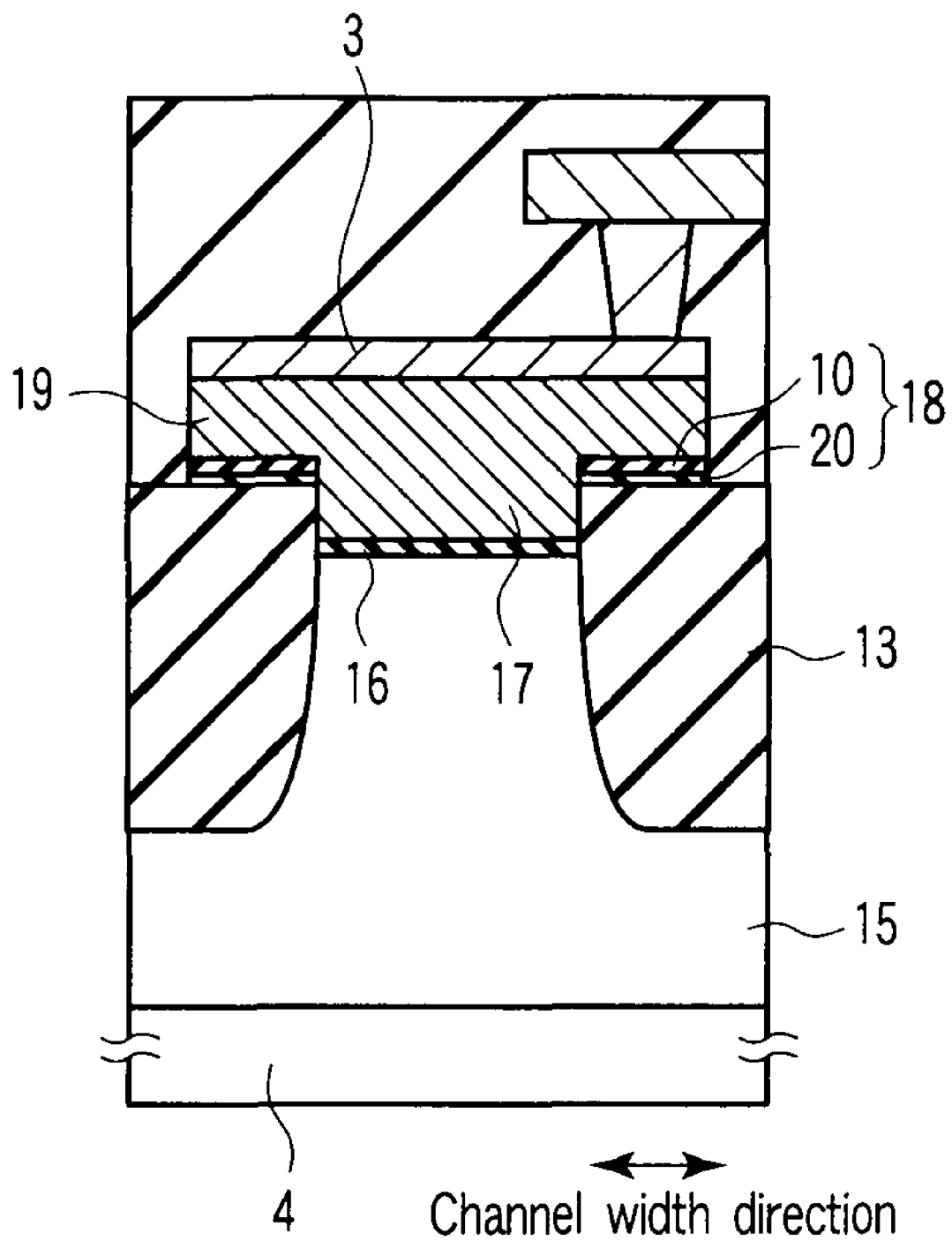
F I G. 40

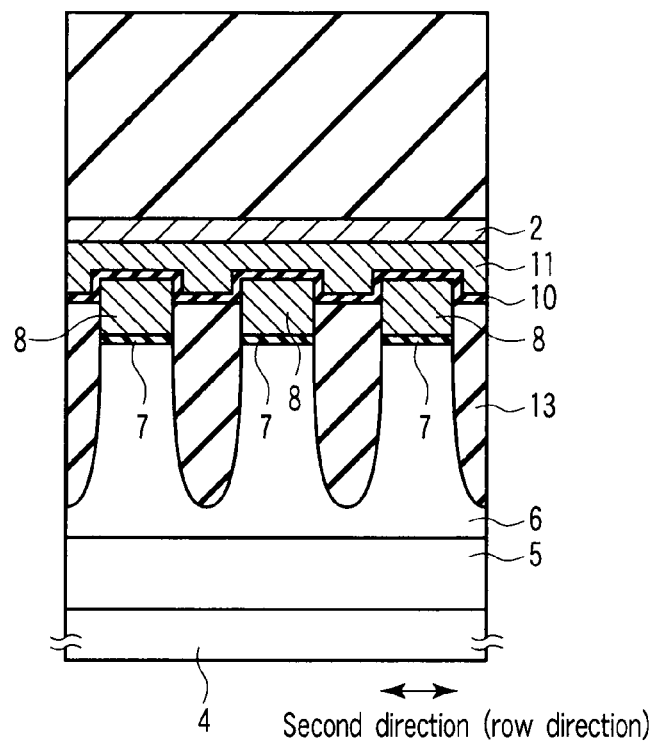
F I G. 42
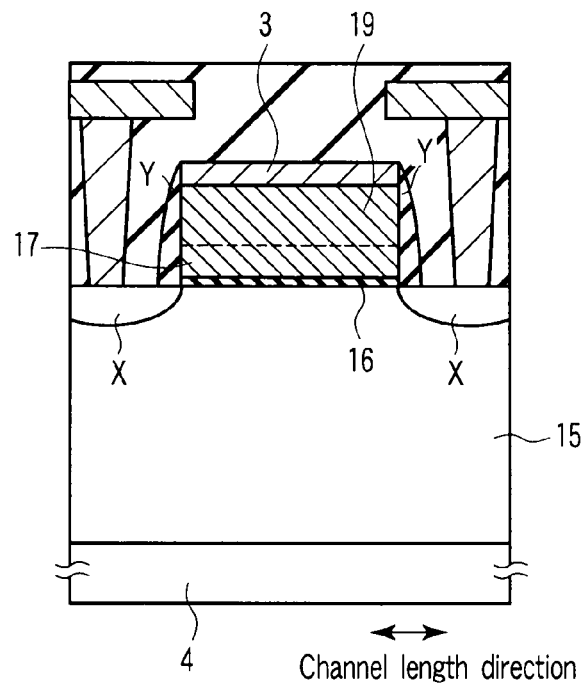
F I G. 43

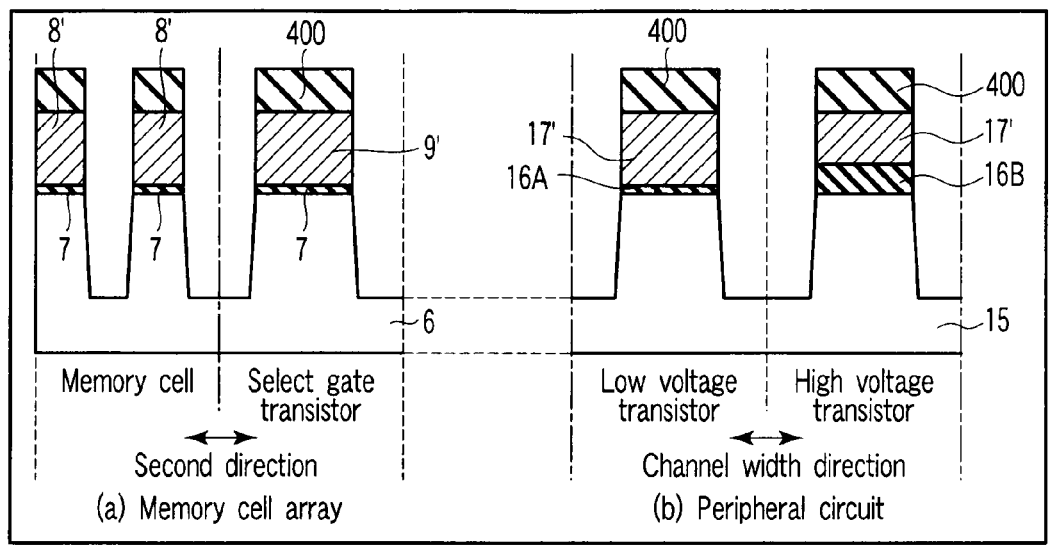
F I G. 55
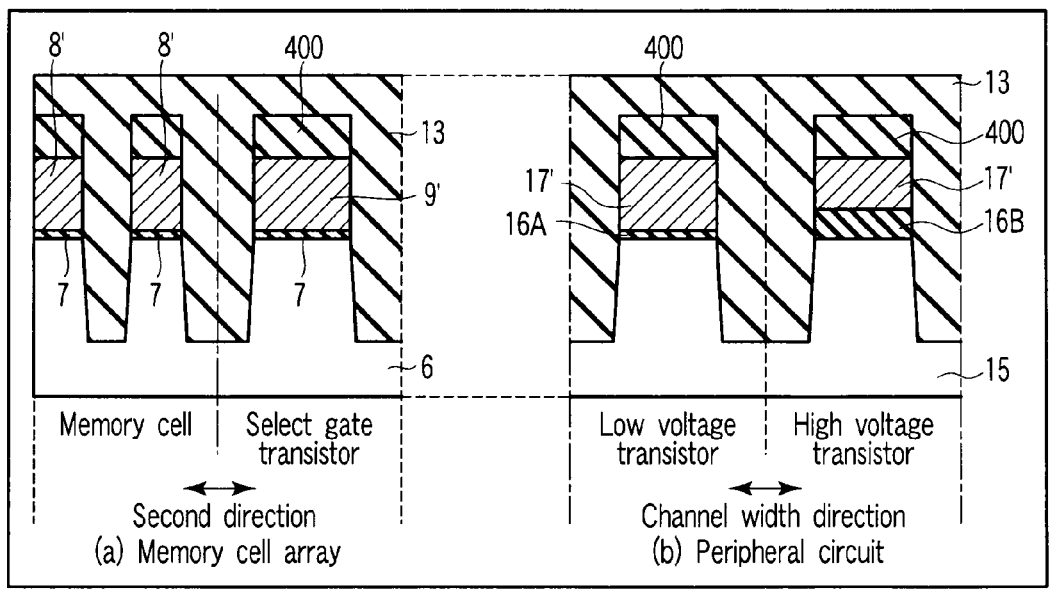
F I G. 56

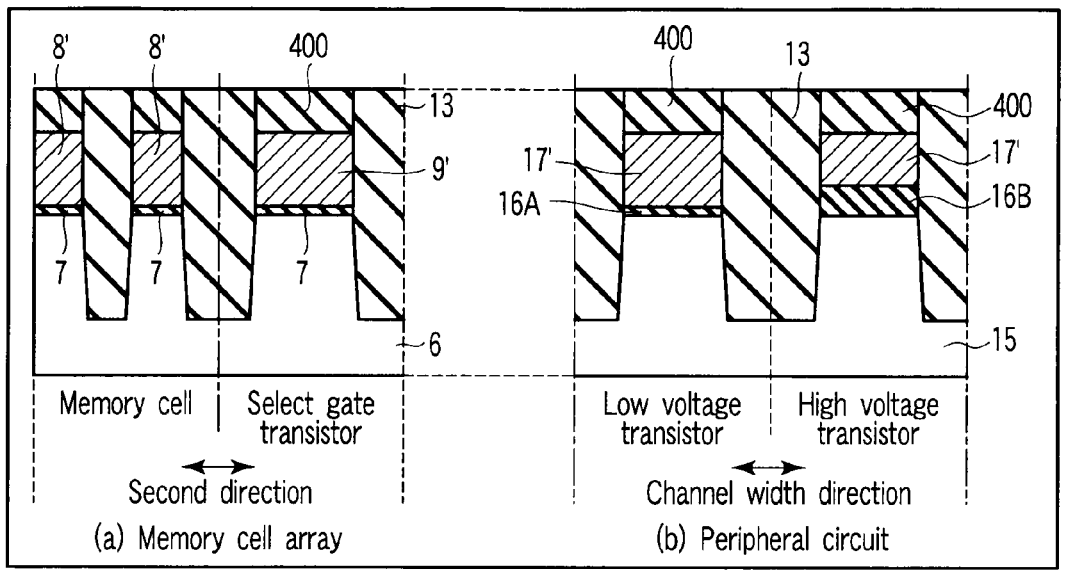
F I G. 57
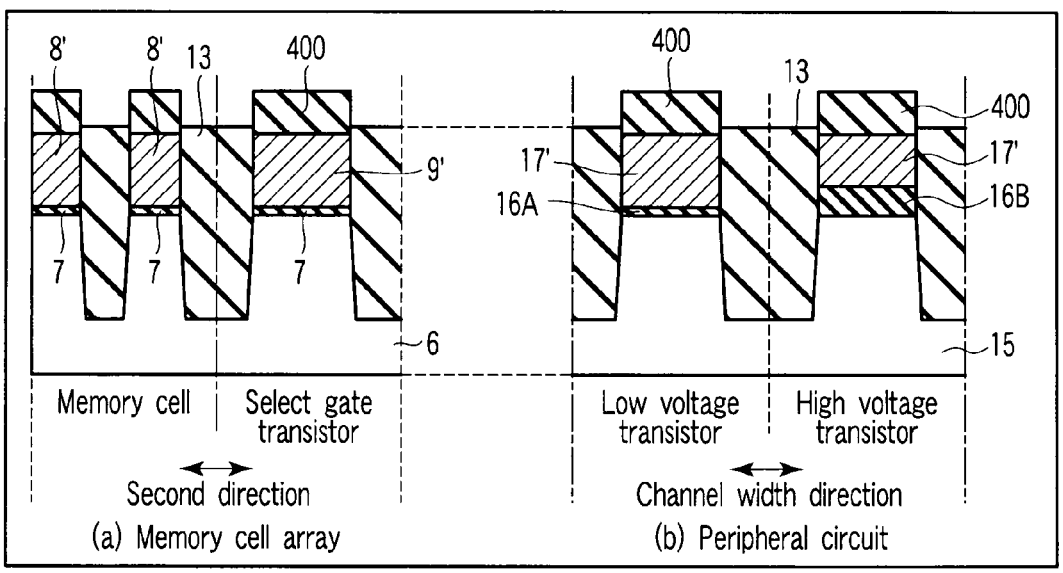
F I G. 58

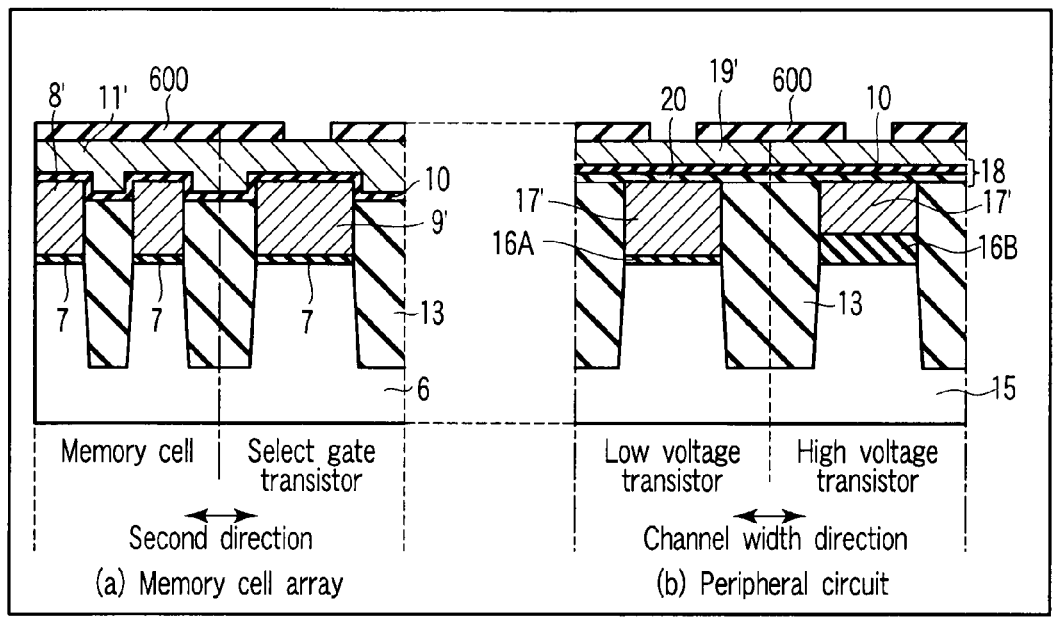
F I G. 65
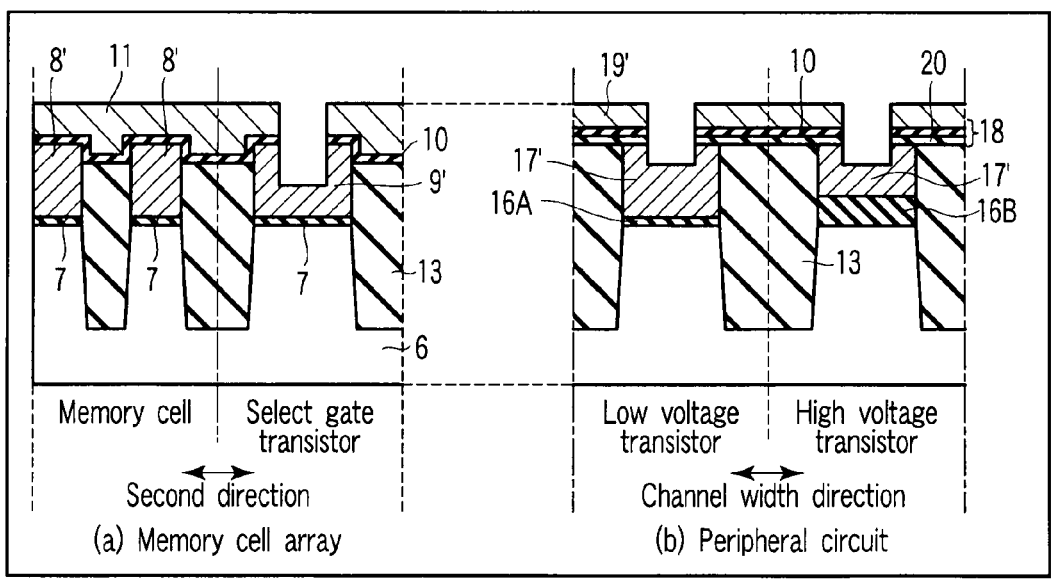
F I G. 66

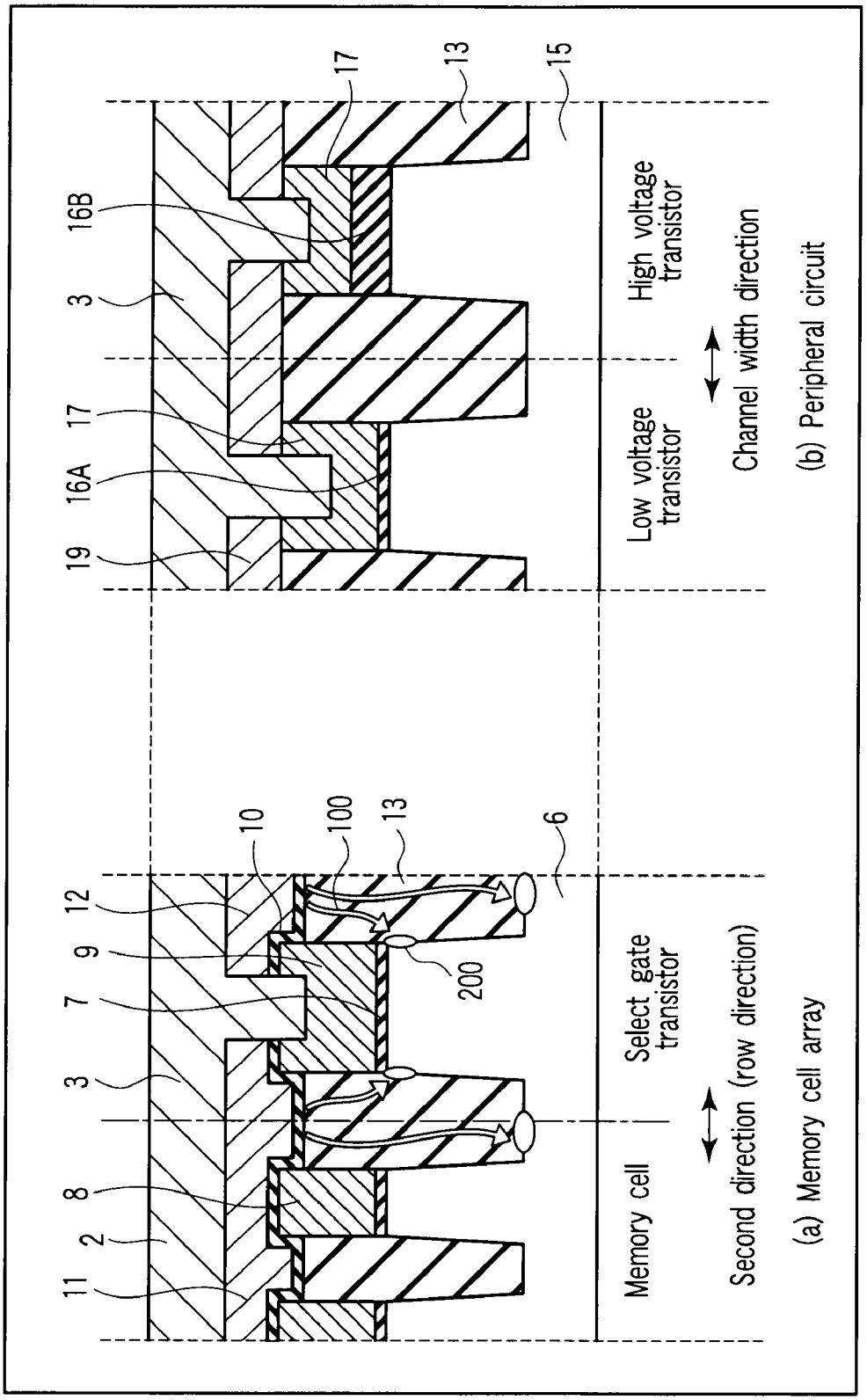
F I G. 68

NONVOLATILE SEMICONDUCTOR MEMORY DEVICE

CROSS-REFERENCE TO RELATED APPLICATIONS

This application is based upon and claims the benefit of priority from prior Japanese Patent Application No. 2007-222601, filed Aug. 29, 2007, the entire contents of which are incorporated herein by reference.

BACKGROUND OF THE INVENTION

1. Field of the Invention

The present invention relates to a structure of a peripheral transistor in a nonvolatile semiconductor memory device.

2. Description of the Related Art

In nonvolatile semiconductor memory devices such as NAND type flash memories, an FN (Fowler-Nordheim) tunnel current is applied to a gate insulating film so that a floating gate electrode (charge storage layer) is filled with electric charges at the time of writing. At this time, a positive voltage of 15 to 40V is applied to the control gate electrode.

When a capacitance ratio (coupling ratio) of the gate insulating film and an inter-electrode insulating film (dielectric film) of a memory cell is large, a high electric field is generated efficiently on the gate insulating film. As a result, a writing characteristic is improved.

Therefore, a technique using a high-permittivity (High-k) material for an inter-electrode insulating film has been proposed as a technique for improving the coupling ratio (for example, see Jpn. Pat. Appln. KOKAI Publication Nos. 2005-277171 and 2006-186073).

The nonvolatile semiconductor memory devices include a memory cell and a peripheral transistor. Both of them are formed by common processes as much as possible in order to reduce the process cost.

For this reason, the peripheral transistor has a structure similar to a memory cell, namely, a stack structure of lower electrode/inter-electrode insulating film/upper electrode. The lower electrode and the upper electrode are electrically connected via an opening provided on the inter-electrode insulating film.

In this case, the high-permittivity material which is adopted for improving the coupling ratio of the memory cell is used also for the inter-electrode insulating film of the peripheral transistor.

However, the high-permittivity material which is used for the inter-electrode insulating film of the peripheral transistor causes a problem that an off-leak current of the peripheral transistor increases and a field isolation breakdown voltage is lowered.

For example, when the high-permittivity material includes a metal oxide film or a raw material gas which is used for depositing the metal oxide film includes carbon atoms, the carbon atoms diffuse on a surface of a semiconductor substrate and a bottom portion of a field isolation insulating film.

When the high-permittivity material includes a nitride film obtained by plasma nitridation, nitrogen radicals at the time of deposition similarly diffuse on the surface of the semiconductor substrate and the bottom portion of the field isolation insulating film. As a result, a parasitic transistor is formed, which causes a problem that an off-leak current of the peripheral transistor increases and the field isolation breakdown voltage decreases.

Also after the inter-electrode insulating film is deposited, the carbon atoms and/or the nitrogen atoms in the inter-electrode insulating film diffuse. As a result, fixed electric charges are generated in an element area, and the performance of the peripheral transistor is possibly deteriorated.

If the high-permittivity material is intended to be used for the inter-electrode insulating film of the memory cell, the problems, such as the increase in the off-leak current and the reduction in the field isolation breakdown voltage, should be eliminated, in view of process integration, without increasing the number of steps of a manufacturing process (process cost).

BRIEF SUMMARY OF THE INVENTION

A nonvolatile semiconductor memory device according to an aspect of the invention comprises a memory cell and a peripheral transistor, which are provided on a semiconductor substrate. The memory cell includes first and second diffusion layers, a first gate insulating film which is provided on a first channel region between the first and second diffusion layers, a floating gate electrode which is provided on the first gate insulating film, a first inter-electrode insulating film which is provided on the floating gate electrode, and a control gate electrode which is provided on the first inter-electrode insulating film. The peripheral transistor includes third and fourth diffusion layers, a second gate insulating film which is provided on a second channel region between the third and fourth diffusion layers, a lower electrode which is provided on the second gate insulating film, a second inter-electrode insulating film which is provided on the lower electrode, and an upper electrode which is provided on the second inter-electrode insulating film. The lower electrode and the upper electrode are electrically connected via an opening provided on the second inter-electrode insulating film, the first and second inter-electrode insulating films include a high-permittivity material, the first inter-electrode insulating film has a first structure, and the second inter-electrode insulating film has a second structure different from the first structure.

A nonvolatile semiconductor memory device according to an aspect of the invention comprises a memory cell and a peripheral transistor, which are provided on a semiconductor substrate. The memory cell includes first and second diffusion layers, a first gate insulating film which is provided on a first channel region between the first and second diffusion layers, a charge storage layer which is provided on the first gate insulating film, a dielectric film which is provided on the charge storage layer, and a control gate electrode which is provided on the dielectric film. The peripheral transistor includes third and fourth diffusion layers, a second gate insulating film which is provided on a second channel region between the third and fourth diffusion layers, and a gate electrode which is provided on the second gate insulating film. The dielectric film includes a high-permittivity material, and the high-permittivity material is not present just above, just below and inside the gate electrode of the peripheral transistor.

BRIEF DESCRIPTION OF THE SEVERAL VIEWS OF THE DRAWING

FIG. 1 is a circuit diagram showing a NAND cell unit;

FIG. 4 is a cross-sectional view taken along line IV-IV of FIG. 2;

FIG. 5 is a cross-sectional view showing an example of an inter-electrode insulating film;

FIG. 7 is a cross-sectional view showing an example of the inter-electrode insulating film;

FIG. 12 is a cross-sectional view showing one step of a manufacturing method;

FIG. 14 is a cross-sectional view showing one step of the manufacturing method;

FIG. 16 is a cross-sectional view showing one step of the manufacturing method;

FIG. 20 is a cross-sectional view showing one step of the manufacturing method;

FIG. 25 is a cross-sectional view showing one step of the manufacturing method;

FIG. 27 is a cross-sectional view showing one step of the manufacturing method;

FIG. 28 is a cross-sectional view showing one step of the manufacturing method;

FIG. 30 is a cross-sectional view showing one step of the manufacturing method;

FIG. 32 is a cross-sectional view showing one step of the manufacturing method;

FIG. 33 is a cross-sectional view showing one step of the manufacturing method;

FIG. 37 is a cross-sectional view showing one step of the manufacturing method;

FIG. 38 is a cross-sectional view showing one step of the manufacturing method;

FIG. 39 is a cross-sectional view showing one step of the manufacturing method;

FIG. 40 is a cross-sectional view showing one step of the manufacturing method;

FIG. 42 is a cross-sectional view showing the NAND cell unit;

FIG. 43 is a cross-sectional view showing the peripheral transistor;

FIG. 55 is a cross-sectional view showing a step of the manufacturing method;

FIG. 56 is a cross-sectional view showing a step of the manufacturing method;

FIG. 57 is a cross-sectional view showing a step of the manufacturing method;

FIG. 58 is a cross-sectional view showing a step of the manufacturing method;

FIG. 65 is a cross-sectional view showing a step of the manufacturing method;

FIG. 66 is a cross-sectional view showing a step of the manufacturing method;

FIG. 68 is a cross-sectional view showing the memory cell and the peripheral transistor;

DETAILED DESCRIPTION OF THE INVENTION

Figure 2:
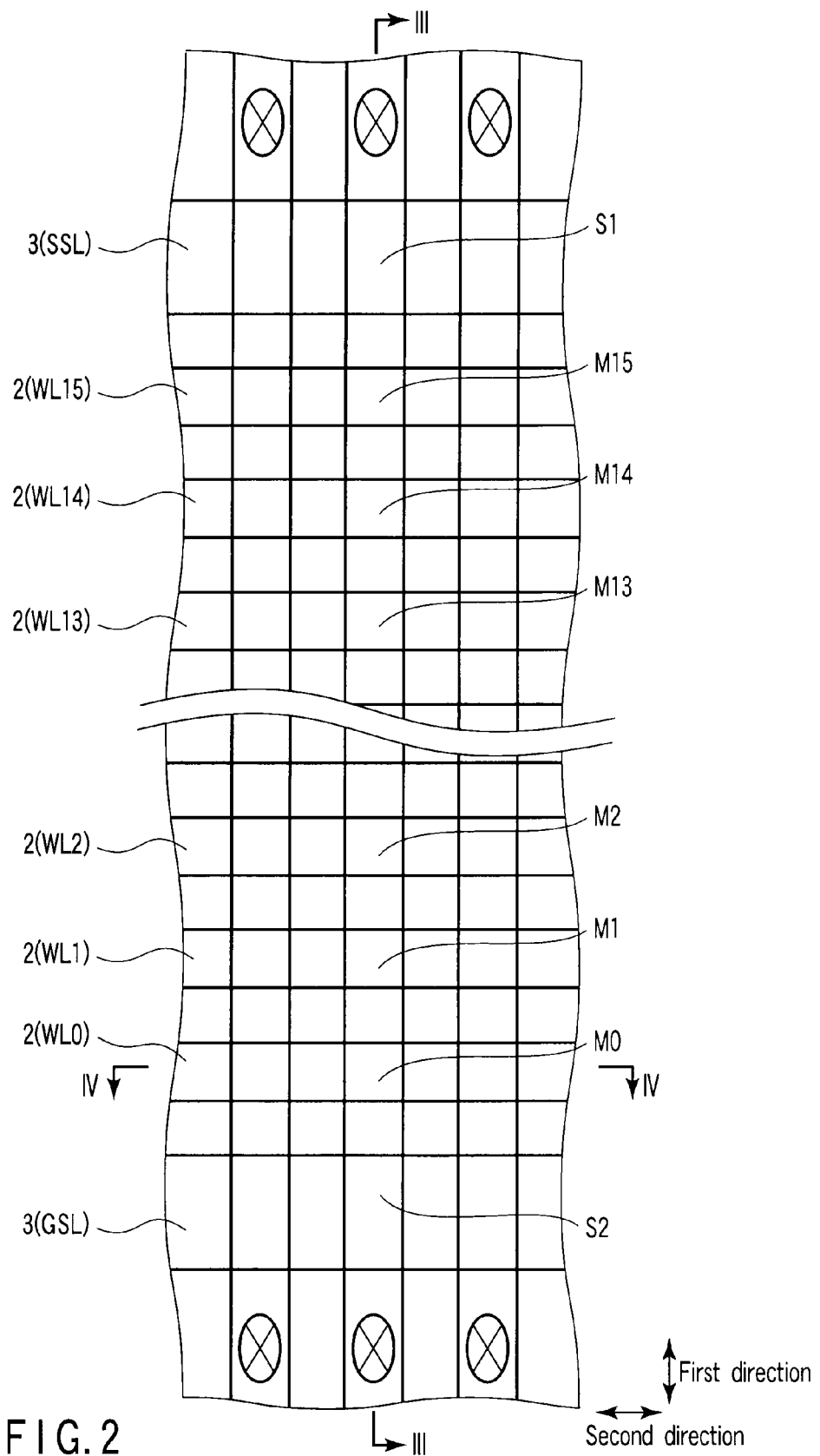
FIG. 2 is plan view showing a NAND cell unit.

A nonvolatile semiconductor memory device of an aspect of the present invention will be described below in detail with reference to the accompanying drawings.

1. OUTLINE

In an example of the present invention, in order to eliminate a bad influence upon a peripheral transistor at the time of using a high-permittivity material for an inter-electrode insulating film (dielectric film) of a memory cell, a structure of the inter-electrode insulating film of the peripheral transistor is made to be different from that of the memory cell.

For example, when the inter-electrode insulating film of the memory cell has a first structure composed of the high-permittivity material or a laminated layer including this material, the inter-electrode insulating film of the peripheral transistor has a second structure including the entire first structure, and further has a blocking insulating film between the first structure and a lower electrode.

Alternatively, an upper electrode is formed directly on the lower electrode of the peripheral transistor, and the inter-electrode insulating film does not have to be present between the lower electrode and the upper electrode.

Even when the high-permittivity material is used for the inter-electrode insulating film of the memory cell, such a structure prevents carbon atoms and nitrogen radicals generated at the time of deposition from diffusing a surface of a semiconductor substrate and a bottom portion of a field insulation insulating film.

The same holds true after the inter-electrode insulating film is deposited.

Therefore, when the high-permittivity material is used for the inter-electrode insulating film of the memory cell, the performance of the peripheral transistor can be prevented from being deteriorated without increasing a process cost.

2. EMBODIMENTS

A NAND type nonvolatile semiconductor memory device according to embodiments of the present invention will be described.

Terms used in the embodiments are defined as follows.

The peripheral transistor is a transistor other than a memory cell (cell transistor), and mainly refers to a P-channel MOS transistor and an N-channel MOS transistor constituting a peripheral circuit. The peripheral transistor includes both a low-voltage type MOS transistor and a high-voltage type MOS transistor.

The inter-electrode insulating film is an insulating film present between two electrodes. For the memory cell, the inter-electrode insulating film is an insulating film present between a floating gate electrode (charge storage layer) and a control gate electrode. For the peripheral transistor, the inter-electrode insulating film is an insulating film present between the lower electrode and the upper electrode.

The present invention can be applied also to a so-called MONOS type memory cell.

In this case, the memory cell has a charge storage layer composed of an insulator instead of a floating gate electrode.

In this embodiment, therefore, the insulating film, including the inter-electrode insulating film, present between the charge storage layer (including floating gate electrode) and the control gate electrode is called a dielectric film.

The blocking insulating film is an insulating film present between the lower electrode and the dielectric film (a portion of the inter-electrode insulating film having the same structure as the inter-electrode insulating film of the memory cell) of the peripheral transistor. The blocking insulating film has a function to block diffusion of the carbon atoms and the nitrogen atoms.

A thin oxide film obtained by natural oxidization can be present between the blocking insulating film and the lower electrode.

The high-permittivity (High-k) material refers to a silicon nitride film and an insulator including a material with a relative permittivity than that of the silicon nitride film.

In a memory cell array area, a first direction (column direction) and a second direction (row direction) are perpendicular to each other. In a peripheral circuit area, a channel length direction and a channel width direction are perpendicular to each together.

(1) First Embodiment

A. Structure

[Memory Cell]

FIG. 1 is a circuit diagram showing a NAND cell unit.

The NAND cell unit 1 is composed of a NAND string including memory cells M0, . . . M15 connected in series, and select gate transistors S1 and S2 connected to both ends of the NAND string, respectively.

The memory cells M0, . . . M15 have a stacked gate structure having a floating gate electrode and a control gate electrode. Word lines 2 (WL0, . . . WL15) extend to the second direction (row direction) and are connected to the control gate electrodes of the memory cells M0, . . . M15, respectively.

A side of the select gate transistor S1 opposite to the NAND string side is connected to a bit line BL. The bit line BL extends in the first direction (column direction). A select gate line (block select line) 3 (SSL) extends in the second direction and is connected to a select gate electrode of the select gate transistor S1.

A side of the select gate transistor S2 opposite to the NAND string is connected to a source line SL. A select gate line (block select line) 3 (GSL) extends in the second direction and is connected to a select gate electrode of the select gate transistor S2.

In this embodiment, the number of memory cells constituting the NAND string is 16 ($=2^4$), but this can be any value as long as the number of memory cells is more than one. However, the number $2^n$ (n is a positive integer) is preferable from the viewpoint of address decode. Any one of the select gate transistors S1 and S2 can be omitted and each of the select gate transistors S1 and S2 can be comprised of a plurality of transistors connected in series.

Figure 3:
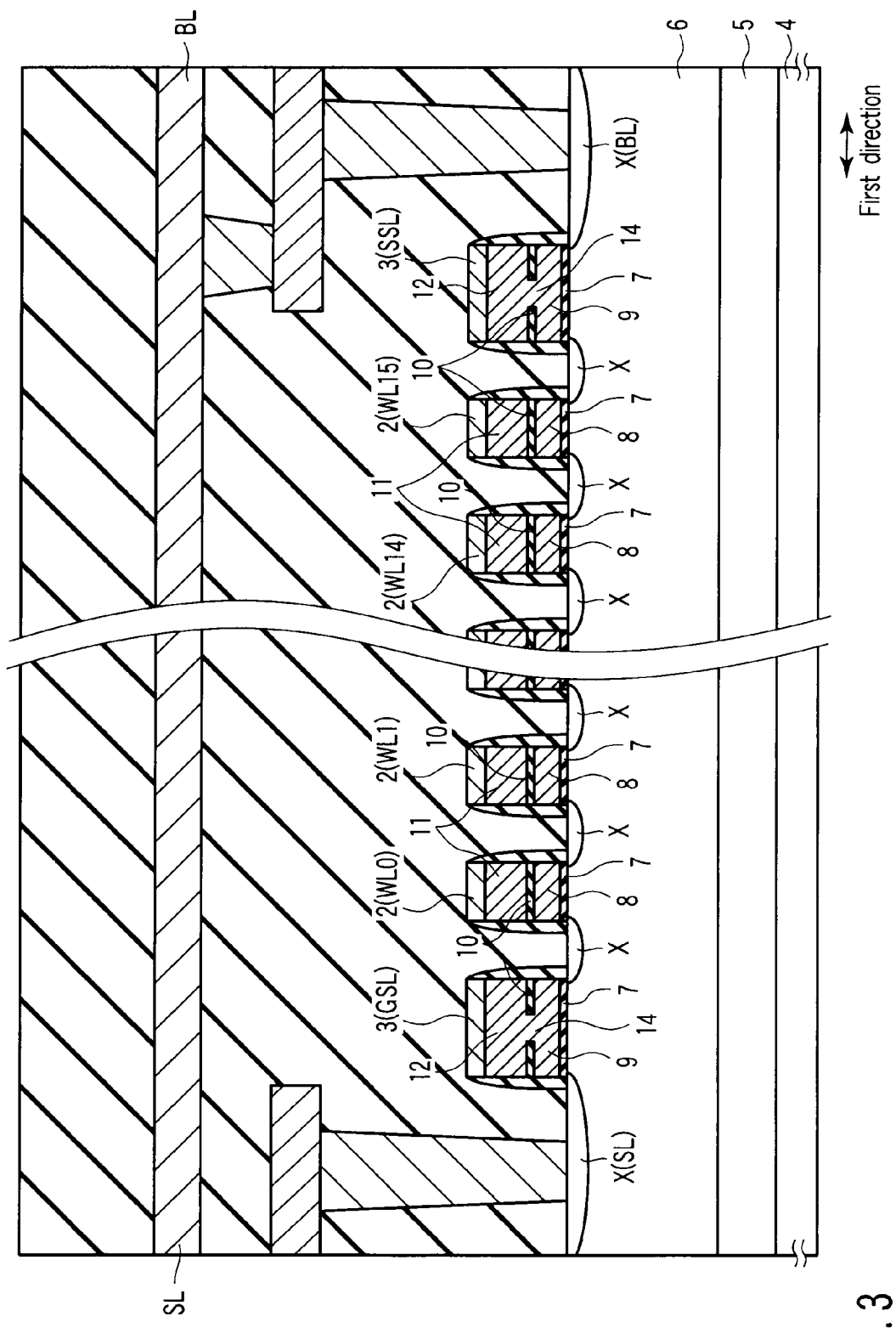
FIG. 3 is a cross-sectional view taken along line III-III of FIG. 2.

FIG. 2 is a plan view showing the NAND cell unit. FIG. 3 is a cross-sectional view taken along line III-III of FIG. 2, and FIG. 4 is a cross-sectional view taken along line IV-IV of FIG. 2.

A double well region composed of an n-type well region 5 and a p-type well region 6 is formed in a p-type silicon substrate 4. The NAND cell unit is formed in the p-type well region 6.

The p-type well region 6 is set so that the boron density falls within the range of $1 \times 10^{14}$ cm$^{-3}$ to $1 \times 10^{19}$ cm$^{-3}$. Since the p-type well region 6 is isolated from the p-type silicon substrate 4 by the n-type well region 5, a voltage can be applied to the p-type well region 6 independently from the p-type silicon substrate 4.

As a result, for example, when data in the memory cells in the NAND cell unit is erased, an erasing voltage can be applied only to the p-type well region 6. For this reason, a load on a boost circuit is further reduced and thus power consumption is further suppressed in comparison with a case where the erasing voltage is applied to the p-type silicon substrate 4.

A gate insulating film 7 having a thickness of 3 nm to 15 nm, for example, is formed on the surface of the p-type well region 6. The gate insulating film 7 is composed of, for example, a silicon oxide film, an oxynitride film or the like.

Floating gate electrodes 8 of the memory cells and lower electrodes 9 of the select gate transistors are formed on the gate insulating films 7. The floating gate electrodes 8 and the lower electrodes 9 are composed of a conductive polysilicon film in which phosphorus or arsenic is added up to a concentration of $1 \times 10^{18}$ cm$^{-3}$ to $1 \times 10^{21}$ cm$^{-3}$.

The thickness of the floating gate electrodes 8 and the lower electrodes 9 is set within the range of 10 nm to 500 nm.

The floating gate electrodes 8 are formed in a self-alignment manner on active areas partitioned by field isolation insulating films 13 made of silicon oxide films, respectively.

In this case, after the floating gate electrodes 8 are patterned, the p-type well region 6 is etched within the range of 0.05 nm to 0.5 nm, and the field isolation insulating films 13 are embedded in the etched portions.

Inter-electrode insulating films (dielectric films) 10 having a thickness of 5 nm to 30 nm are formed on the floating gate electrodes 8. Similarly, the inter-electrode insulating films 10 having a thickness of 5 nm to 30 nm are formed on the lower electrodes 9.

Control gate electrodes 11 and upper electrodes 12 are formed on the inter-electrode insulating films 10. The control gate electrodes 11 and the upper electrodes 12 are made of a conductive polysilicon film in which phosphorus or arsenic is added within the concentration of $1 \times 10^{17}$ cm$^{-3}$ to $1 \times 10^{21}$ cm$^{-3}$, or a stacked structure composed of the conductive polysilicon film and a metal silicide film (for example, WSi, NiSi, MoSi, TiSi, CoSi).

The control gate electrodes 11 have a thickness of 10 nm to 500 nm, and are formed continuously in the second direction (row direction) of the memory cell array. As a result, the control gate electrodes 11 become word lines 2 (WL0 to WL15).

Similarly, the upper electrodes 12 have a thickness of 10 nm to 500 nm, and are formed continuously in the second direction (row direction) of the memory cell array. As a result, the upper electrodes 12 become the select gate lines 3 (SSL, GSL).

The lower electrodes 9 and the upper electrodes 12 of the select gate transistors are electrically connected to each other via openings provided on the inter-electrode insulating film 10.

The memory cells and the select gate transistors are connected in series by diffusion layers X, so as to constitute the NAND cell unit.

The source diffusion layer X (SL), which is one end of the NAND cell unit, is connected to the source line SL, and the drain diffusion layer X (BL), the other end thereof, is connected to the bit line BL which extends to the first direction (column direction).

The inter-electrode insulating films 10 are composed of a high-permittivity (High-k) material, for example, an insulating film containing a metal oxide such as HfAlO, HfSiOx and Al$_2$O$_3$ in order to improve a coupling ratio of the memory cells.

Figure 6:
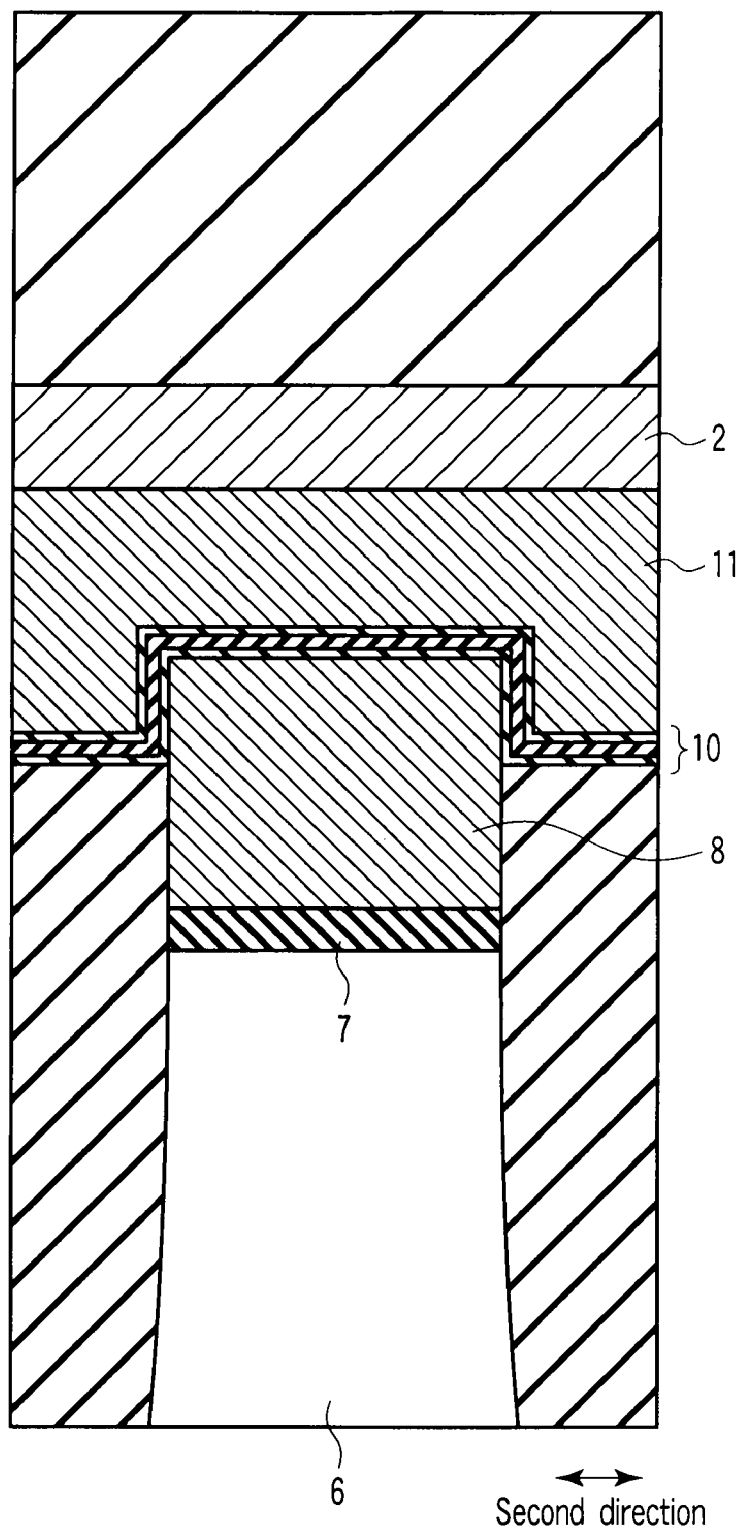
FIG. 6 is a cross-sectional view showing an example of the inter-electrode insulating film.

Specifically, the inter-electrode insulating film 10 can have a single layered structure composed of only a high-permittivity material as shown in FIG. 5, or can have a three-layered structure of silicon nitride film/high-permittivity material/silicon nitride film or silicon oxide film/high-permittivity material/silicon oxide film as shown in FIG. 6.

As shown in FIG. 7, the inter-electrode insulating film 10 can have a five-layered structure of silicon nitride film/silicon oxide film/high-permittivity material/silicon oxide film/silicon nitride film.

[Peripheral Transistor]

Figure 8:
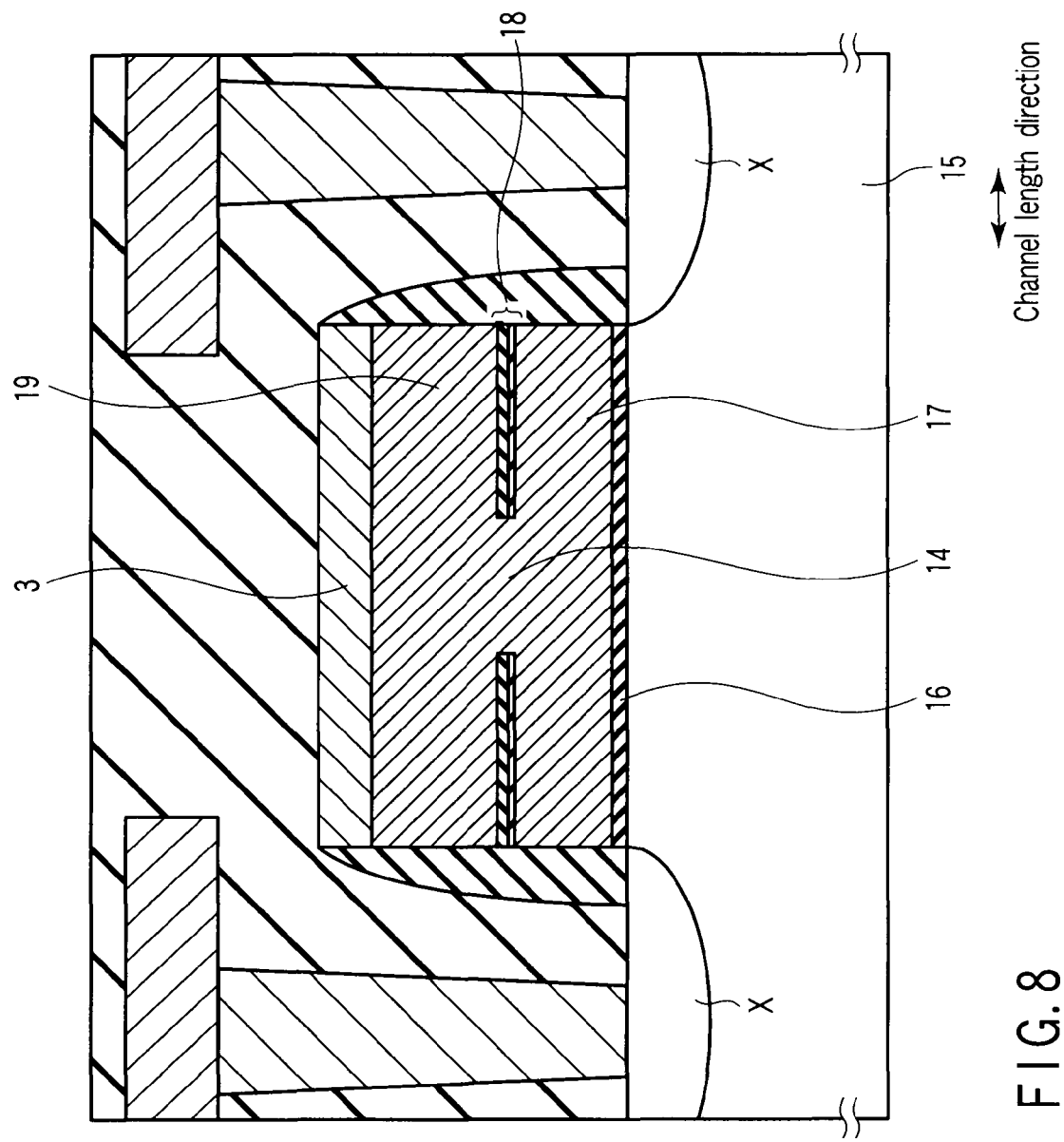
FIG. 8 is a cross-sectional view showing a peripheral transistor.
Figure 9:
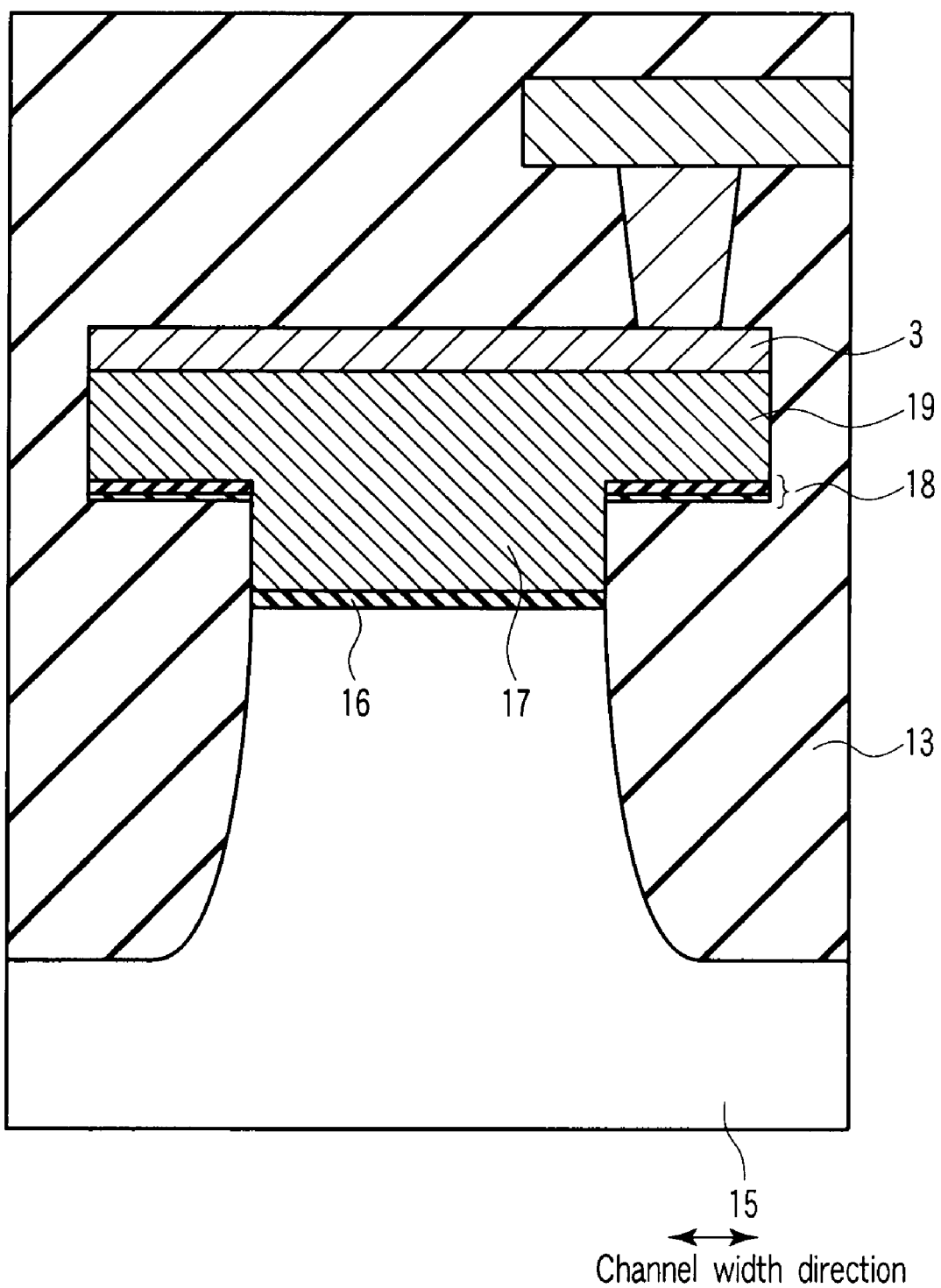
FIG. 9 is a cross-sectional view showing the peripheral transistor.

FIGS. 8 and 9 are cross-sectional views showing a peripheral transistor.

FIG. 8 is a cross section in a channel length direction, and FIG. 9 is a cross section in a channel width direction.

Examples of the peripheral transistor include n-type MISFET and p-type MISFET transistors from the viewpoint of conductive type, and low-voltage MISFET and high-voltage MISFET transistors from the viewpoint of a breakdown voltage. Further examples thereof include enhancement type and depletion type transistors from the viewpoint of on/off operations.

A gate insulating film 16 is formed on the surface of a p-type well region 15. The gate insulating film 16 can be formed on the surface of a p-type semiconductor substrate instead of the p-type well region 15.

A lower electrode 17 is formed on the gate insulating film 16. Upper electrodes 3 and 19 are formed on the lower electrode 17 via an inter-electrode insulating film (dielectric film) 18. The lower electrode 17 and the upper electrodes 3 and 19 are electrically connected via an opening 14 provided in the inter-electrode insulating film 18.

The inter-electrode insulating film 18 is composed of an insulating film including a high-permittivity material such as HfAlO, HfSiOx or Al$_2$O$_3$. The inter-electrode insulating film 18 has a structure different from that of the inter-electrode insulating film of the memory cell.

Figure 10:
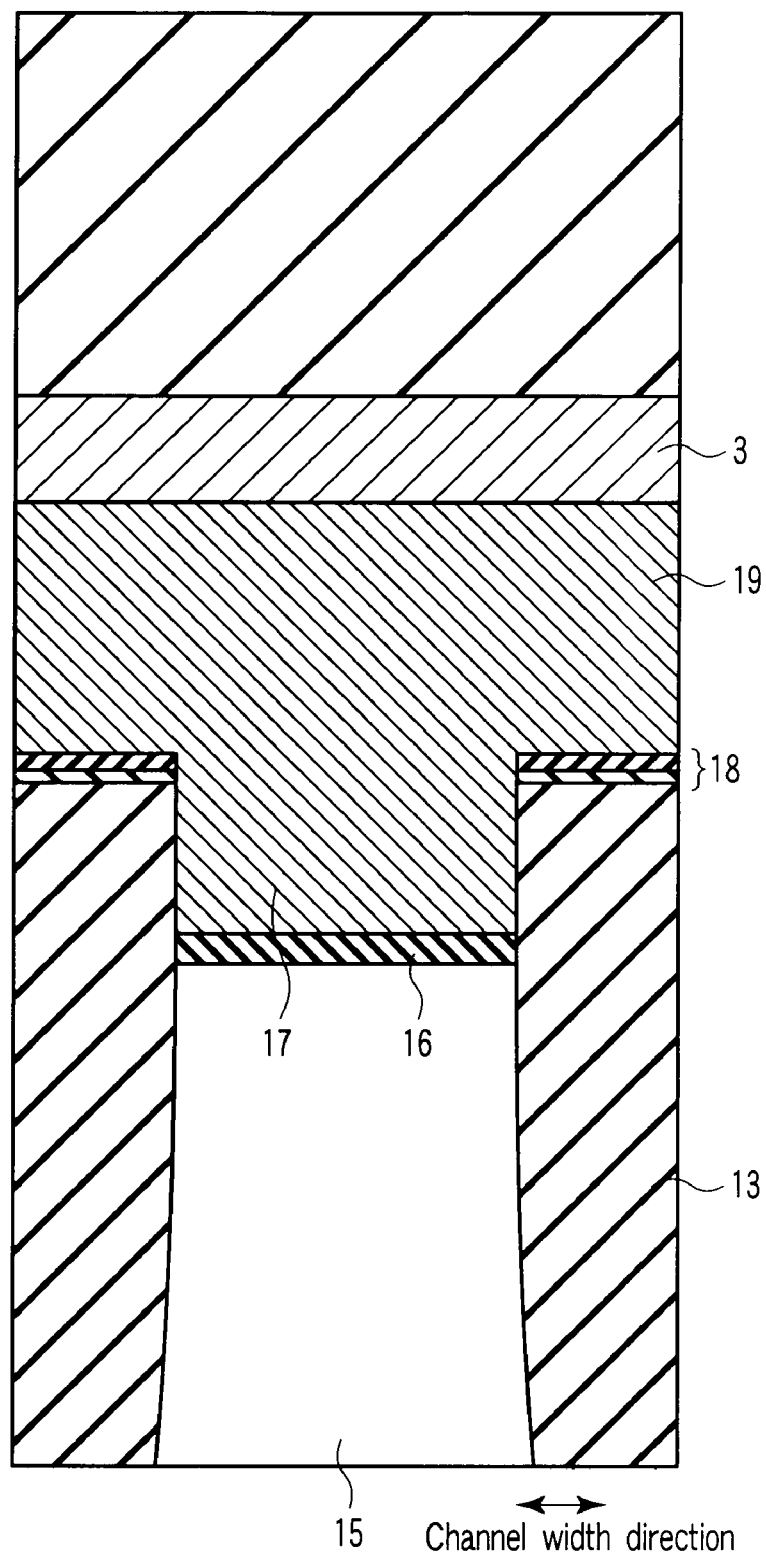
FIG. 10 is a cross-sectional view showing an example of the inter-electrode insulating film.

Specifically, as shown in FIG. 10, the inter-electrode insulating film 18 has a two-layered structure of a blocking insulating film/high-permittivity material.

Figure 11:
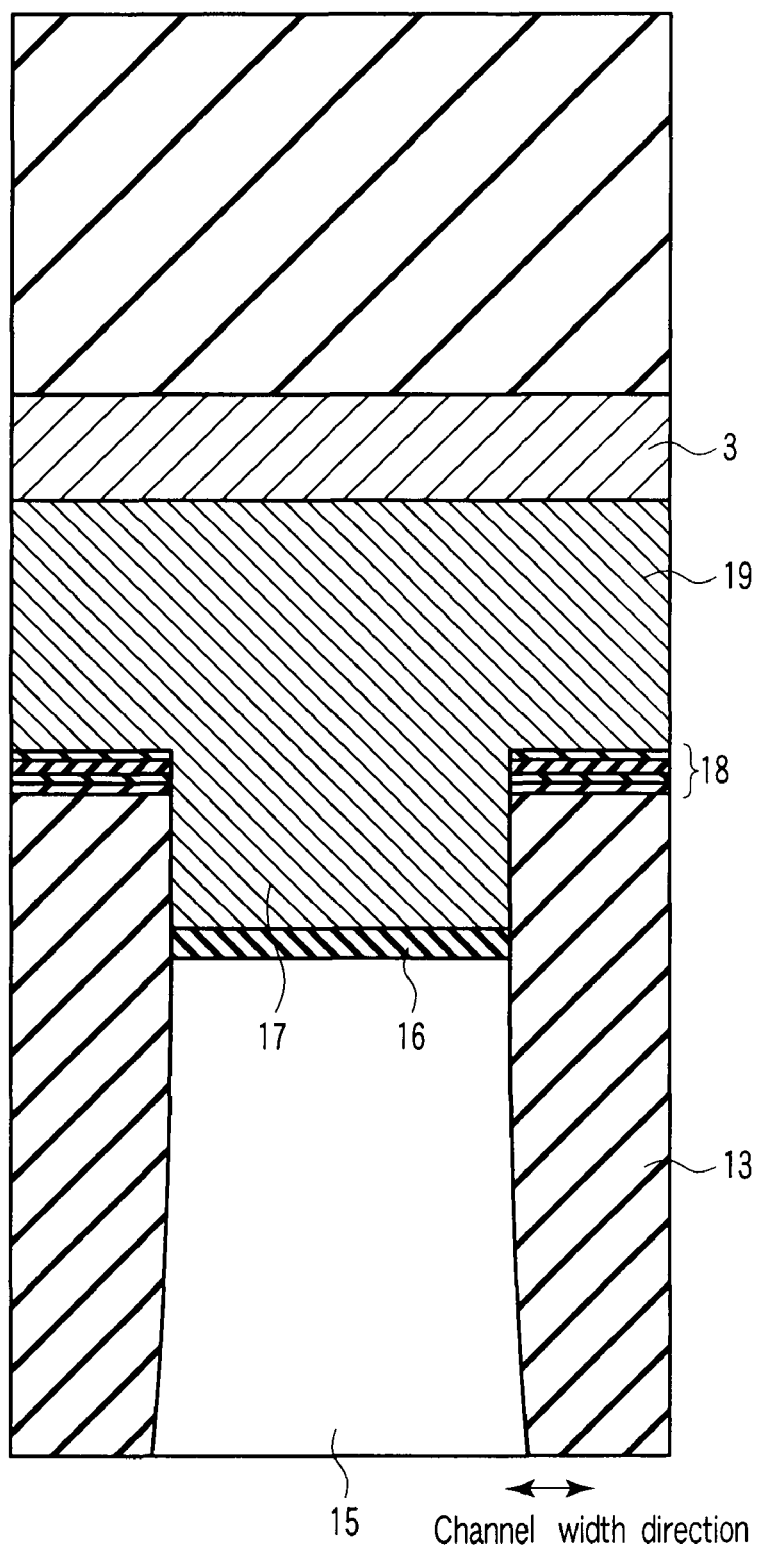
FIG. 11 is a cross-sectional view showing an example of the inter-electrode insulating film.

As shown in FIG. 11, the inter-electrode insulating film 18 can have a four-layered structure of a blocking insulating film/silicon nitride film/high-permittivity material/silicon nitride film or blocking insulating film/silicon oxide film/high-permittivity material/silicon oxide film. Alternatively, as shown in FIG. 12, the inter-electrode insulating film 18 can have a six-layered structure of a blocking insulating film/silicon nitride film/silicon oxide film/high-permittivity material/silicon oxide film/silicon nitride film.

The important thing here is that the structure of the portions of the inter-electrode insulating film 18 in the peripheral transistor except for the blocking insulating film is the same as the structure of the inter-electrode insulating film 10 of the memory cell. As a result, deposition of the blocking insulating film needs be performed before the inter-electrode insulating film 10 of the memory cell is deposited. An increase in the number of steps in this example can be thus suppressed to the minimum.

The blocking insulating film constitutes the lowermost layer of the inter-electrode insulating film 18, and has a function to block diffusion of carbon atoms, nitrogen atoms and the like.

The blocking insulating film is preferably composed of a material having extreme precision in view of its object. For example, an HTO (High Temperature Oxide) film is efficient as the blocking insulating film.

For example, insulating films such as a silicon oxide film, a silicon nitride film and a silicon oxynitride film can be used as the blocking insulating film.

The lower electrode 17 has the same structure as that of the floating gate electrode in the memory cell, and the upper electrodes 3 and 19 have the same structure as that of the control gate electrode in the memory cell.

A side wall insulating film is formed on side walls of the lower electrode 17 and the upper electrodes 3 and 19. A diffusion layer X as a source/drain is formed in the p-type well region 15.

With such a structure, even when a high-permittivity material is used for the inter-electrode insulating film of the memory cell, the diffusion of the carbon atoms and nitrogen atoms from the inter-electrode insulating film of the peripheral transistor can be prevented. For this reason, the carbon atoms and the nitrogen atoms do not become fixed charges in the semiconductor substrate.

Therefore, improvement in the coupling ratio of the memory cell is compatible with improvement in peripheral transistor characteristics.

In the above description, the peripheral transistor is an n-type MISFET, but when the peripheral transistor is formed on the surface of the n-type well region, it becomes a p-type MISFET.

When the peripheral transistor is a high-voltage MISFET, the gate insulating film is thick and thus this transistor is easily influenced by a parasitic transistor. For this reason, the present invention is particularly effective for a high-voltage MISFET.

B. Manufacturing Method

A method for manufacturing the memory cell and the peripheral transistor in the first embodiment will be described with FIGS. 13 to 40. FIGS. 13 to 40 includes four cross sectional view as follows: the cross sectional view along with the first direction, the cross sectional view along with the second direction, the cross sectional view along with the channel length direction, and the cross sectional view along with the channel width direction.

As shown in FIGS. 13 to 16, the n-type well region 5 and the p-type well regions 6 and 15 are formed in the p-type semiconductor substrate (silicon substrate) 4 according to an ion implantation method. The gate insulating films (silicon oxide films) 7 and 16 are formed on the p-type well regions 6 and 15, respectively, according to a thermal oxidation method. Thereafter, conductive films (for example, conductive polysilicon films) 8' and 17' are formed on the gate insulating films 7 and 16, respectively, according to the CVD method.

A resist pattern is formed on the conductive films 8' and 17', and the conductive films 8' and 17', the gate insulating films 7 and 16, and the semiconductor substrate (p-type well region) 4 are sequentially etched by using the resist pattern as an etching mask according to RIE.

Figure 13:
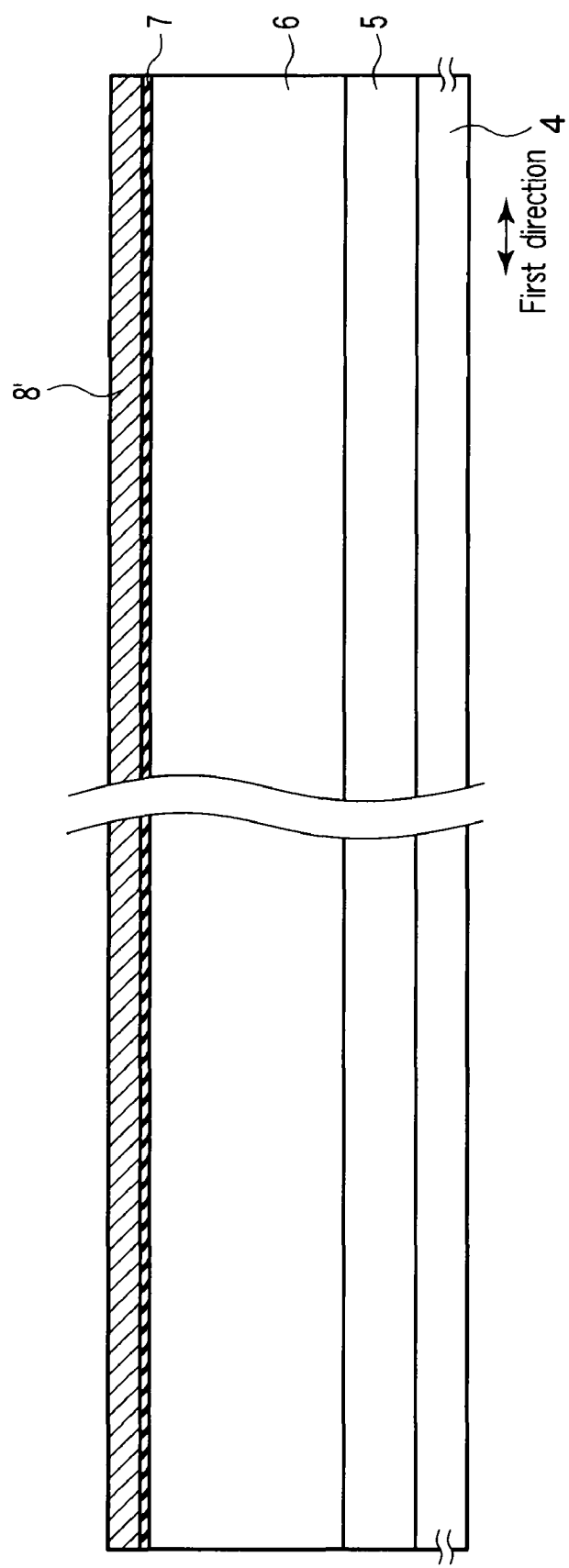
FIG. 13 is a cross-sectional view showing one step of the manufacturing method.
Figure 15:
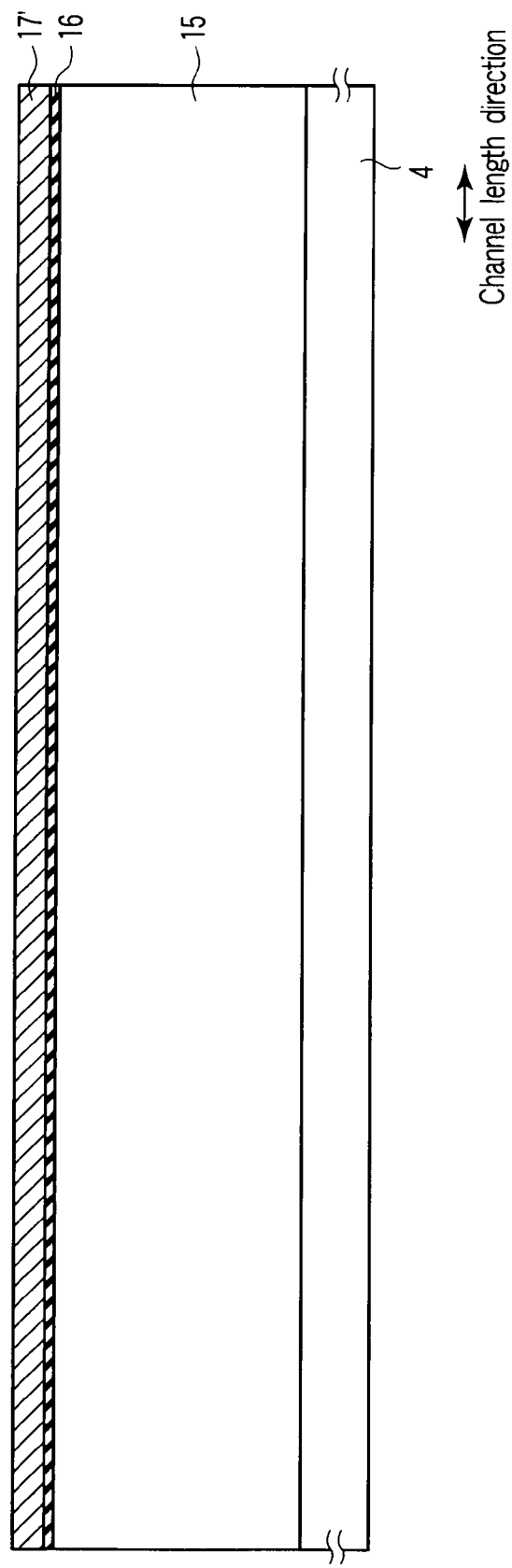
FIG. 15 is a cross-sectional view showing one step of the manufacturing method.
Figure 17:
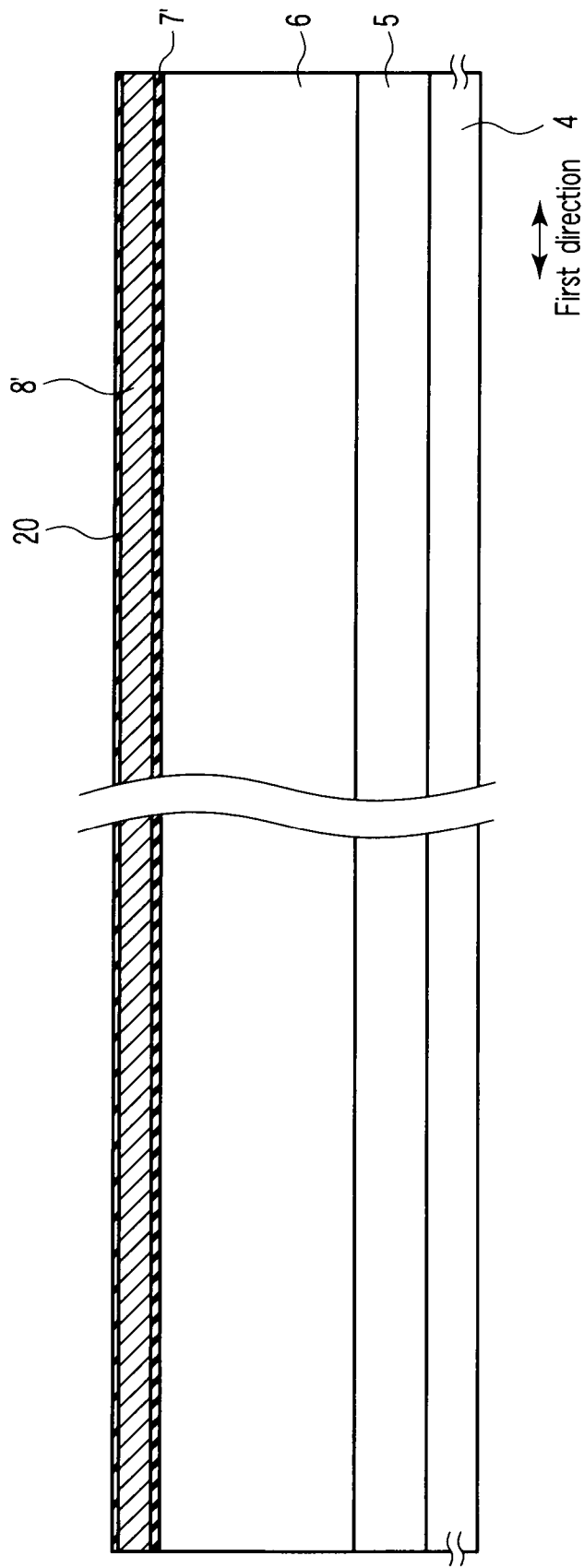
FIG. 17 is a cross-sectional view showing one step of the manufacturing method.
Figure 18:
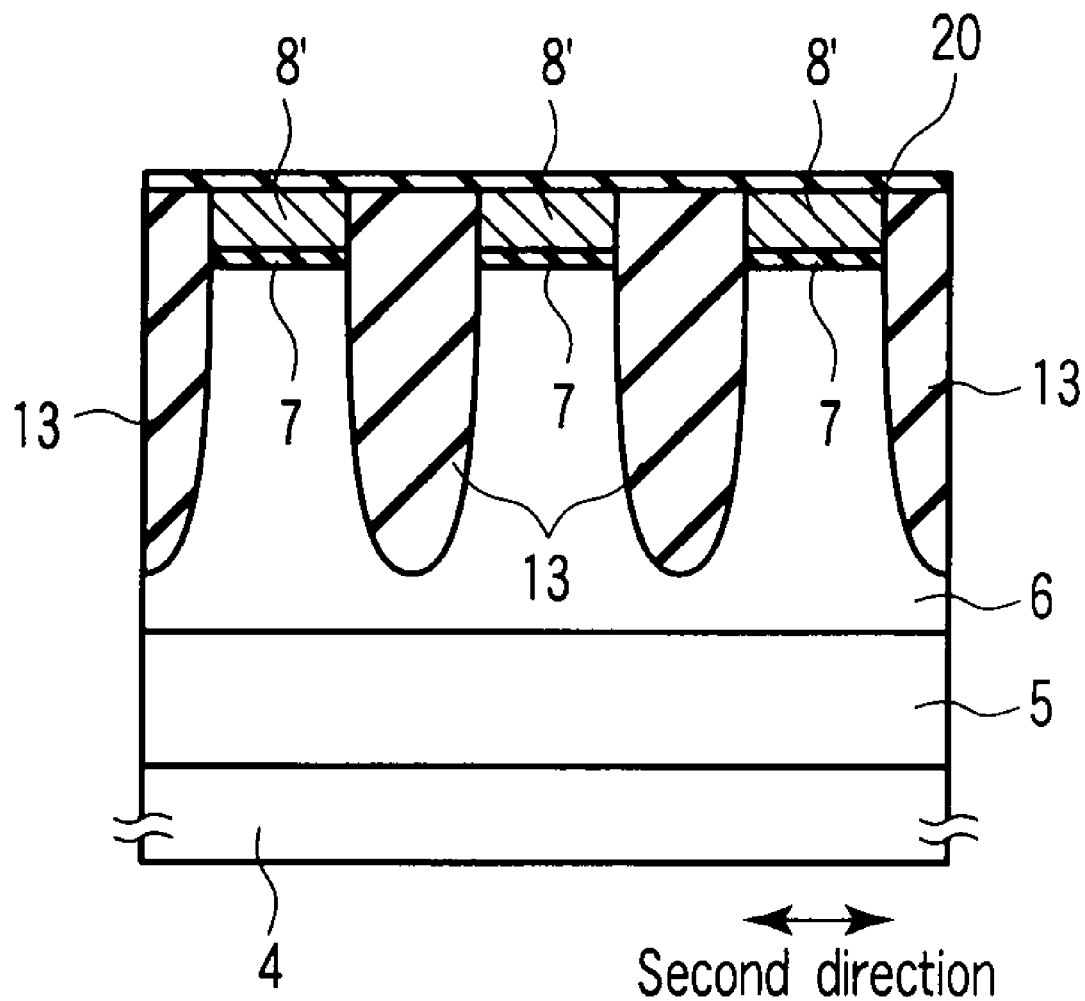
FIG. 18 is a cross-sectional view showing one step of the manufacturing method.
Figure 19:
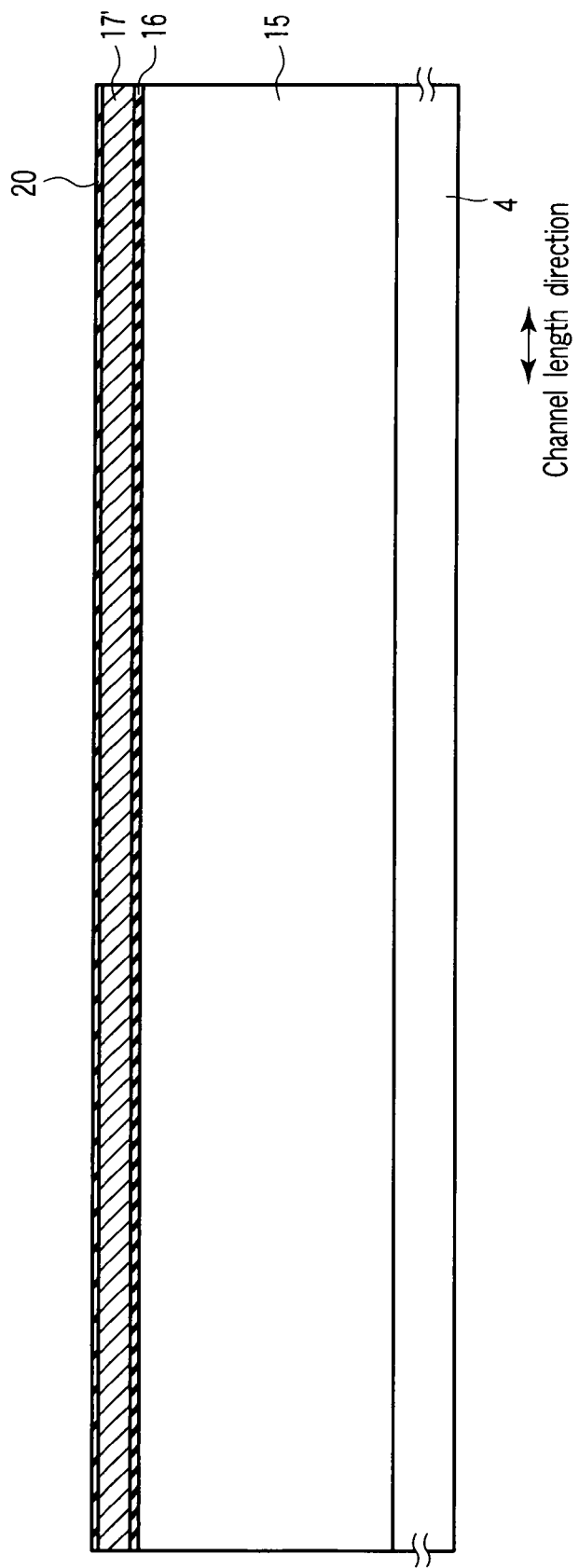
FIG. 19 is a cross-sectional view showing one step of the manufacturing method.
Figure 21:
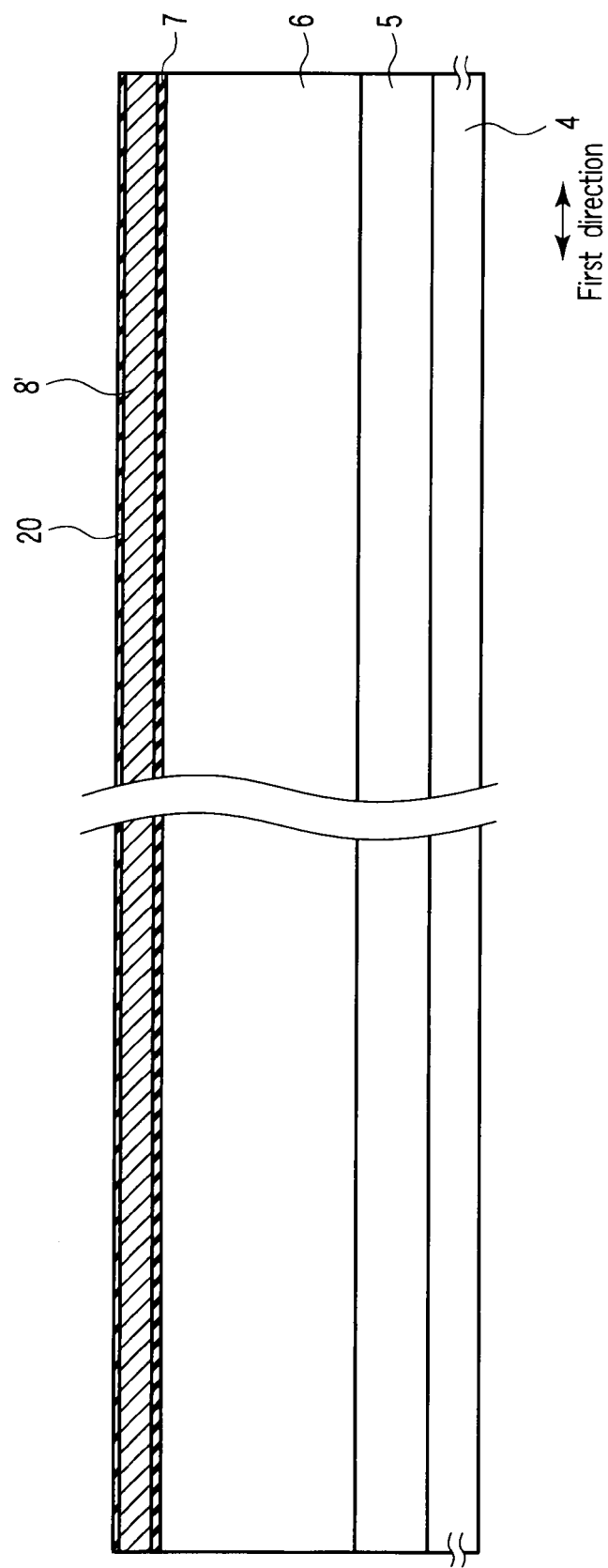
FIG. 21 is a cross-sectional view showing one step of the manufacturing method.
Figure 22:
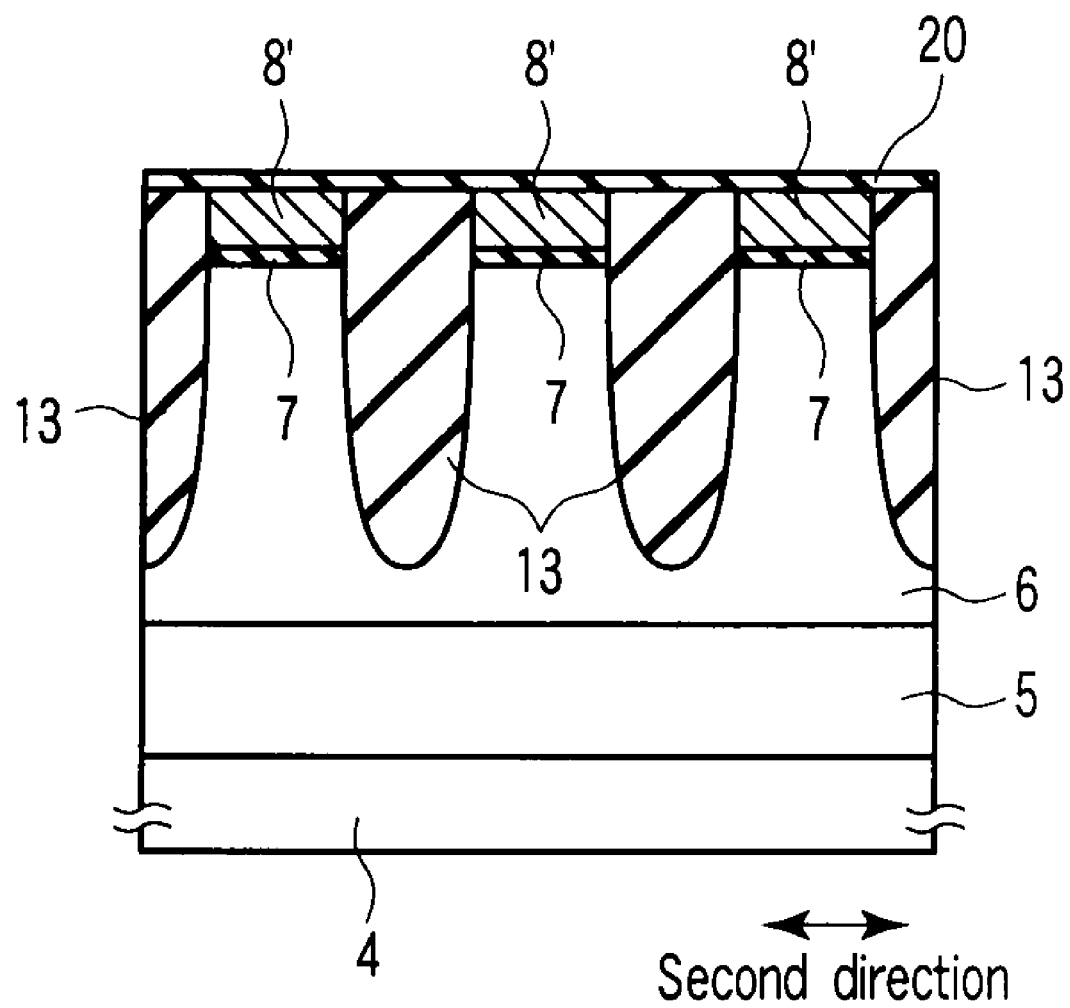
FIG. 22 is a cross-sectional view showing one step of the manufacturing method.
Figure 23:
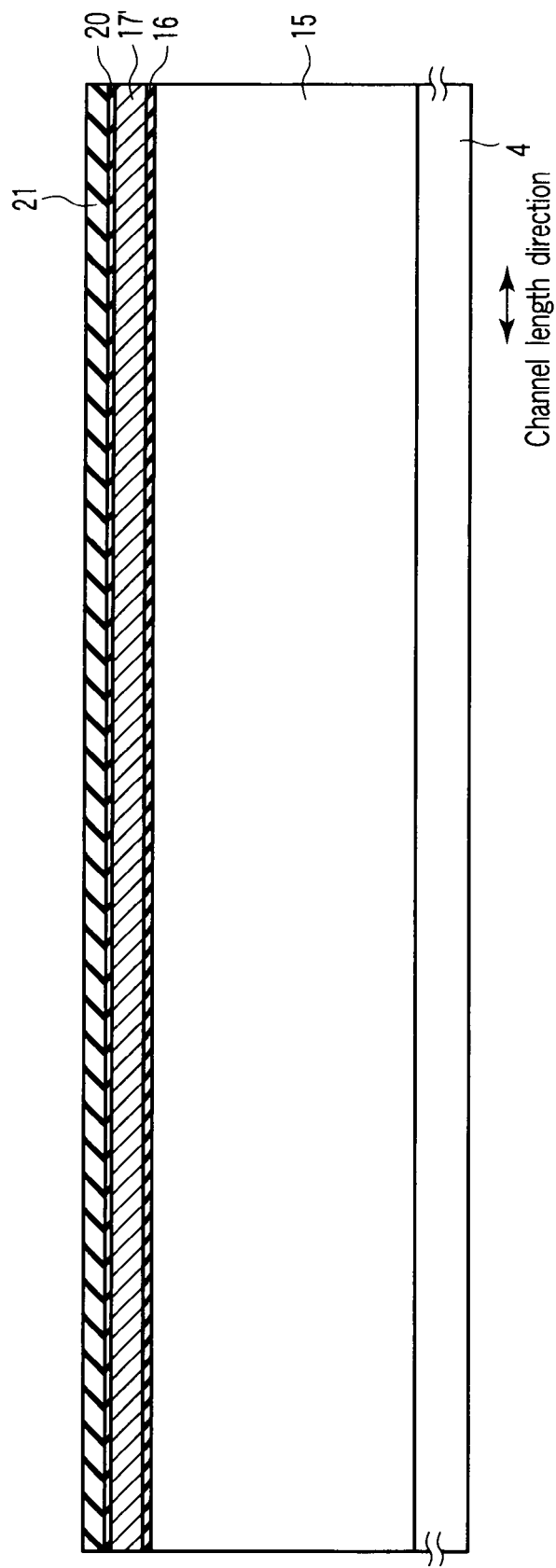
FIG. 23 is a cross-sectional view showing one step of the manufacturing method.
Figure 24:
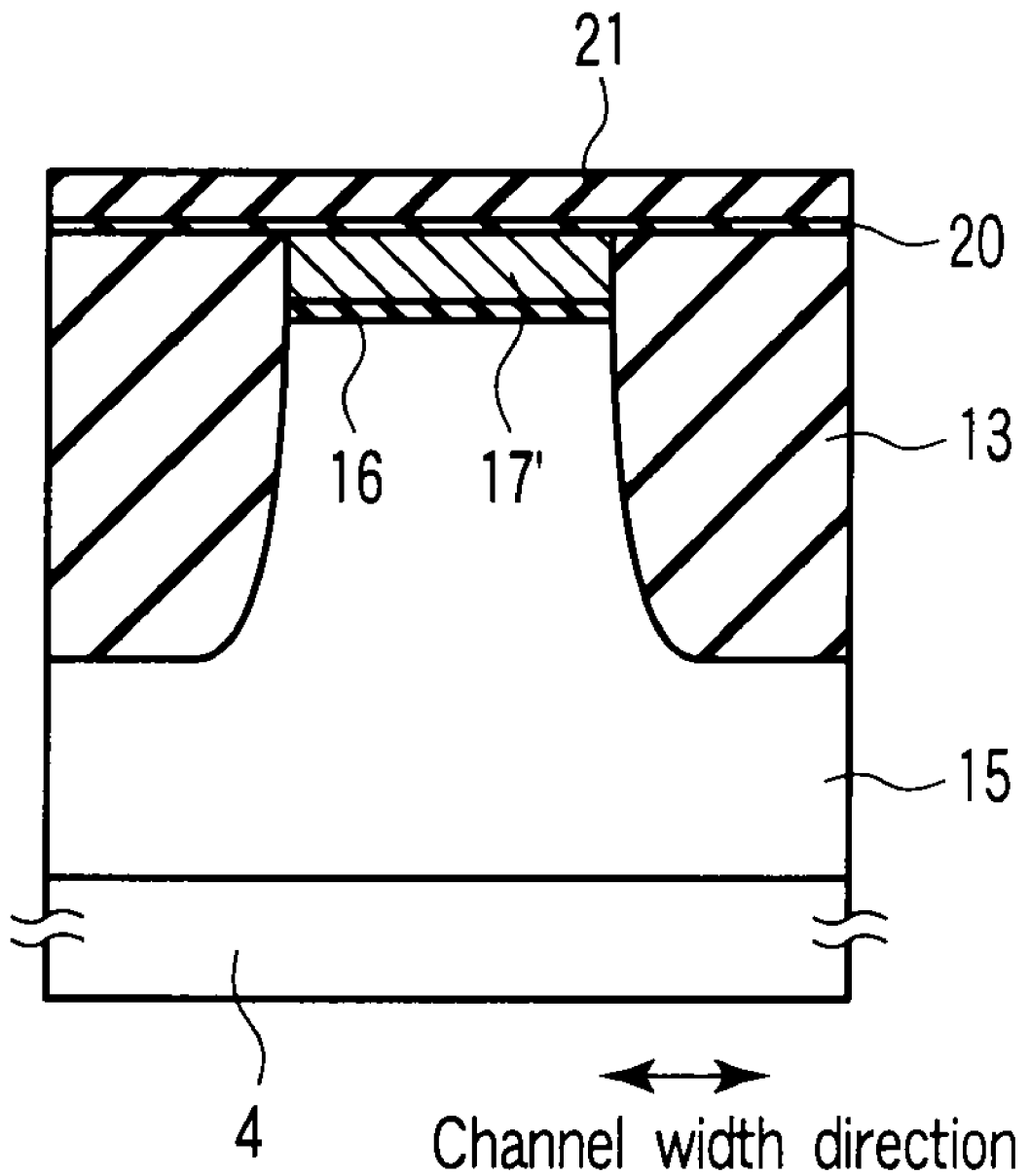
FIG. 24 is a cross-sectional view showing one step of the manufacturing method.
Figure 26:
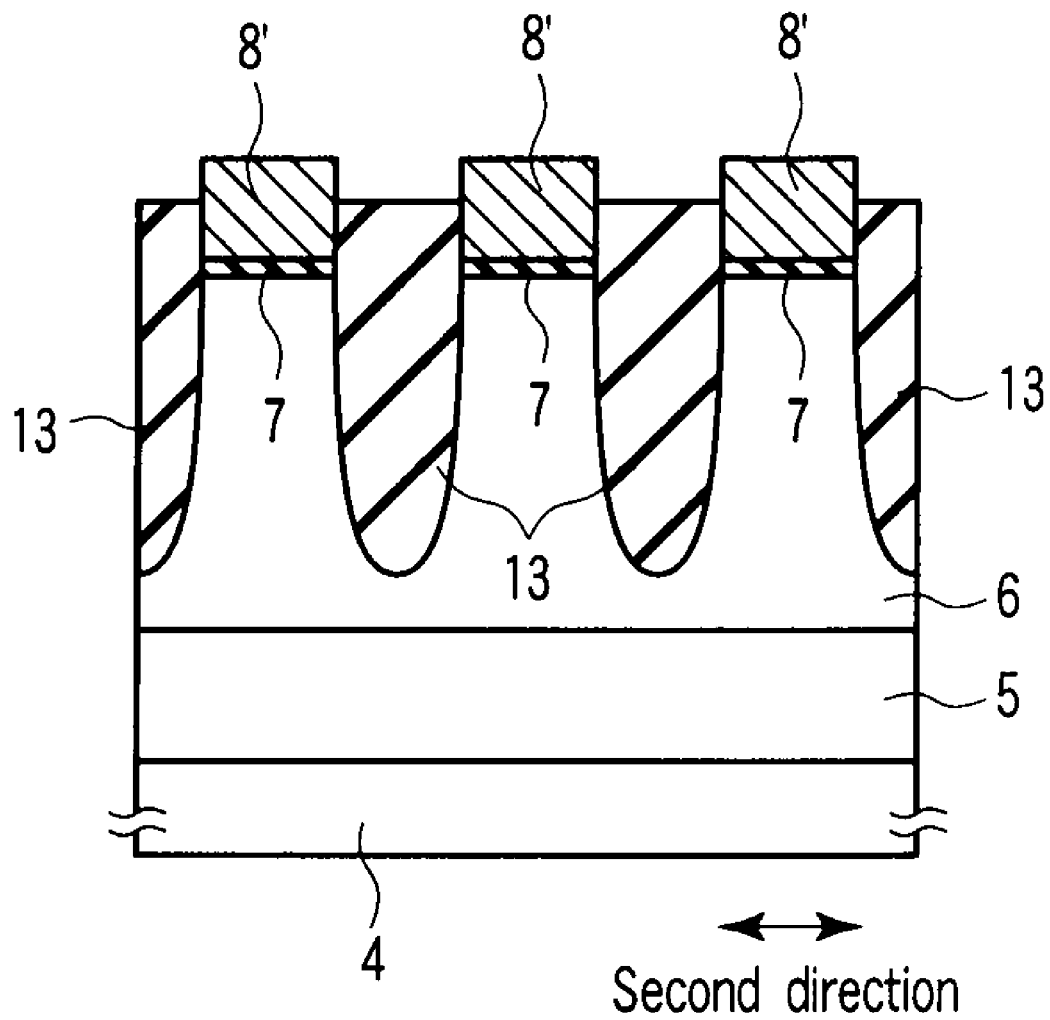
FIG. 26 is a cross-sectional view showing one step of the manufacturing method.
Figure 29:
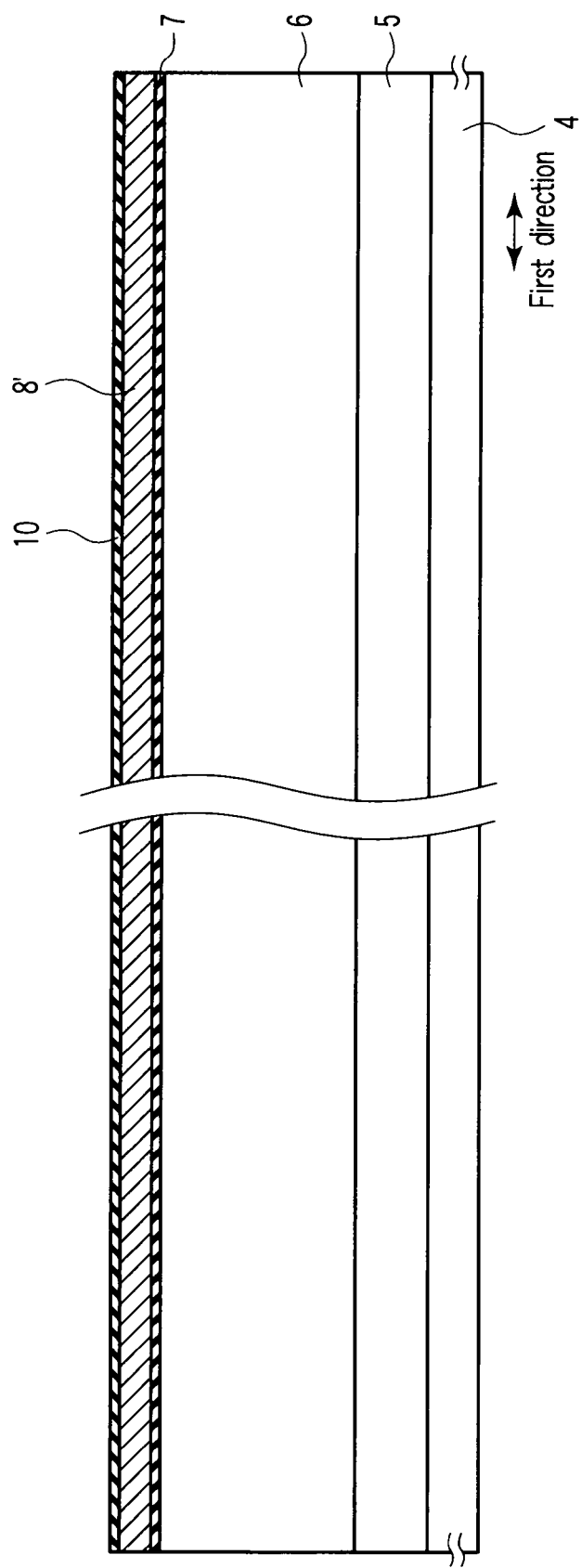
FIG. 29 is a cross-sectional view showing one step of the manufacturing method.
Figure 31:
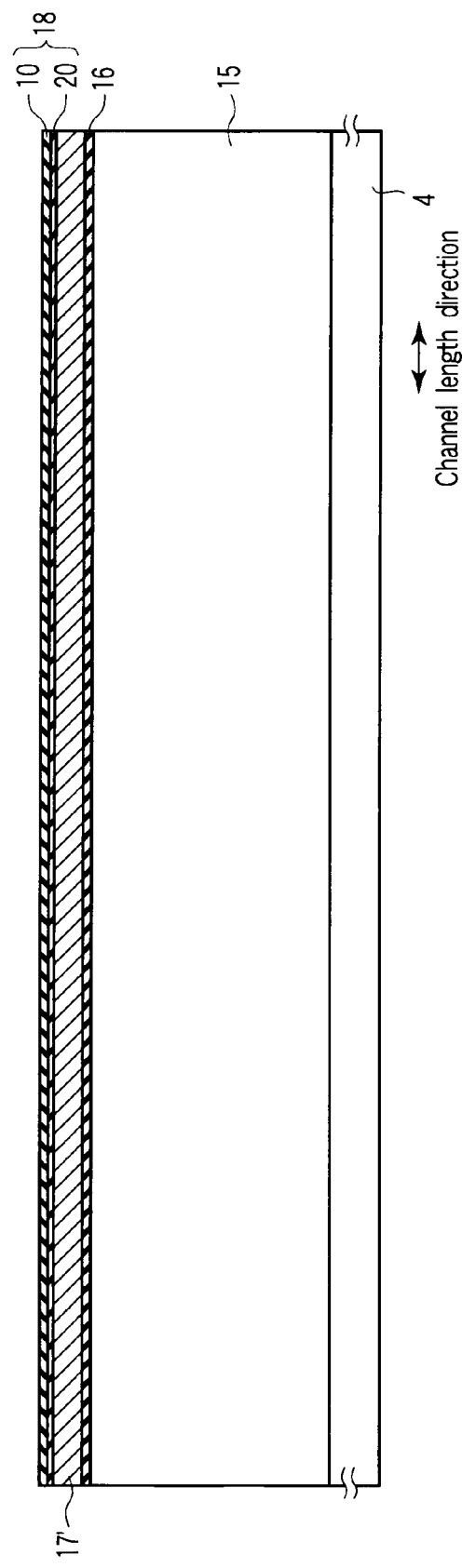
FIG. 31 is a cross-sectional view showing one step of the manufacturing method.
Figure 34:
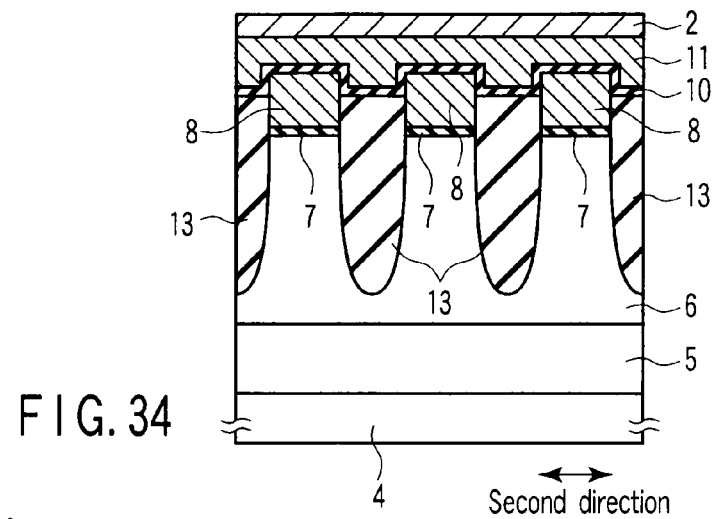
FIG. 34 is a cross-sectional view showing one step of the manufacturing method.
Figure 35:
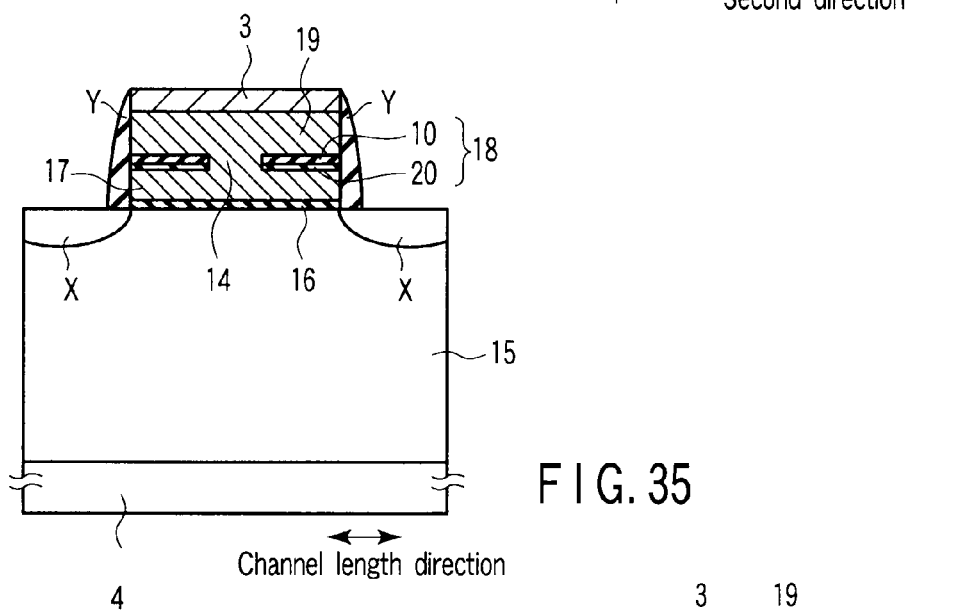
FIG. 35 is a cross-sectional view showing one step of the manufacturing method.
Figure 36:
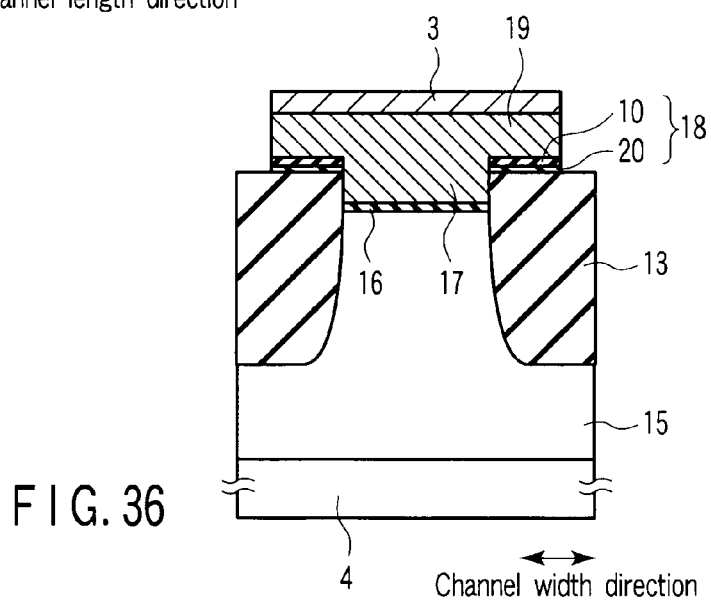
FIG. 36 is a cross-sectional view showing one step of the manufacturing method.
Figure 41:
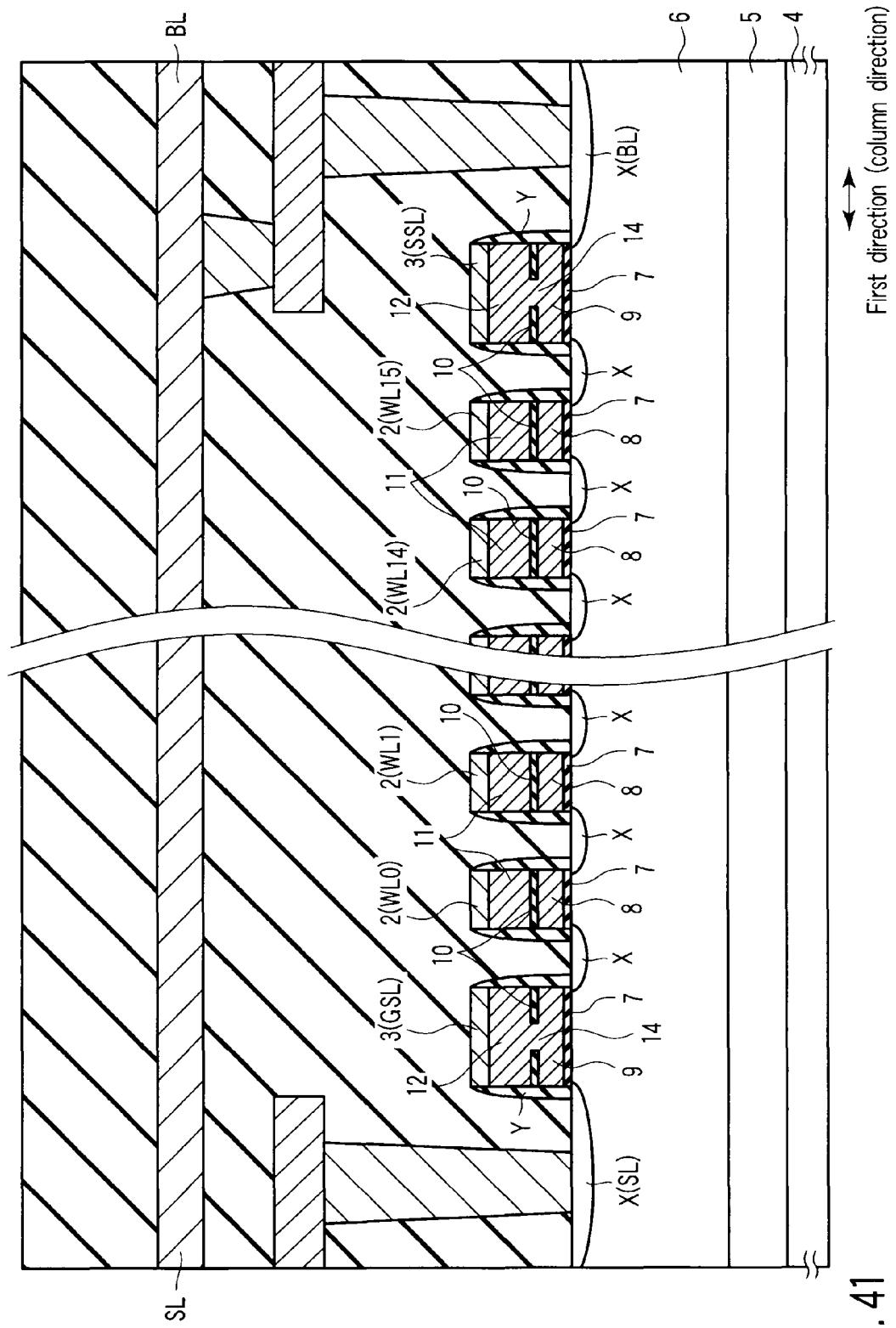
FIG. 41 is a cross-sectional view showing the NAND cell unit.
Figure 44:
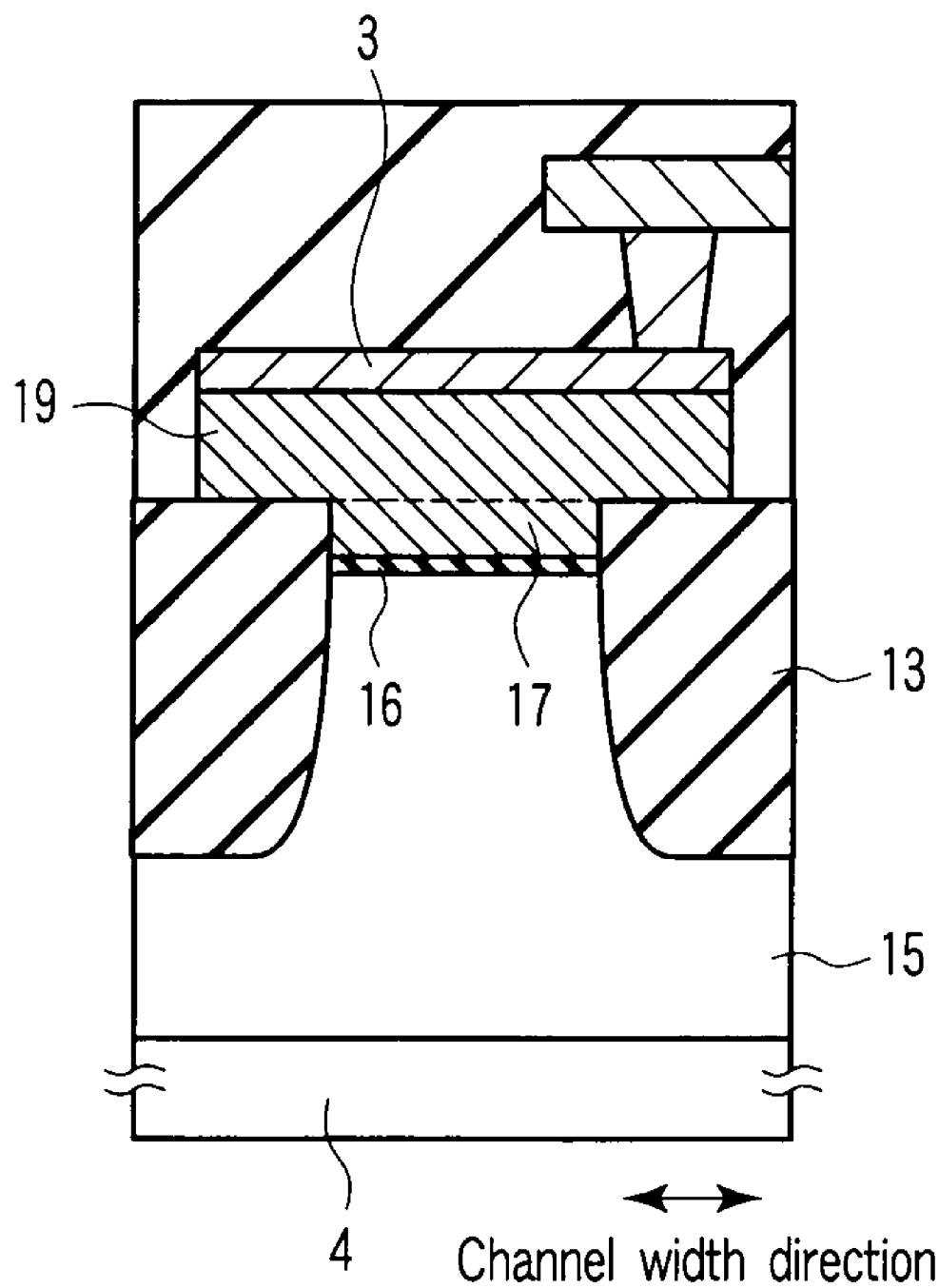
FIG. 44 is a cross-sectional view showing the peripheral transistor.

After trenches formed by the etching are filled with the field isolation insulating film (STI: Shallow Trench Isolation) 13, the resist pattern is removed. As a result, the structure of the memory cell shown in FIGS. 13 and 14 is obtained, and the structure of the peripheral transistor shown in FIGS. 15 and 16 is obtained.

At this step, the thickness of the gate insulating film 16 of the peripheral transistor can be made different from the thickness of the gate insulating film 7 of the memory cell according to applications of the peripheral transistor. In this case, the gate insulating film 7 of the memory cell and the gate insulating film 16 of the peripheral transistor are formed separately.

The trenches which filled the field isolation insulating film 13 can be formed also by using a hard mask (for example, silicon nitride film) patterned by resist pattern as an etching mask according to RIE.

As shown in FIGS. 17 to 20, the blocking insulating film 20 having a thickness of 1 nm to 20 nm is formed on the conductive films 8' and 17' and the field isolation insulating film 13.

The blocking insulating film 20 should block the diffusion of carbon atoms and nitrogen atoms which causes fixed charges in the semiconductor substrate 4. For this reason, an HTO film (silicon oxide film) having extreme precision is used as the blocking insulating film.

As shown in FIGS. 21 to 24, a photoresist film (resist pattern) 21 which covers the peripheral transistor but does not cover the memory cell area is formed.

Using the photoresist film 21 as an etching mask, the blocking insulating film 20 which is present in the memory cell area is removed by etching gas or chemical solution. As a result, as shown in FIGS. 25 to 28, the blocking insulating film 20 remains in the peripheral transistor area.

The etching gas or chemical solution which can sufficiently secure etching selectivity between the conductive film 8' and the blocking insulating film 20 in the memory cell area is used.

As a result, solely the blocking insulating film 20 can be etched with the conductive film 8' being left. At this time, the field isolation insulating film 13 in the memory cell area can be etched back.

Due to this etching-back, the upper surface of the field isolation insulating film becomes lower than the upper surface of the conductive film 8' in the memory cell area, so that the side surface of the conductive film 8' is partially exposed.

Thereafter, the photoresist film 21 which covered the peripheral transistor area is removed.

As shown in FIGS. 29 to 32, the inter-electrode insulating film (dielectric film) 10 is formed on the conductive film 8', the blocking insulating film 20, and the field isolation insulating film 13.

The inter-electrode insulating film 10 is composed of a high-permittivity material or has a laminated structure including this material.

In the memory cell area, the inter-electrode insulating film 10 covers the upper surface and a part of the side surface of the conductive film 8'.

In the peripheral transistor area, the inter-electrode insulating film 10 and the blocking insulating film 20 constitute the inter-electrode insulating film (dielectric film) 18.

Openings are formed partially on the inter-electrode insulating film 18.

As shown in FIGS. 33 to 36, a conductive polysilicon film and a metallic silicide film (for example, WSi, NiSi, MoSi, TiSi, CoSi) are formed on the inter-electrode insulating films 10 and 18 by the CVD method or a sputtering method.

Thereafter, the metallic silicide film and the conductive polysilicon film are etched by using the resist pattern or the hard mask as the etching mask according to RIE. Further, the inter-electrode insulating film, the conductive film and the gate insulating film under them are sequentially etched, and gates of the memory cell and the peripheral transistor are patterned.

As a result, the floating gate electrode 8 and the control gate electrodes (word lines) 2 and 11 of the memory cell are formed in the memory cell area. The lower electrode 9 and the upper electrodes (select gate lines) 3 and 12 of the select gate transistor are formed.

The lower electrode 17 and the upper electrodes 3 and 19 of the peripheral transistor are formed in the peripheral transistor area. The lower electrode 17 and the upper electrodes 3 and 19 are electrically connected via the opening of the inter-electrode insulating film 18.

An n-type impurity (phosphorus or arsenic) is injected into the p-type well regions 6 and 15 by using the control gate electrodes 2 and 11 of the memory cell, the upper electrodes 3 and 12 of the select gate transistor and the upper electrodes 3 and 19 of the peripheral transistor as the masks according to an ion implantation method.

A side wall insulating film Y is formed on the side walls of the control gate electrodes 2 and 11 and the floating gate electrode 8 in the memory cell, the side walls of the upper electrodes 3 and 12 and the lower electrode 9 in the select gate transistor, and the side walls of the upper electrodes 3 and 19 and the lower electrode 17 in the peripheral transistor.

An n-type impurity (phosphorus or arsenic) is injected into the p-type well regions 6 and 15 by using the side wall insulating film Y, the control gate electrodes 2 and 11 of the memory cell, the upper electrodes 3 and 12 of the select gate transistor, and the upper electrodes 3 and 19 of the peripheral transistor as the masks according to the ion implantation method. As a result, n-type diffusion layers X, X(SL) and X(BL) are formed.

As shown in FIGS. 37 to 40, the inter-electrode insulating film which covers the memory cell, the select gate transistor and the peripheral transistor, is formed.

The n-type diffusion layer (source diffusion layer) X (SL) of the NAND cell unit is connected to the source line SL, and the n-type diffusion layer (drain diffusion layer) X (BL) is connected to the bit line BL. The n-type diffusion layer X and the upper electrodes 3 and 19 of the peripheral transistor are connected to electrodes.

With the above steps, the memory cell and the peripheral transistor according to the present invention are completed.

C. Conclusion

According to the first embodiment, the inter-electrode insulating film of the peripheral transistor includes the blocking insulating film so as to have a structure different from that of the inter-electrode insulating film of the memory cell. As a result, an off-leak current caused by accumulation of the impurities such as carbon atoms and nitrogen atoms on an interface between the semiconductor substrate and the field isolation insulating film can be suppressed.

(2) Second Embodiment

FIGS. 41 to 44 show the nonvolatile semiconductor memory device according to a second embodiment.

The second embodiment is a modification of the first embodiment.

The structure of the NAND cell unit (the memory cell and the select gate transistor) is the same as that in the first embodiment.

As the inter-electrode insulating film 10, therefore, the single-layered structure of FIG. 5, the three-layered structure of FIG. 6, and the five-layered structure of FIG. 7 can be adopted.

The second embodiment is different from the first embodiment in the structure of the peripheral transistor. Specifically, the inter-electrode insulating film is not present between the lower electrode 17 and the upper electrodes 3 and 19 of the peripheral transistor. The other parts of the structure are the same as those in the first embodiment. That is, all upper surface of the lower electrode 17 is contact with the lower surface of the upper electrodes 3 and 19. And no inter-electrode insulating film is provided on the field isolation insulating film 13. Further more, the lower surface of the upper electrode 19 continuously contacts with an area from the side surface of the lower electrode 17 to the side surface and the upper surface of the field isolation insulating film 13.

Therefore, the lower electrode 17 and the upper electrodes 3 and 19 are collectively considered as the gate electrodes of the peripheral transistor. That is, a high-permittivity material is not present just above, just below and inside the gate electrode.

A high-permittivity material which causes fixed charges in the semiconductor substrate is not used as a component of the peripheral transistor, thereby preventing deterioration in performance of the peripheral transistor.

(3) Third Embodiment

The third embodiment is an application of the first embodiment and includes all the characteristics of the first embodiment. In the third embodiment, availability of the present invention is studied separately for the low-voltage peripheral transistor and the high-voltage peripheral transistor.

A. Structure

Figure 45:
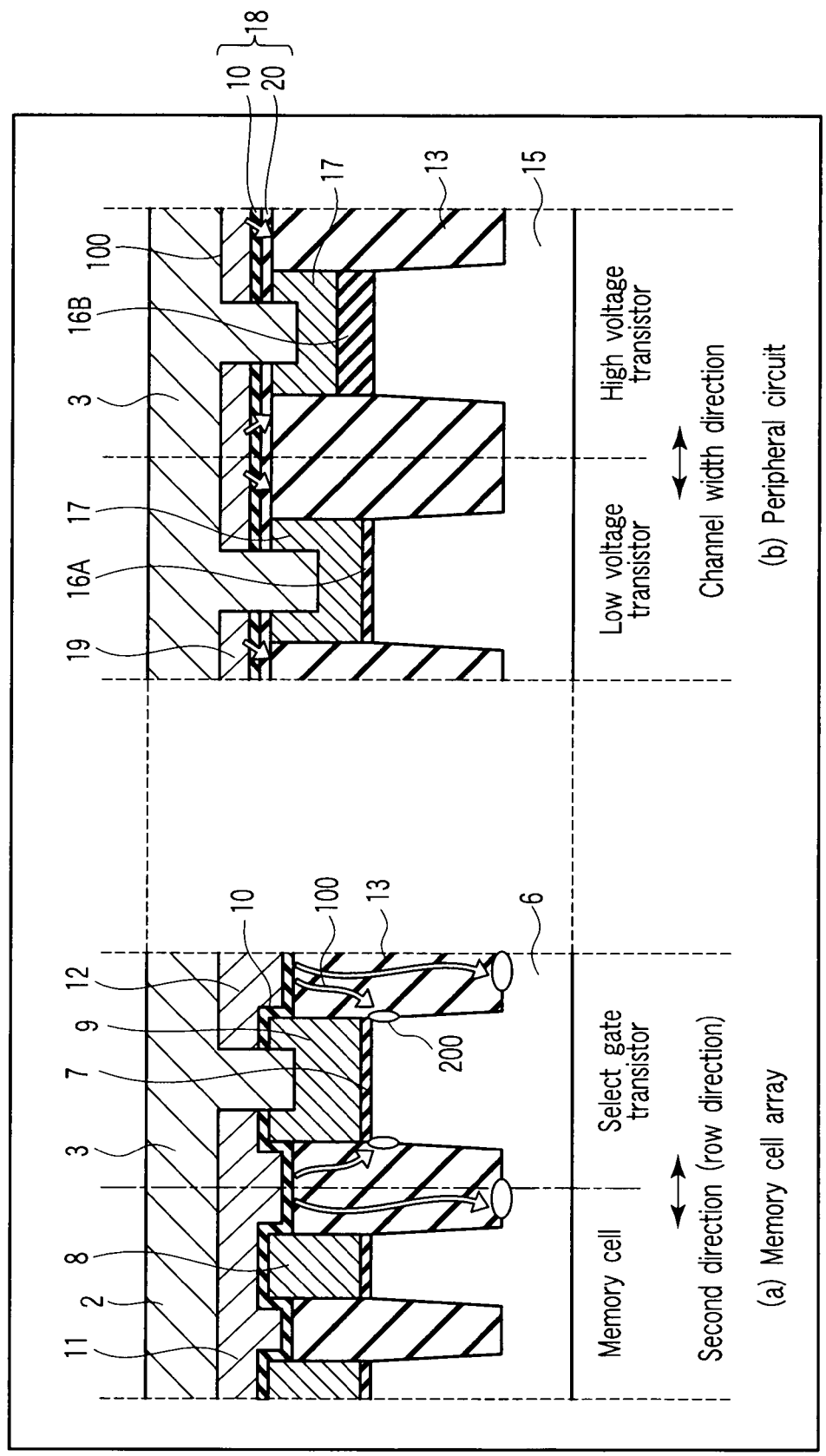
FIG. 45 is a cross-sectional view showing the memory cell and the peripheral transistor.

FIG. 45 shows the nonvolatile semiconductor memory device according to the third embodiment.

The structures of the memory cell and the select gate transistor in the memory cell array are the same as those in the first embodiment except for the following point.

An opening is formed on the upper electrode (for example, conductive polysilicon film) 12 and the inter-electrode insulating film 10 of the select gate transistor. The metallic silicide film 3 is connected directly to the lower electrode (for example, conductive polysilicon film) 9 via the opening.

A low-voltage transistor and a high-voltage transistor are present in the peripheral circuit.

The structure of the low-voltage transistor in the peripheral circuit is the same as that of the peripheral transistor in the first embodiment except for the following point.

An opening is formed on the upper electrode (for example, conductive polysilicon film) 19 and the inter-electrode insulating film 18 of the low-voltage transistor. The metallic silicide film 3 is connected directly to the lower electrode (for example, conductive polysilicon film) 17 via the opening.

The gate insulating film of the high-voltage transistor in the peripheral circuit has a thickness different from that of the low-voltage transistor. That is, the gate insulating film 16B of the high-voltage transistor is thicker than the gate insulating film 16A of the low-voltage transistor.

The thickness of the gate insulating film 16A of the low-voltage transistor is set within the range of 5 nm to 15 nm, for example. The thickness of the gate insulating film 16B in the high-voltage transistor is set within the range of 20 nm to 60 nm, for example.

A voltage to be applied to the gate insulating film 16B of the high-voltage transistor is higher than a voltage to be applied to the gate insulating film 16A of the low-voltage transistor.

In the peripheral circuit, the upper surface of the field isolation insulating film 13 is flush with the upper surface of the lower electrode 17.

This is because, since the inter-electrode insulating film 18 on the field isolation insulating film 13 is far from the p-type well region (semiconductor substrate) 15, the upper electrodes 3 and 19 on the field isolation insulating film 13 are also far from the p-type well region 15. As a result, generation of a parasitic transistor can be prevented, and a field isolation breakdown voltage can be improved.

The components of the third embodiment corresponding to those of the first embodiment are denoted by the same numerals as those in the first embodiment.

In the third embodiment, similarly to the first embodiment, a high-permittivity material is used for the inter-electrode insulating film 10. In this case, the carbon atoms in the gas to be used for deposition of the high-permittivity material diffuse as shown by an arrow 100. When a plasma nitride film is used for the inter-electrode insulating film 10, nitrogen radicals diffuse similarly.

When such impurities reach a bottom portion 200 of the field isolation insulating film 13, the generation of a parasitic transistor in the area of the field isolation insulating film 13 is fostered. Particularly, an off-leak of the peripheral transistor increases, and thus the field isolation breakdown voltage is lowered.

The low-voltage transistor and the high-voltage transistor in the peripheral circuit have the blocking insulating film 20 which prevents the diffusion of impurities such as carbon atoms and nitrogen radicals.

For this reason, as shown by an arrow in FIG. 45B, the impurities do not reach the bottom portion of the field isolation insulating film 13, and thus the increase in the off-leak current is suppressed.

When the inter-electrode insulating film of the memory cell includes the blocking insulating film, the coupling ratio is lowered. For this reason, the blocking film is not provided into the inter-electrode insulating film of the memory cell.

The select gate transistor may or may not include the blocking insulating film.

In this embodiment, the inter-electrode insulating film of the select gate transistor does not include the blocking insulating film in order to reduce an increasing amount of the off-leak current of the select gate transistor due to impurity diffusion and to reduce the process cost.

B. Manufacturing Method

A method for manufacturing the memory cell and the peripheral transistor in the third embodiment will be described.

The manufacturing method which obtains the structure of the present invention without changing parameters such as the height of the floating gate electrode and a drop amount of the inter-electrode insulating film is proposed below.

According to this manufacturing method, the memory deices having excellent characteristics can be realized by the same specification as that of conventional techniques.

Figure 46:
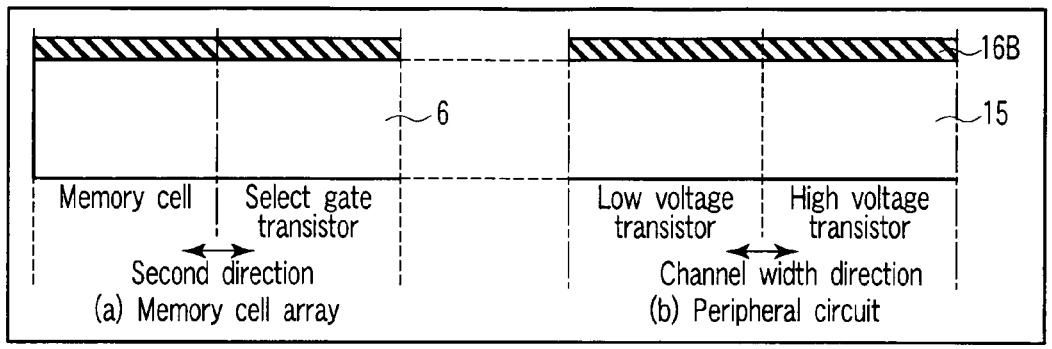
FIG. 46 is a cross-sectional view showing a step of the manufacturing method.

As shown in FIG. 46, the gate insulating film (silicon oxide film) 16B with a thickness of 20 nm to 60 nm is formed on the p-type well regions 6 and 15 according to the thermal oxidation method.

The p-type well regions 6 and 15 can be n-type well regions. The gate insulating film 16B can be formed not on the well region but on the semiconductor substrate.

Figure 47:
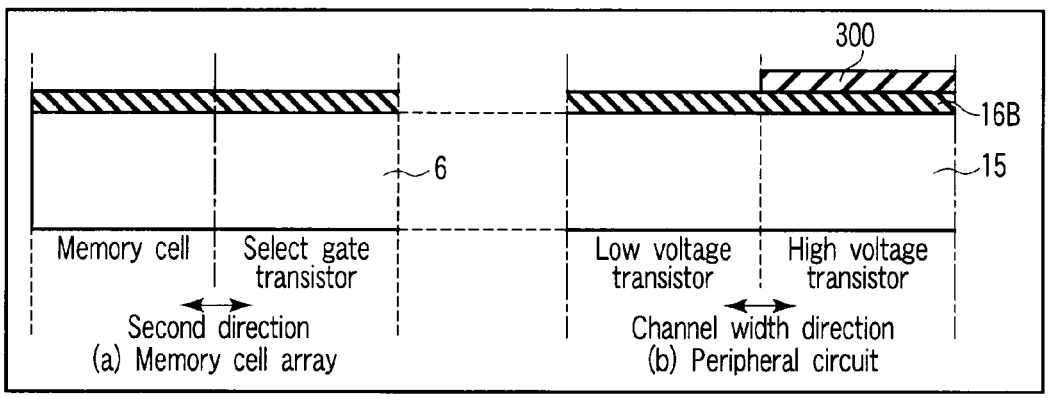
FIG. 47 is a cross-sectional view showing a step of the manufacturing method.

As shown in FIG. 47, a resist pattern 300 is formed according to PEP (Photo Engraving Process). The resist pattern 300 covers the high-voltage transistor area in the peripheral circuit and has openings on portions other than the high-voltage transistor area.

Figure 48:
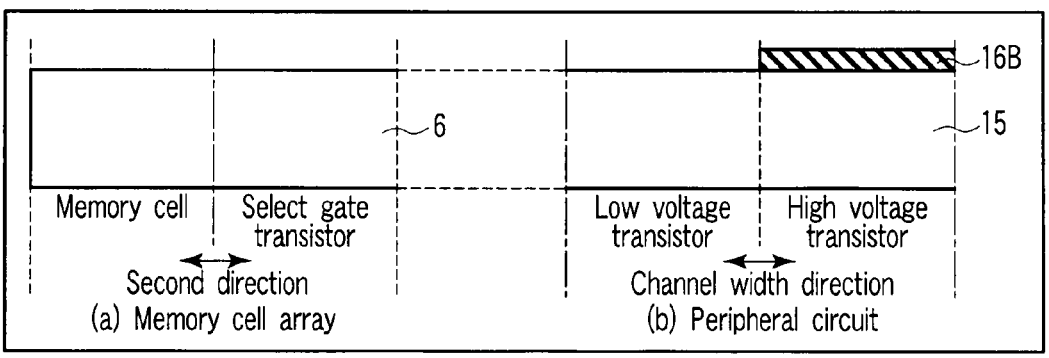
FIG. 48 is a cross-sectional view showing a step of the manufacturing method.

The gate insulating film 16B which is present on the portions other than the high-voltage transistor area is removed by using the resist pattern 300 as a mask and using a chemical solution, and the resist pattern 300 is removed. As a result, as shown in FIG. 48, the gate insulating film 16B remains only on the high-voltage transistor area.

Figure 49:
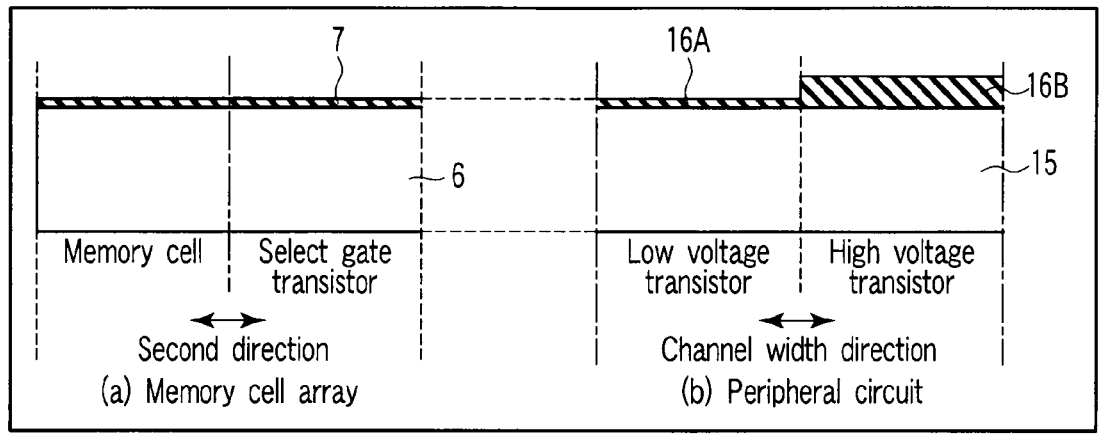
FIG. 49 is a cross-sectional view showing a step of the manufacturing method.

As shown in FIG. 49, the gate insulating films 7 and 16A with a thickness of 5 nm to 15 nm are again formed on the p-well regions 6 and 15 according to the thermal oxidation method.

As a result, the gate insulating films 7 and 16A with thickness of 5 nm to 15 nm are formed on the memory cell array area and the low-voltage transistor area, and the gate insulating film 16B with a thickness of 20 nm to 60 nm is formed on the high-voltage transistor area.

Figure 50:
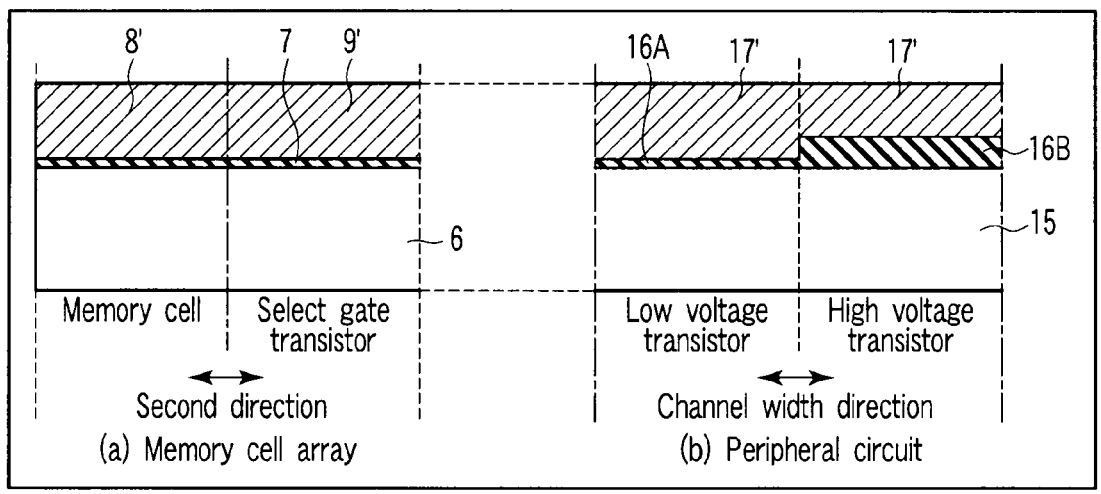
FIG. 50 is a cross-sectional view showing a step of the manufacturing method.

Then, as shown in FIG. 50, the conductive films (for example, conductive polysilicon films) 8', 9' and 17' are formed on the gate insulating films 7, 16A and 16B according to the CVD method.

Figure 51:
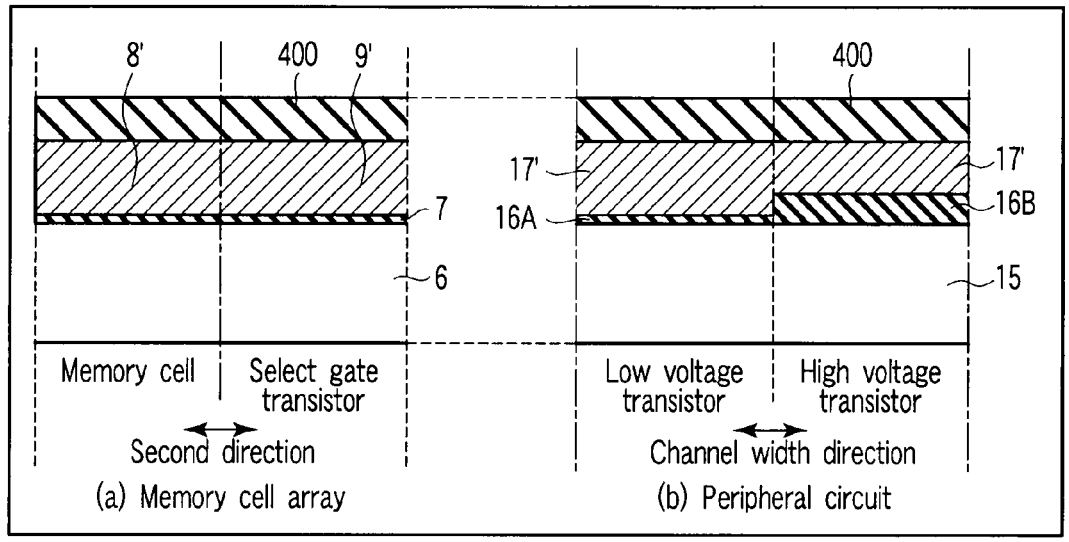
FIG. 51 is a cross-sectional view showing a step of the manufacturing method.

Subsequently, as shown in FIG. 51, an insulating film (for example, silicon nitride film) 400 as a hard mask is formed on the conductive films 8', 9' and 17' according to the CVD method.

Figure 52:
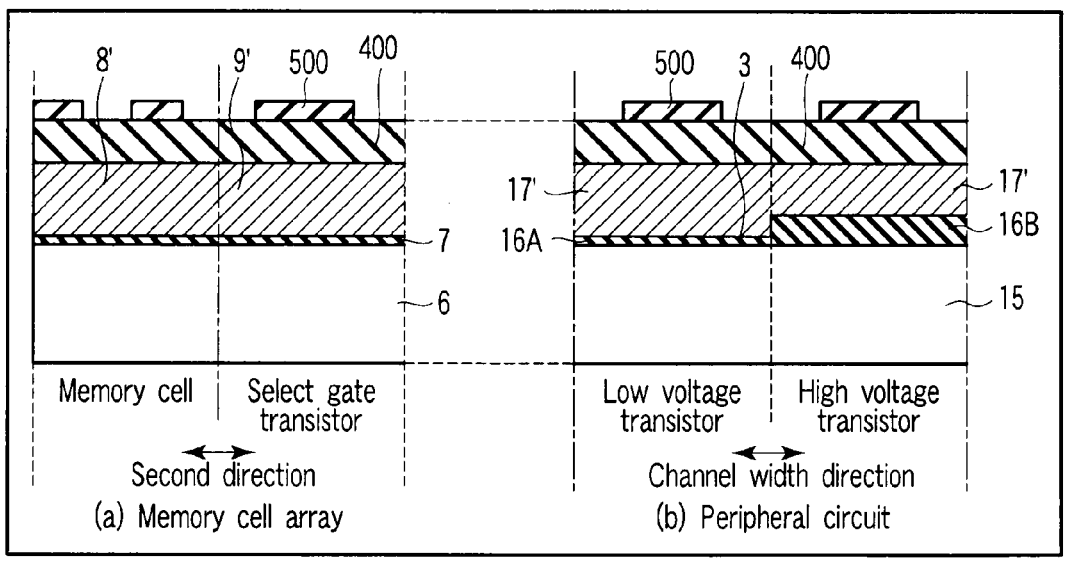
FIG. 52 is a cross-sectional view showing a step of the manufacturing method.

As shown in FIG. 52, a resist pattern 500 is formed on the insulating film 400 according to PEP. The insulating film 400 is etched by using the resist pattern 500 as the etching mask according to RIE, so that the hard mask made of the insulating film 400 is formed.

Thereafter, the resist pattern 500 is removed.

Figure 53:
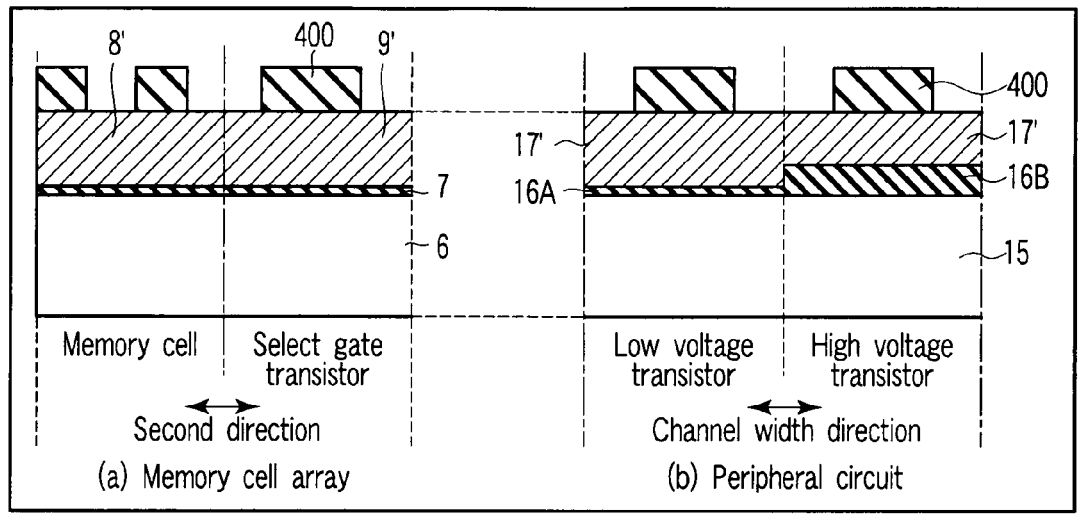
FIG. 53 is a cross-sectional view showing a step of the manufacturing method.
Figure 54:
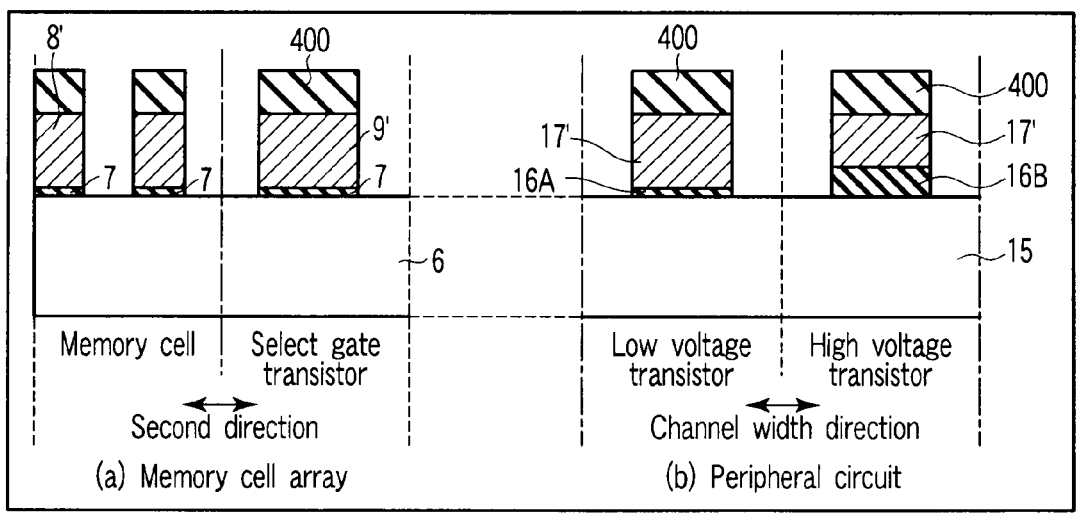
FIG. 54 is a cross-sectional view showing a step of the manufacturing method.

As shown in FIG. 53, the insulating film 400 as the hard mask is used as an etching mask, and the conductive films 8', 9' and 17' and the gate insulating films 7, 16A and 16B are sequentially etched according to RIE. As a result, a structure shown in FIG. 54 is obtained.

As shown in FIG. 55, when the p-type well regions (semiconductor substrates) 6 and 15 are etched by using the insulating film 400 as the etching mask according to RIE, trenches for field isolation are formed.

Then, as shown in FIG. 56, the field isolation insulating film (for example, silicon oxide film) 13 which fills the trenches completely is formed on the insulating film 400 according to the CVD method.

As shown in FIG. 57, the field isolation insulating film 13 is polished according to a CMP (Chemical Mechanical Polishing) method until the upper surface of the field isolation insulating film 13 is approximately flush with the upper surface of the insulating film 400.

As shown in FIG. 58, the position of the upper surface of the field isolation insulating film 13 is adjusted.

In this embodiment, the field isolation insulating film 13 is further etched until its surface is approximately flush with the upper surfaces of the conductive films 8', 9' and 17'.

Figure 59:
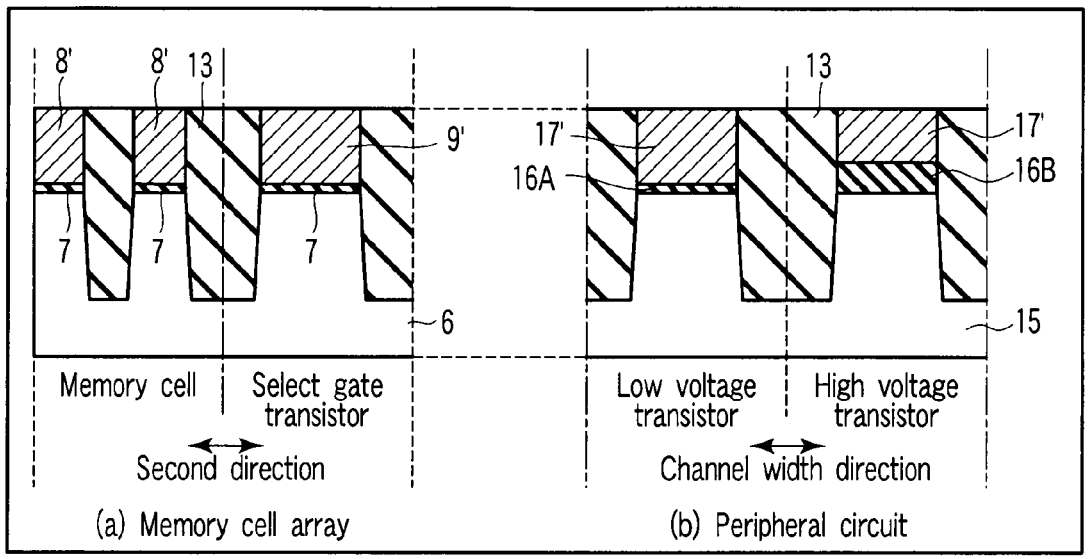
FIG. 59 is a cross-sectional view showing a step of the manufacturing method.

Thereafter, when the insulating film 400 as the hard mask is removed, a structure shown in FIG. 59 is obtained.

Figure 60:
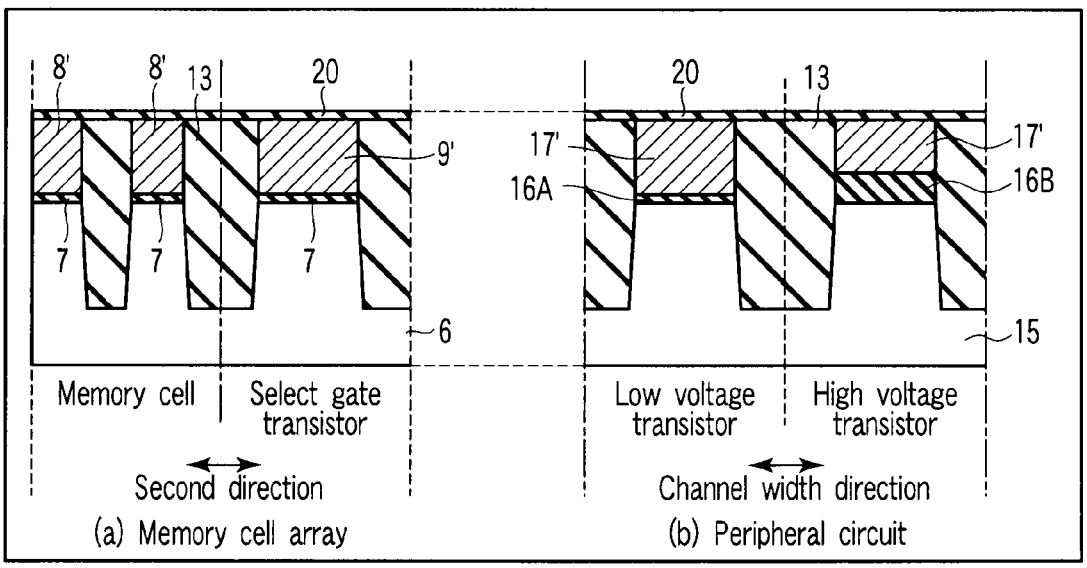
FIG. 60 is a cross-sectional view showing a step of the manufacturing method.

Then, as shown in FIG. 60, the blocking insulating film 20 is formed on the conductive films 8', 9' and 17' and the field isolation insulating film 13 according to the CVD method.

The blocking insulating film 20 is composed of a material which prevents diffusion of impurities and which does not become a source of impurity. Embodiments of such a material include a precise silicon oxide film represented by an HTO (High Temperature Oxide) film and a silicon nitride film formed by the CVD method.

A lower limit of the thickness of the blocking insulating film 20 is 5 nm, from the viewpoint of the prevention of impurity diffusion. Its upper limit is ((dFG−20)/3) nm for the HTO film, and ((dFG−20)/2) nm for the silicon nitride film. dFG is a thickness of the conductive polysilicon film 8 as the charge storage layer of the memory cell.

The reason why the upper limit of the thickness of the blocking insulating film 20 is set will be described later.

Figure 61:
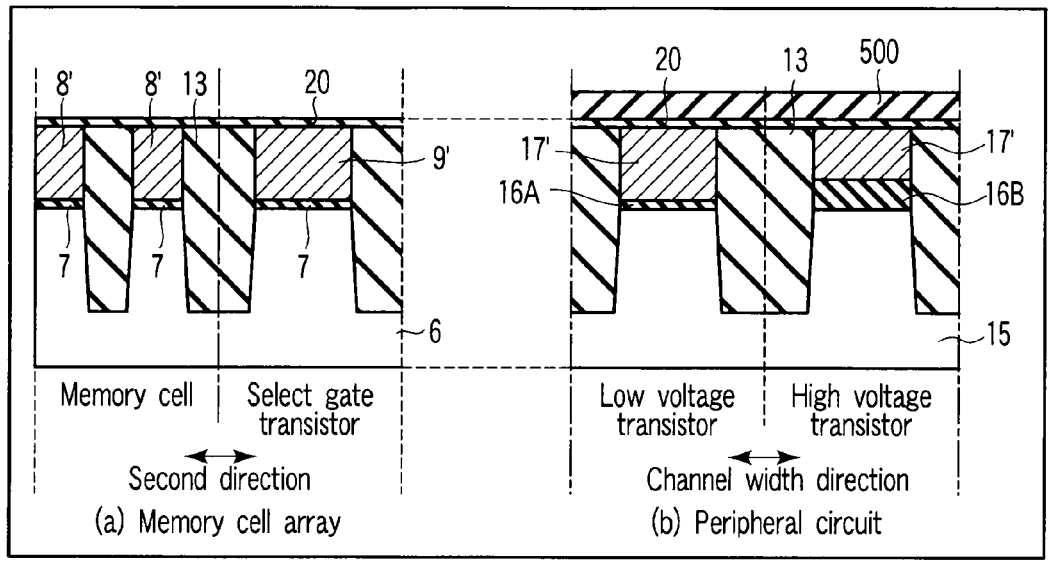
FIG. 61 is a cross-sectional view showing a step of the manufacturing method.

As shown in FIG. 61, a resist pattern 500 which covers the peripheral circuit area and has an opening in the memory cell array area is formed by PEP.

Figure 62:
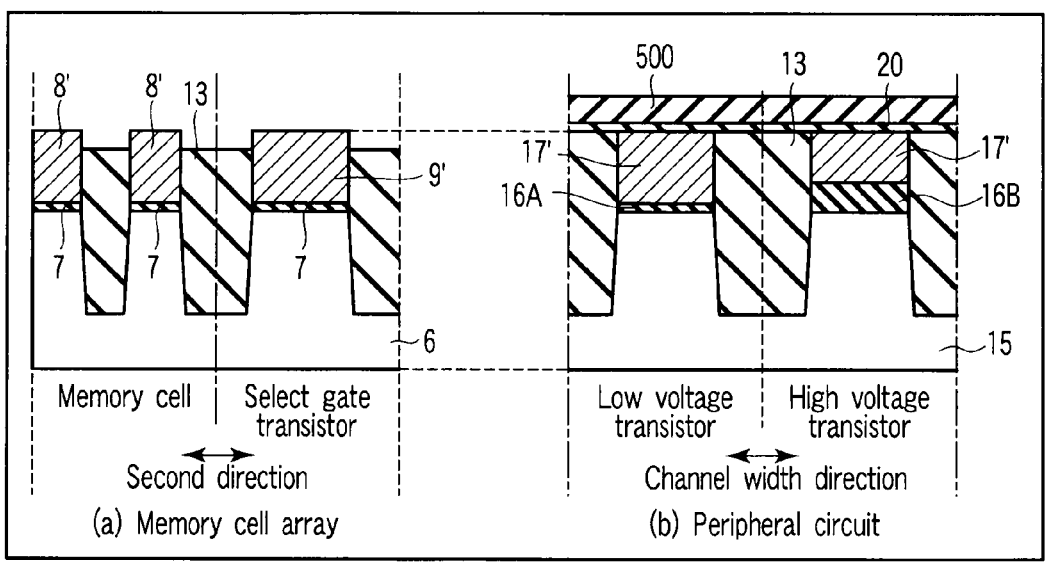
FIG. 62 is a cross-sectional view showing a step of the manufacturing method.

As shown in FIG. 62, the blocking insulating film 20 in the memory cell array area is selectively etched by using the resist pattern 500 as the etching mask according to RIE.

At the time of this etching, the field isolation insulating film 13 to be a substrate is also etched.

In the memory cell array area, at this stage, the upper surface of the field isolation insulating film 13 is adjusted so as to be lower than the upper surfaces of the conductive films 8' and 9'.

As a result, the side surfaces of the conductive films 8' and 9' are partially exposed.

Thereafter, the resist pattern 500 is removed.

Figure 63:
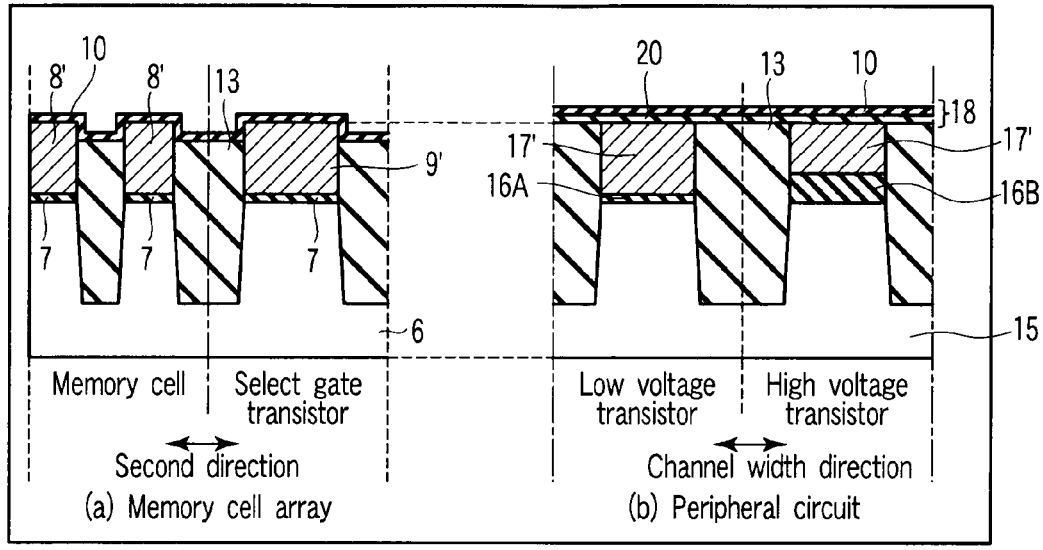
FIG. 63 is a cross-sectional view showing a step of the manufacturing method.

Next, as shown in FIG. 63, the inter-electrode insulating film 10 is formed on the conductive films 8', 9' and 17' and the field isolation insulating film 13. The inter-electrode insulating film 10 has the single-layered structure shown in FIG. 5, the three-layered structure shown in FIG. 6, or the five-layered structure shown in FIG. 7.

In this case, in the peripheral circuit area, the blocking insulating film 20 and the inter-electrode insulating film 10 form the inter-electrode insulating film 18 of the peripheral transistor.

Figure 64:
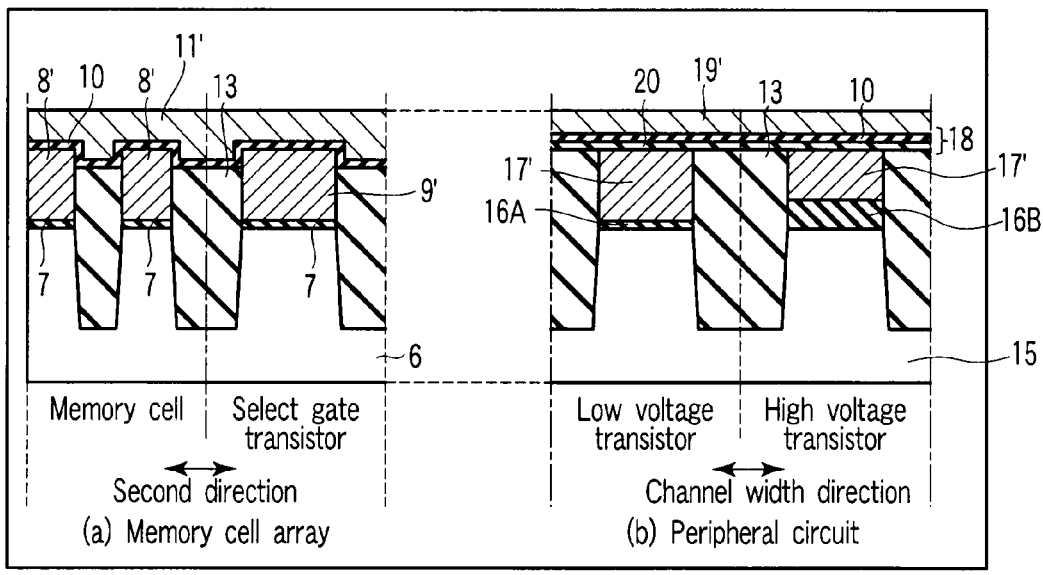
FIG. 64 is a cross-sectional view showing a step of the manufacturing method.

As shown in FIG. 64, the conductive films (for example, conductive polysilicon films) 11' and 19' are formed on the inter-electrode insulating films 10 and 18, respectively, by the CVD method.

Then, as shown in FIG. 65, a resist pattern 600 is formed on the conductive films 11' and 19' by lithography.

The conductive films 11' and 19' and the inter-electrode insulating films 10 and 18 are etched by using the resist pattern 600 as the etching mask according to RIE. When the resist pattern 600 is removed, openings are formed on these films as shown in FIG. 66.

The openings are used for coupling the upper electrodes and the lower electrodes of the select gate transistor, the low-voltage transistor and the high-voltage transistor.

The etching amount is adjusted so that distances between the bottom surfaces of the openings and the upper surfaces of the gate insulating films 7, 16A and 16B become 20 nm or more. When this condition is satisfied, the chemical solution can be prevented from spreading into the gate insulating films 7, 16A and 16B in a cleaning process to be executed later.

Next will be described factors influencing the etching amount.

Since the blocking insulating film 20 is introduced into the peripheral circuit area, the etching amount of the conductive films 8' and 9' increases correspondingly in the memory cell array area.

Also in this case, the upper limit of the thickness of the blocking insulating film 20 for satisfying the above specification (20 nm or more) is formulated.

The upper limit of the thickness of the blocking insulating film 20 is determined by:
  etching selectivity between the conductive films 8' and 9' and the blocking insulating film 20; and
  the thickness of the conductive films 8' and 9'.

When the thickness of the conductive film 8' as the charge storage layer of the memory cell is dFG[nm], the thickness of the blocking insulating film 20 is dBL[nm], and the etching selectivity between the conductive films 8', 9' and 17' and the blocking insulating film 20 is:

$$R = vFG/vBL$$

(where vBL[nm/s] is an etching rate of the blocking insulating film 20, and vFG[nm/s] is an etching rate of the conductive films 8', 9' and 17'),
  time t[s] necessary for opening the blocking insulating film 20 is obtained as follows:

$$t = dBL/vBL \quad (1)$$

On the other hand, in the memory cell array, the thickness of the conductive film 9' at the opening should be set to 20 nm or more.

That is, the following relationship should hold:

$$vFG \times t \leq dFG - 20 \text{ nm} \quad (2)$$

When the formulas (1) and (2) are simultaneously solved for dBL,
  the upper limit which should be satisfied by dBL:

$$dBL \leq (dFG - 20 \text{ nm})/R$$

is determined.

The etching selectivity R changes according to the material constituting the conductive films 8', 9' and 17' and the material constituting the blocking insulating film 20.

When the conductive films 8', 9' and 17' are conductive polysilicon films, when the blocking insulating film 20 is a silicon nitride film, R≈2, and when the blocking insulating film 20 is HTO, R≈3.

Therefore, the thickness of the blocking insulating film 20 falls within the range of:
  for HTO: 5 [nm] ≤ dBL ≤ (dFG−20)/3 [nm]
  for the silicon nitride film:

$$5 \text{ [nm]} \leq dBL \leq (dFG-20)/2 \text{ [nm]}$$

after the lower limit of the thickness (5 nm) is taken into consideration.

Figure 67:
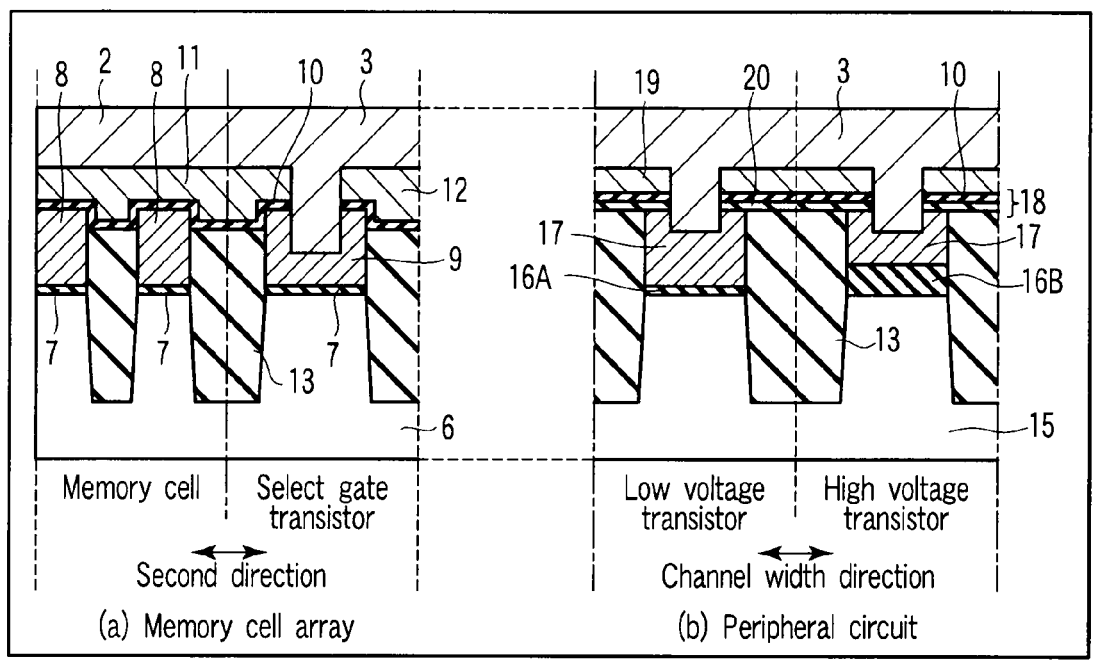
FIG. 67 is a cross-sectional view showing a step of the manufacturing method.

As shown in FIG. 67, after the metallic silicide film is formed, the metallic silicide film, the conductive film, the inter-electrode insulating film, the conductive film and the gate insulating film are patterned so that a gate is patterned.

As a result, in the memory cell area, the floating gate electrode 8 and the control gate electrodes (word lines) 2 and 11 of the memory cell are formed, and the lower electrode 9 and the upper electrodes (select gate lines) 3 and 12 of the select gate transistor are formed.

In the peripheral transistor area, the lower electrode 17 and the upper electrodes 3 and 19 of the low-voltage transistor and the high-voltage transistor are formed. The lower electrode 17 and the upper electrodes 3 and 19 are electrically connected via the opening of the inter-electrode insulating film 18.

Thereafter, when a source/drain diffusion layer and an electrode are formed by a publicly-known process, the non-volatile semiconductor memory device of the third embodiment is completed.

C. Conclusion

According to the third embodiment, the following effects can be obtained.

The formation of the blocking insulating film prevents diffusion of impurities to the bottom portion and the side portion of the field isolation insulating film, and the increase in the off-leak current of the peripheral transistor due to the impurities and the reduction in the field isolation breakdown voltage are suppressed.

For the HTO film, the thickness dBL of the blocking insulating film falls within the range of 5 nm≦dBL≦(dFG−20)/3 nm. For the silicon nitride film, the thickness falls within the range of 5 nm≦dBL≦(dFG−20)/2 nm. As a result, the diffusion of the impurities at the time of forming the inter-electrode insulating film is prevented, and an opening process on the inter-electrode insulating film in the memory cell array area and an opening process on the inter-electrode insulating film and the blocking insulating film in the peripheral circuit area are executed at the same step so that the process cost is reduced.

The blocking insulating film is prevented from remaining in the select gate transistor in the memory cell array area. As a result, the number of manufacturing steps is reduced more than in a case where the blocking insulating film remains in the select gate transistor.

The position of the lower surface of the control gate electrode on the field isolation insulating film in the peripheral circuit area is made to be higher than the position of the upper surface of the floating gate electrode on the element area (active area). As a result, the field isolation breakdown voltage is improved.

As to the increase in the number of the manufacturing steps, only a depositing step for the blocking insulating film is added, and this additional step solves the problem of deterioration of peripheral transistor characteristics due to impurities.

(4) Fourth Embodiment

A. Structure

FIG. 68 shows the nonvolatile semiconductor memory device according to a fourth embodiment.

The fourth embodiment is a modification of the third embodiment.

The structure of the NAND cell unit (memory cell and select gate transistor) is the same as that in the first embodiment.

Therefore, the single-layered structure in FIG. 5, the three-layered structure in FIG. 6 and the five-layered structure in FIG. 7 can be adopted as the inter-electrode insulating film 10.

The fourth embodiment is different from the third embodiment in the structure of the peripheral transistor. Specifically, the inter-electrode insulating film is not present between the lower electrode 17 and the upper electrodes 3 and 19 of the peripheral transistor. The other parts of the structure are the same as those in the third embodiment. That is, all upper surface of the lower electrode 17 is contact with the lower surface of the upper electrodes 3 and 19. And no inter-electrode insulating film is provided on the field isolation insulating film 13. Further more, the lower surface of the upper electrode 19 continuously contacts with an area from the side surface of the lower electrode 17 to the side surface and the upper surface of the field isolation insulating film 13.

Therefore, when the lower electrode 17 and the upper electrodes 3 and 19 are collectively considered as the gate electrodes of the peripheral transistor, a high-permittivity material is not present just above, just below and inside the gate electrodes.

A high-permittivity material which causes fixed charges in the semiconductor substrate is not used as a component of the peripheral transistor, thereby preventing deterioration in performance of the peripheral transistor.

B. Manufacturing Method

The method for manufacturing the memory cell and the peripheral transistor according to the fourth embodiment will be described.

Figure 69:
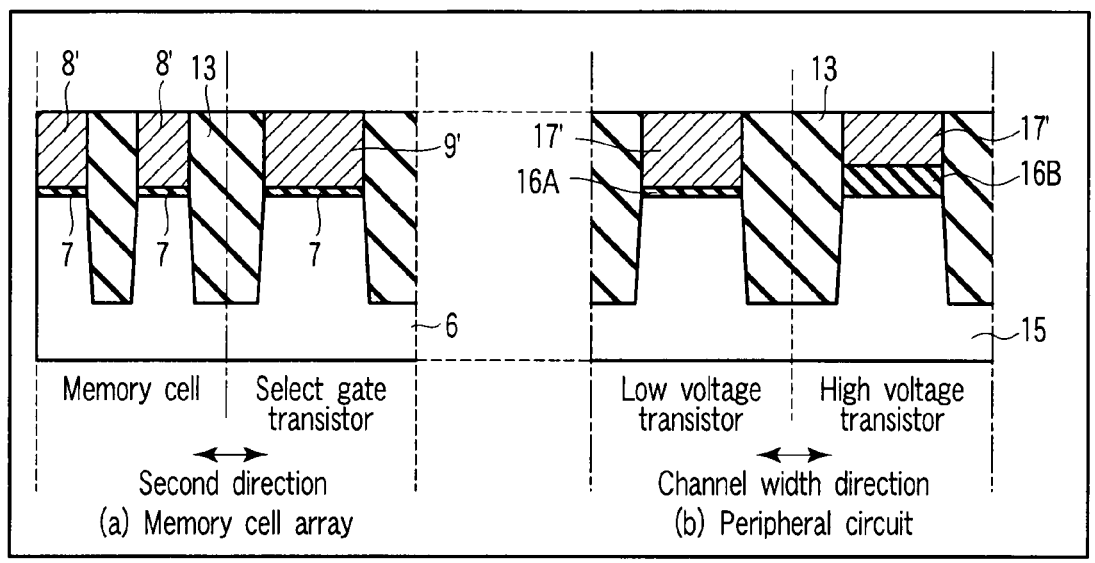
FIG. 69 is a cross-sectional view showing a step of the manufacturing method.

As shown in FIG. 69, the steps up to the step of making the upper surface of the field isolation insulating film 13 approximately flush with the upper surfaces of the conductive films 8', 9' and 17' are executed in a manufacturing method similar to that in the third embodiment (FIGS. 42 to 59).

Figure 70:
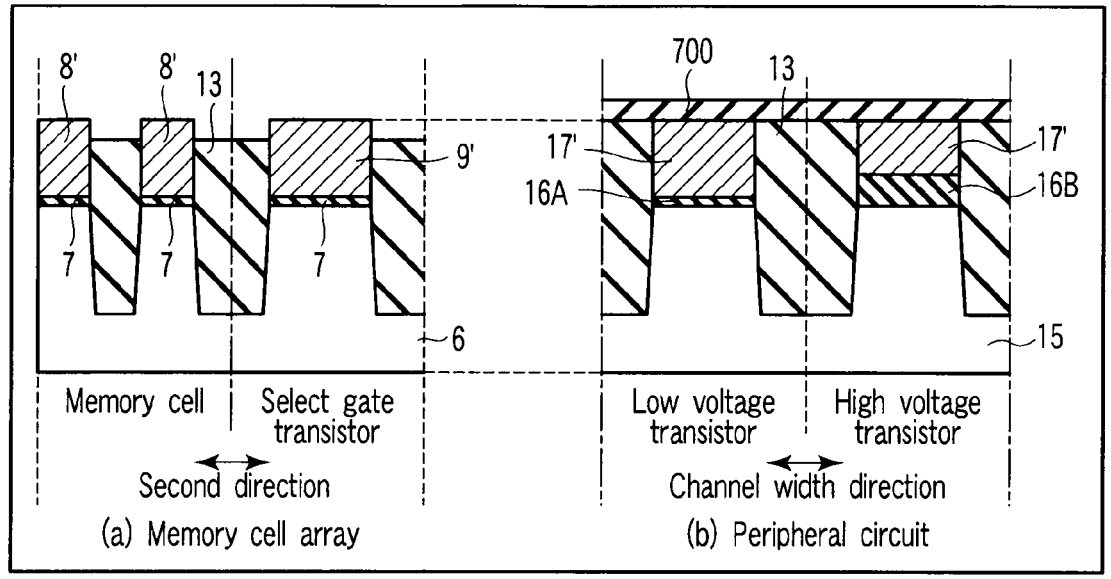
FIG. 70 is a cross-sectional view showing a step of the manufacturing method.

As shown in FIG. 70, the peripheral circuit area is covered with a photoresist film 700, and the field isolation insulating film 13 in the memory cell array area is etched back. As a result, in the memory cell array area, the upper surface of the field isolation insulating film 13 becomes lower than the upper surfaces of the conductive films 8' and 9', and the side surfaces of the conductive films 8' and 9' are partially exposed.

Figure 71:
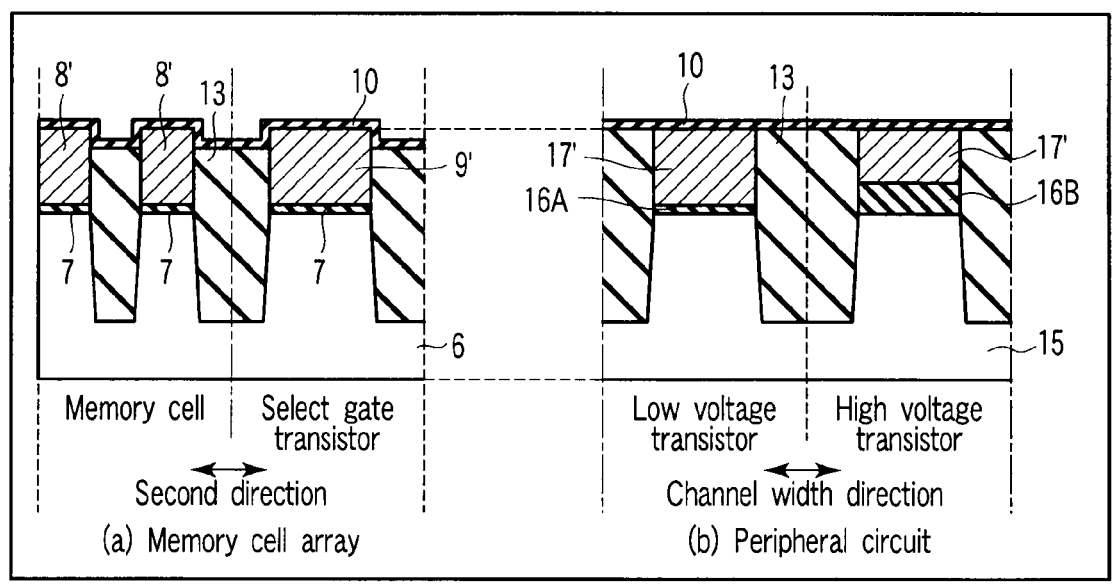
FIG. 71 is a cross-sectional view showing a step of the manufacturing method.

As shown in FIG. 71, the inter-electrode insulating film 10 is formed on the conductive films 8', 9' and 17' and the field isolation insulating film 13 by the CVD method. The inter-electrode insulating film 10 has the single-layered structure shown in FIG. 5, the three-layered structure shown in FIG. 6, or the five-layered structure shown in FIG. 7.

In the memory cell array area, the inter-electrode insulating film 10 covers the upper surfaces and part of the side surfaces of the conductive films 8' and 9'.

Figure 72:
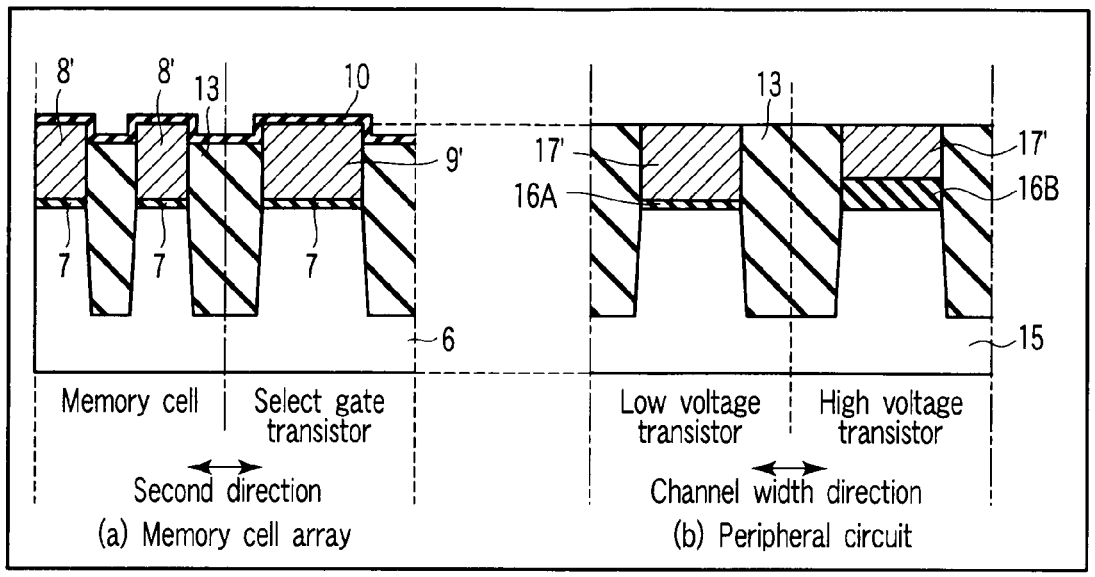
FIG. 72 is a cross-sectional view showing a step of the manufacturing method.

As shown in FIG. 72, the memory cell array area is covered with the photoresist film, and the inter-electrode insulating film 10 which is present in the peripheral circuit area is selectively removed. Thereafter, the photoresist film is also removed.

Figure 73:
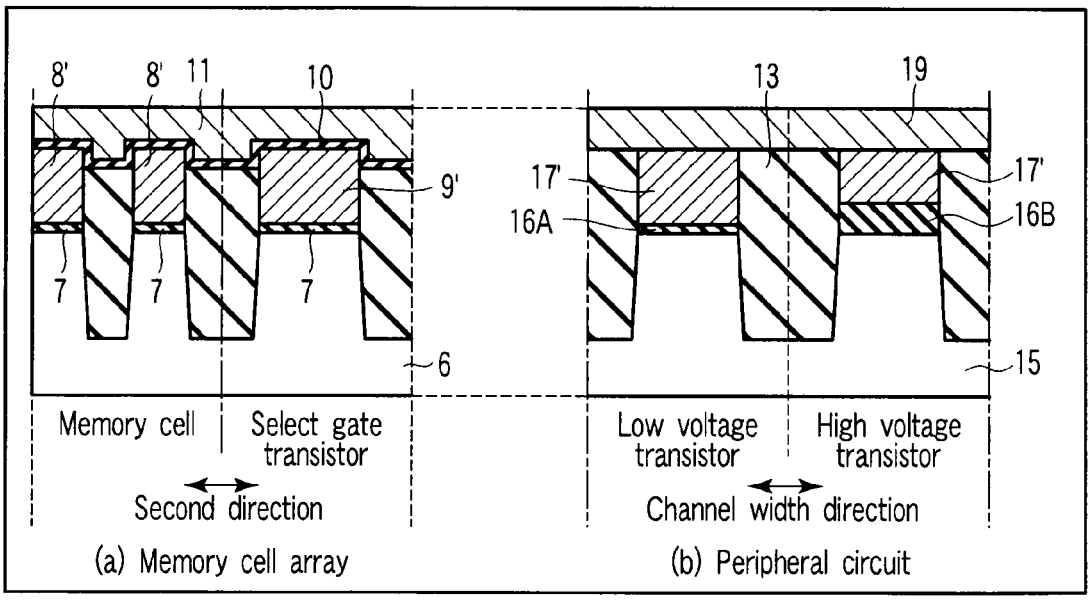
FIG. 73 is a cross-sectional view showing a step of the manufacturing method.

As shown in FIG. 73, the conductive films (for example, conductive polysilicon films) 11' and 19' are formed on the inter-electrode insulating film 10, the conductive film 17' and the inter-electrode insulating film 13 by the CVD method.

Figure 74:
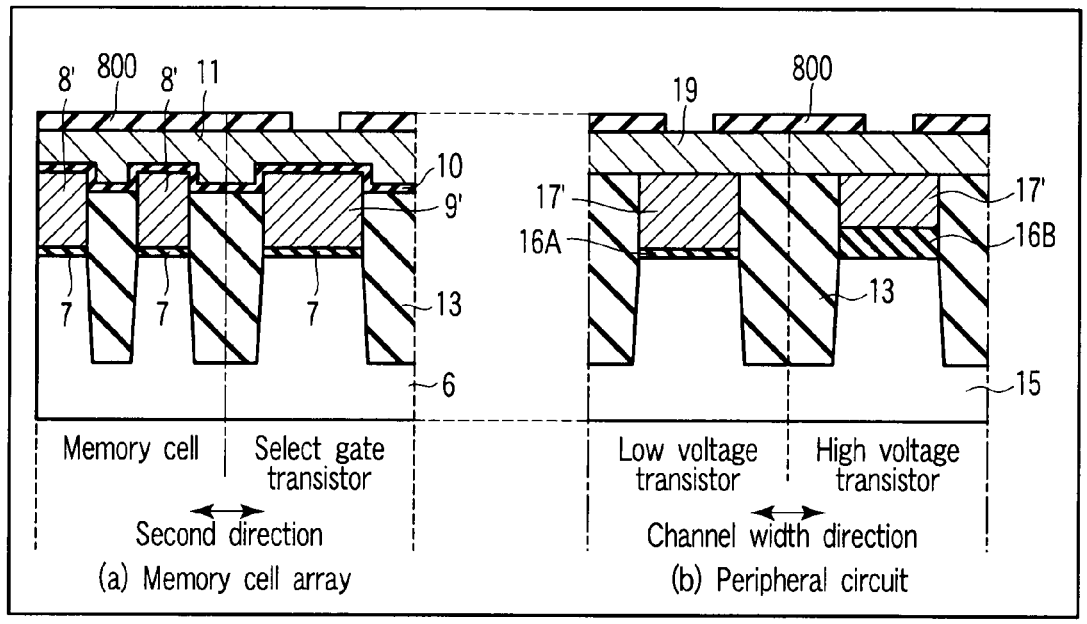
FIG. 74 is a cross-sectional view showing a step of the manufacturing method.

As shown in FIG. 74, a resist pattern 800 is formed on the conductive films 11' and 19' by PEP.

Figure 75:
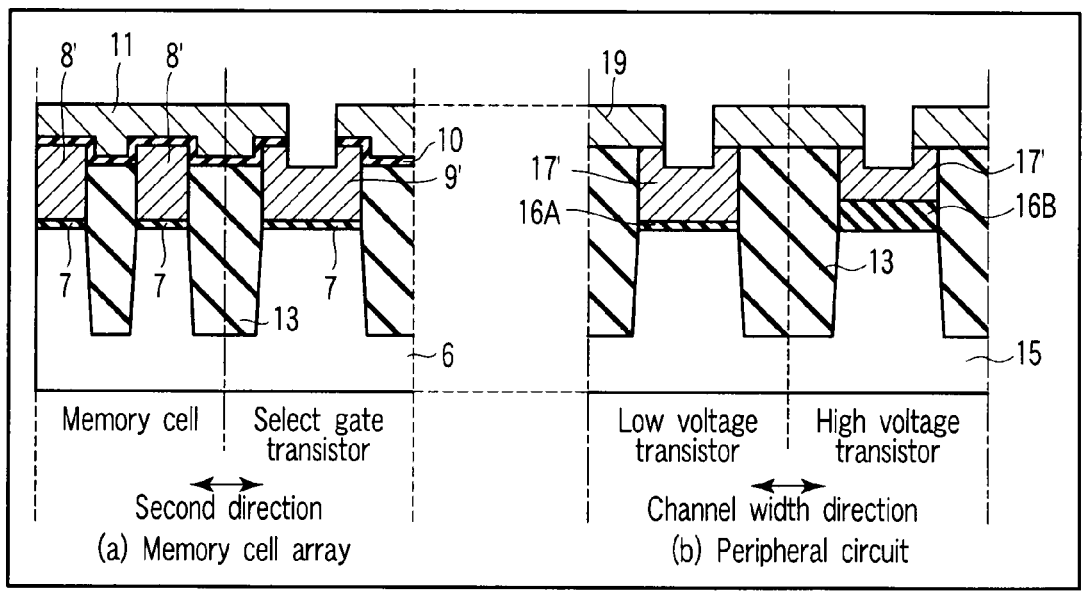
FIG. 75 is a cross-sectional view showing a step of the manufacturing method.

The conductive films 11' and 19' and the inter-electrode insulating film 10 are etched by using the resist pattern 800 as the etching mask according to RIE. When the photoresist pattern 800 is removed, openings are formed on these films as shown in FIG. 75.

The opening is for connecting the upper electrode and the lower electrode of the select gate transistor. Therefore, no opening may be provided in the peripheral transistor area.

Similarly to the third embodiment, the etching amount is adjusted so that distances between the bottom surfaces of the openings and the upper surfaces of the gate insulating films 7, 16A and 16B become 20 nm or more.

Figure 76:
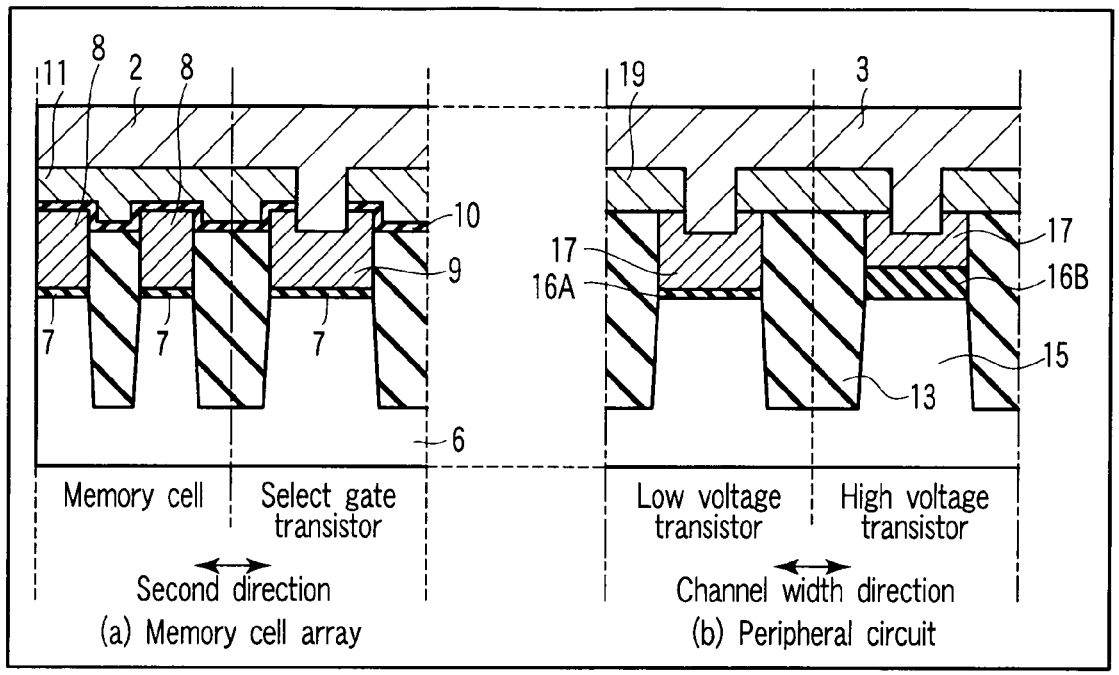
FIG. 76 is a cross-sectional view showing a step of the manufacturing method.

As shown in FIG. 76, after a metallic silicide film is formed, the metallic silicide film, the conductive film, the inter-electrode insulating film, the conductive film and the gate insulating film are patterned, so that the gate is patterned.

As a result, in the memory cell area, the floating gate electrode 8 and the control gate electrodes (word lines) 2 and 11 of the memory cell are formed. The lower electrode 9 and the upper electrodes (select gate lines) 3 and 12 of the select gate transistor are formed.

The lower electrode 17 and the upper electrodes 3 and 19 of the low-voltage transistor and the high-voltage transistor are formed in the peripheral transistor area.

Thereafter, when the source/drain diffusion layer and the electrode are formed by the publicly-known process, the nonvolatile semiconductor memory device according to the fourth embodiment is completed.

C. Conclusion

Also in the fourth embodiment, the effects similar to those in the third embodiment can be obtained.

Particularly, since a high-permittivity material caused a fluctuation in the characteristics of the peripheral transistor is not present in the peripheral circuit area, the nonvolatile semiconductor memory device having high reliability can be realized.

(5) Fifth Embodiment

The first to fourth embodiments refer to the examples of the stack gate type memory cells, but the present invention can be applied to an MONOS type memory cell.

Figure 77:
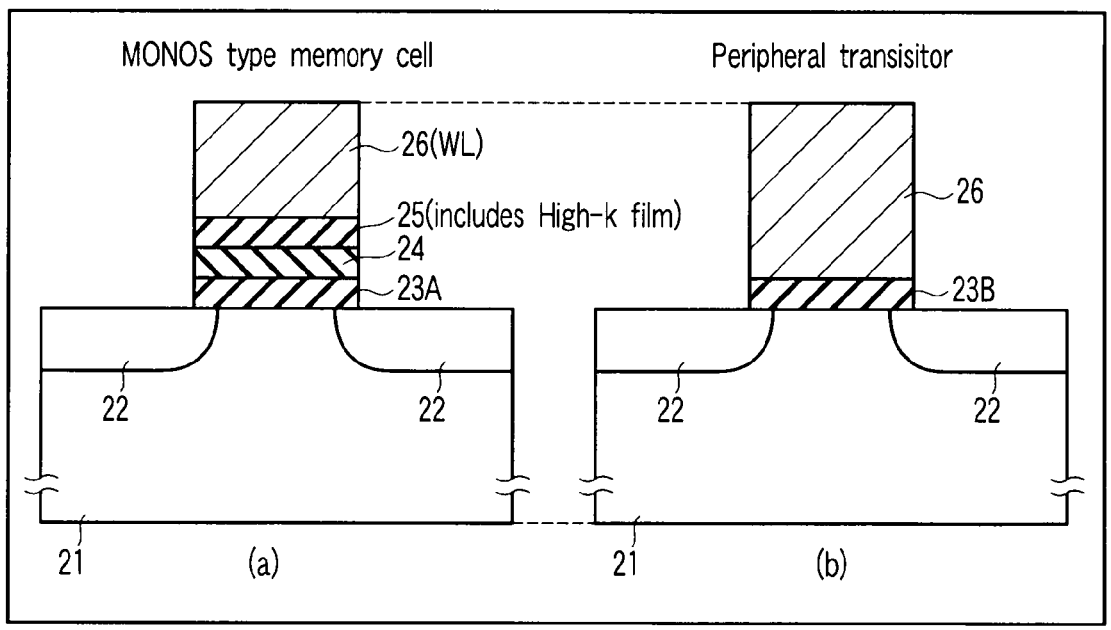
FIG. 77 is a cross-sectional view showing an application to a MONOS type memory cell.

FIG. 77 shows the nonvolatile semiconductor memory device according to the fifth embodiment.

The characteristic of the fifth embodiment is that the memory cell is of the so-called MONOS type. In this case, the charge storage layer 24 of the memory cell is composed of an insulating film (for example, silicon nitride film).

A source/drain diffusion layer 22 is arranged in a semiconductor substrate (active area) 21. Gate insulating films 23A and 23B are formed on a channel region between the source-drain diffusion layers 22.

For the memory cell, the charge storage layer 24, a dielectric film 25 and a control gate electrode (word line) 26 are formed on the gate insulating film 23A. The dielectric film 25 includes a high-permittivity (High-k) material. In the peripheral transistor, the gate electrode 26 is formed on the gate insulating film 23B.

Also in such a device structure, since the peripheral transistor does not have a high-permittivity material, the fluctuation in the characteristics of the peripheral transistor can be prevented.

3. APPLICATION

An example of a system to which the nonvolatile semiconductor memory device (semiconductor memory) of the present invention is applied will be described.

Figure 78:
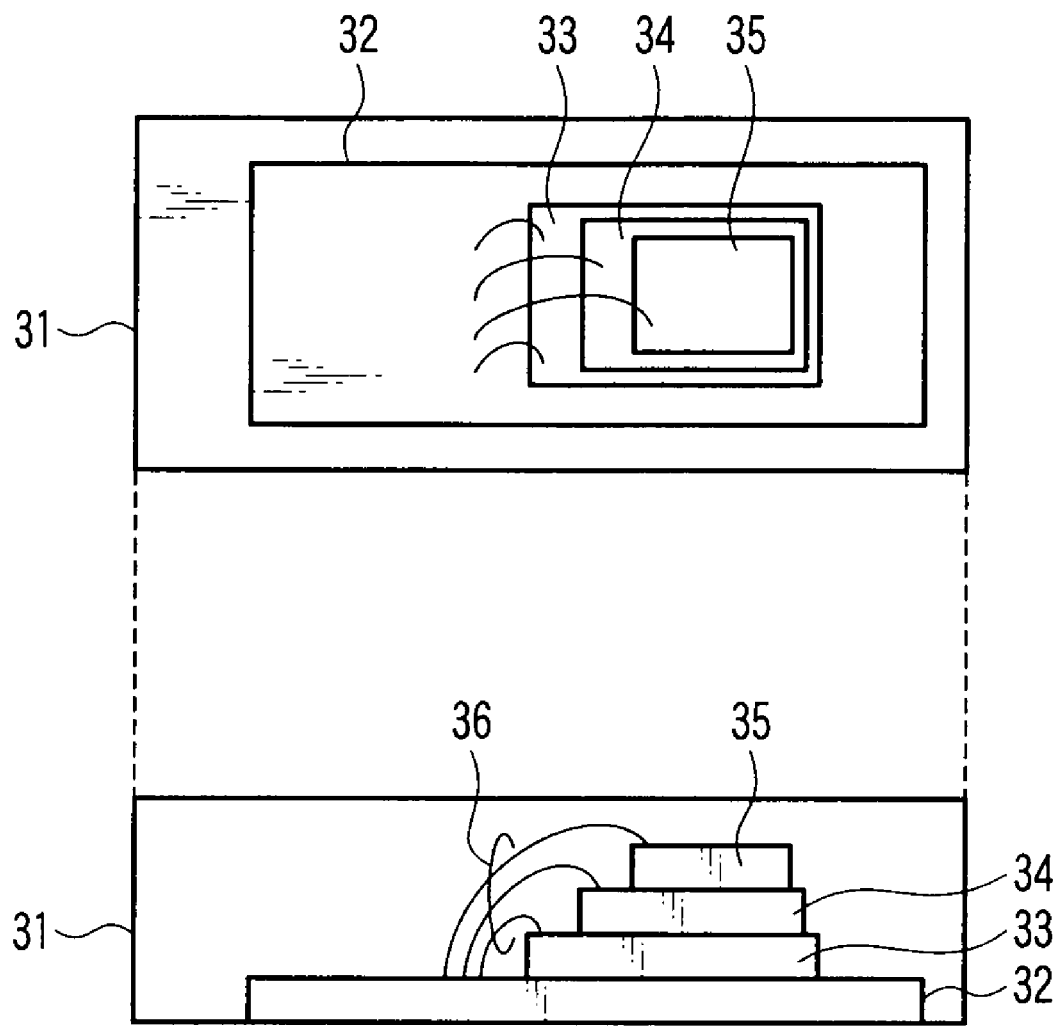
FIG. 78 is a diagram showing a system as an application.

FIG. 78 shows one example of the memory system.

This system is, for example, a memory card, or a USB memory.

A circuit board 32, and semiconductor chips 33, 34 and 35 are arranged in a package 31. The circuit board 32 and the semiconductor chips 33, 34 and 35 are electrically connected by a bonding wire 36. One of the semiconductor chips 33, 34 and 35 is the nonvolatile semiconductor memory device (semiconductor memory) according to the present invention.

Figure 79:
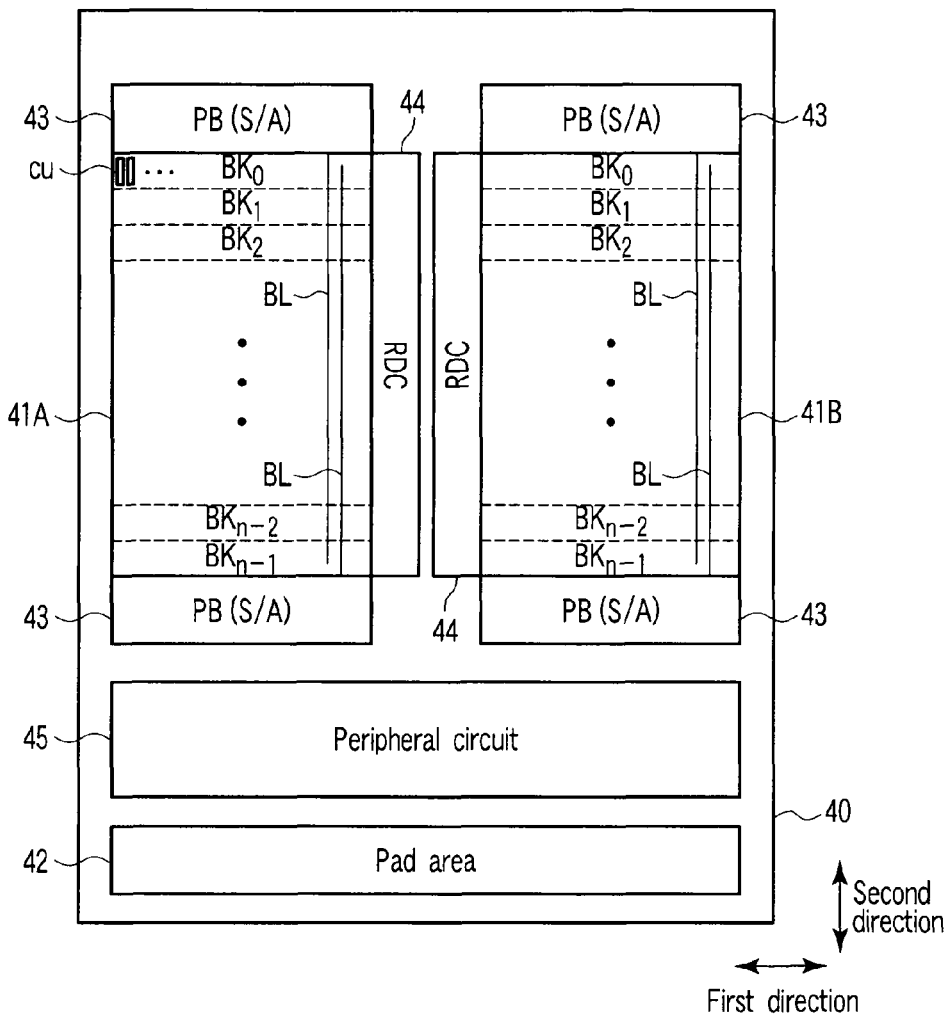
FIG. 79 is a diagram showing a layout of a semiconductor memory.

FIG. 79 shows a chip layout of the semiconductor memory.

Memory cell arrays 41A and 41B are arranged on a semiconductor chip 40. The memory cell arrays 41A and 41B each have blocks BK0, BK1, ... BKn-1 which are arranged in the second direction. Each of the blocks BK0, BK1, ... BKn-1 has cell units CU which are arranged in the first direction.

Figure 80:
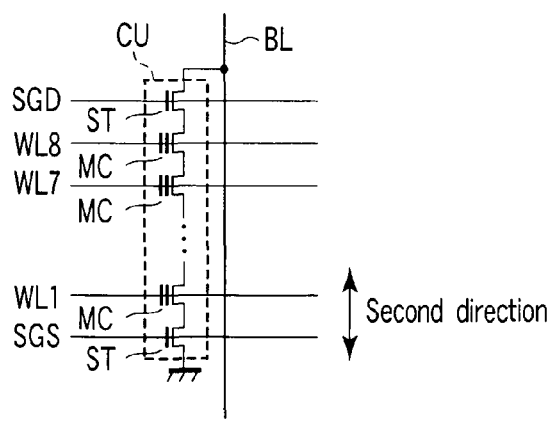
FIG. 80 is a diagram showing the NAND cell unit.

As shown in FIG. 80, the cell unit CU is composed of memory cells MC which are connected in series in the second direction, and two select gate transistors ST which are connected to both ends of the memory cells MC, respectively.

A bit line BL which extends in the second direction is arranged on the memory cell arrays 41A and 41B. A page buffer (PB) 43 is arranged on both ends of the memory cell arrays 41A and 41B in the second direction. The page buffer 43 has a function to temporarily store reading data/writing data at the time of reading/writing. The page buffer 43 serves as a sense amplifier (S/A) at the time of reading or verification of a writing/erasing operation.

A row decoder (RDC) 44 is arranged at one end (end portions opposite to the end portion of the edge side of the semiconductor chip 40) of the memory cell arrays 41A and 41B in the first direction. A pad area 42 is arranged along the edge of the semiconductor chip 40 at one end of the memory cell arrays 41A and 41B in the second direction. A peripheral circuit 45 is arranged between the page buffer 43 and the pad area 42.

4. CONCLUSION

According to the present invention, even when a high-permittivity material is used for a dielectric film between the charge storage layer and the control gate electrode, the performance of the peripheral transistor is not deteriorated.

Additional advantages and modifications will readily occur to those skilled in the art. Therefore, the invention in its broader aspects is not limited to the specific details and representative embodiments shown and described herein. Accordingly, various modifications can be made without departing from the spirit or scope of the general inventive concept as defined by the appended claims and their equivalents.

What is claimed is:

1. A nonvolatile semiconductor memory device comprising:
   a semiconductor substrate;
   a memory cell which is provided on the semiconductor substrate, including:
   first and second diffusion layers,
   a first gate insulating film which is provided on a first channel region between the first and second diffusion layers,
   a charge storage layer which is provided on the first gate insulating film,
   a first inter-electrode insulating film which is in contact with the charge storage layer, and
   a control gate electrode which is provided on the first inter-electrode insulating film; and
   a peripheral transistor which is provided on the semiconductor substrate, including:
   third and fourth diffusion layers,
   a second gate insulating film which is provided on a second channel region between the third and fourth diffusion layers,
   a lower electrode which is provided on the second gate insulating film,
   a blocking insulating film is contact with the lower electrode,
   a second inter-electrode insulating film which is provided on the blocking insulating film and comprises the same material as the first inter-electrode insulating film, and
   an upper electrode which is provided on the second inter-electrode insulating film,
   wherein the lower electrode and the upper electrode are electrically connected via an opening provided on the second inter-electrode insulating film, and
   the first and second inter-electrode insulating films include a high-permittivity material.

2. The nonvolatile semiconductor memory device according to claim 1,
wherein the blocking insulating film is HTO, and a thickness dBL thereof is $$5\,[\text{nm}] \leq dBL \leq (dFG-20)/3\,[\text{nm}]$$

where dFG represents a thickness [nm] of the charge storage layer.

3. The nonvolatile semiconductor memory device according to claim 1,
wherein the blocking insulating film is a silicon nitride film, and a thickness dBL thereof is $$5\,[\text{nm}] \leq dBL \leq (dFG-20)/2\,[\text{nm}]$$

where dFG represents a thickness [nm] of the charge storage layer.

4. The nonvolatile semiconductor memory device according to claim 1,
wherein the high-permittivity material is metal oxide.

5. The nonvolatile semiconductor memory device according to claim 1,
wherein the memory cell is a memory cell in a NAND cell unit.

6. The nonvolatile semiconductor memory device according to claim 1,
wherein the peripheral transistor is a select gate transistor in a NAND cell unit.

7. The nonvolatile semiconductor memory device according to claim 1,
wherein the peripheral transistor is a high-voltage transistor.

8. The nonvolatile semiconductor memory device according to claim 1, a thickness of the second gate insulating film is equal to that of the first gate insulating film.

9. The nonvolatile semiconductor memory device according to claim 1,
wherein the control gate electrode and the upper electrode include metallic silicide.

10. The nonvolatile semiconductor memory device according to claim 1, wherein the charge storage layer and the lower electrode are made from the same material, and the control gate electrode and the upper electrode are made from the same material.

11. A nonvolatile semiconductor memory device comprising:
a semiconductor substrate;
a memory cell which is provided on the semiconductor substrate, including:
first and second diffusion layers,
a first gate insulating film which is provided on a first channel region between the first and second diffusion layers,
a charge storage layer which is provided on the first gate insulating film,
a dielectric film which is provided on the charge storage layer, and
a control gate electrode which is provided on the dielectric film; and
a peripheral transistor which is provided on the semiconductor substrate, including third and fourth diffusion layers,
a second gate insulating film which is provided on a second channel region between the third and fourth diffusion layers,
a lower gate electrode which is provided on the second gate insulating film, and
an upper gate electrode provided on the lower gate electrode, and an entire bottom surface of the upper gate electrode is in contact with the lower gate electrode, and
wherein the dielectric film includes a high-permittivity material.

12. The nonvolatile semiconductor memory device according to claim 11,
wherein the charge storage layer is composed of nitride.

13. The nonvolatile semiconductor memory device according to claim 11,
wherein the high-permittivity material is metal oxide.

14. The nonvolatile semiconductor memory device according to claim 11,
wherein the memory cell is a memory cell in a NAND cell unit.

15. The nonvolatile semiconductor memory device according to claim 11,
wherein the peripheral transistor is a select gate transistor in a NAND cell unit.

16. The nonvolatile semiconductor memory device according to claim 11,
wherein the peripheral transistor is a high-voltage transistor.

17. The nonvolatile semiconductor memory device according to claim 11, wherein a thickness of the second gate insulating film is equal to that of the first gate insulating film.

18. The nonvolatile semiconductor memory device according to claim 11,
wherein the control gate electrode and the upper gate electrode include metal silicide.

19. The nonvolatile semiconductor memory device according to claim 11,
wherein the charge storage layer and the lower gate electrode are made from the same material, and the control gate electrode and the upper gate electrode are made from the same material.

* * * * *